US012699141B2

(12) United States Patent (10) Patent No.: US 12,699,141 B2

Numata (45) Date of Patent: Aug. 4, 2026

(54) BATTERY MONITORING SYSTEM

(71) Applicant: DENSO CORPORATION, Kariya-city (JP)

(72) Inventor: Tatsuhiro Numata, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 162 days.

(21) Appl. No.: 18/589,610

(22) Filed: Feb. 28, 2024

(65) Prior Publication Data

US 2024/0201266 A1 Jun. 20, 2024

Related U.S. Application Data

(63) Continuation of application No. PCT/JP2021/043409, filed on Nov. 26, 2021.

(30) Foreign Application Priority Data

Aug. 31, 2021 (JP) ................................. 2021-141850

(51) Int. Cl.
  B60L 58/12 (2019.01)
  G01R 31/371 (2019.01)
  G01R 31/3842 (2019.01)

(52) U.S. Cl.
  CPC ............ G01R 31/371 (2019.01); B60L 58/12 (2019.02); G01R 31/3842 (2019.01); *B60L 2240/545* (2013.01)

(58) Field of Classification Search
  CPC .. G01R 31/36; G01R 31/3644; G01R 31/371; G01R 31/392; G01R 31/396; H01M 50/24; H01M 50/204; H01M 10/48
  See application file for complete search history.

(56) References Cited

U.S. PATENT DOCUMENTS

| | | | |
|---|---|---|---|
| 2008/0266126 A1* | 10/2008 | Nakashima | ........... G06F 1/3203 |
| | | | 340/636.1 |
| 2013/0002260 A1 | 1/2013 | Golubkov | |
| 2014/0093765 A1 | 4/2014 | Kusunoki | |
| 2014/0312913 A1 | 10/2014 | Kikuchi et al. | |
| 2017/0139015 A1 | 5/2017 | Sperling et al. | |
| 2019/0353714 A1 | 11/2019 | Hinterberger et al. | |
| 2020/0064408 A1 | 2/2020 | Sato | |
| 2020/0142004 A1 | 5/2020 | Ito et al. | |
| 2020/0271725 A1 | 8/2020 | Herring et al. | |
| 2020/0412146 A1 | 12/2020 | Takechi | |
| 2021/0218074 A1 | 7/2021 | Aoki et al. | |

(Continued)

FOREIGN PATENT DOCUMENTS

| | | |
|---|---|---|
| DE | 102021105861 A1 | 9/2022 |
| JP | 2016-012954 A | 1/2016 |
| WO | 2015189898 A1 | 12/2015 |

*Primary Examiner* — Benyam Haile

(74) *Attorney, Agent, or Firm* — Oliff PLC

(57) ABSTRACT

A battery monitoring system includes a battery, a battery monitoring device that monitors a state of the battery, and a battery control device that performs wireless communication with the battery monitoring device to acquire battery information representing results of the monitoring by the battery monitoring device and execute various controls. Moreover, the battery monitoring device is configured to execute, while executing a first process between it and the battery control device via the wireless communication, a second process that is different from the first process.

13 Claims, 33 Drawing Sheets

(56)          References Cited

U.S. PATENT DOCUMENTS

| 2021/0245624 | A1 |  | 8/2021 | Haga |
| 2021/0281988 | A1 | * | 9/2021 | Han ........................ B60L 58/18 |
| 2022/0236330 | A1 |  | 7/2022 | Ito et al. |
| 2022/0294074 | A1 |  | 9/2022 | Naitoh |
| 2023/0223607 | A1 |  | 7/2023 | Aoki et al. |
| 2023/0393207 | A1 |  | 12/2023 | Ito et al. |
| 2024/0170754 | A1 |  | 5/2024 | Lamm |

* cited by examiner

‹WHEN COMMUNICATION IS STARTED›

FIG.6

COMMUNICATION SCHEDULE

| TRANSMISSION ORDER | DESTINATION INFORMATION | COMMAND CONTENTS | SEQUENCE NUMBER | OUTPUT TIMING |
|---|---|---|---|---|
| 1 | SBM1 | CD1, CD2 | SBM1CD1CD2 | TIMING T1 |
| 2 | SBM2 | CD1, CD2 | SBM2CD1CD2 | TIMING T2 |
| 3 | SBM3 | CD1, CD2 | SBM3CD1CD2 | TIMING T3 |
| 4 | SBM1 | CD3, CD4 | SBM1CD3CD4 | TIMING T4 |
| 5 | SBM2 | CD3, CD4 | SBM2CD3CD4 | TIMING T5 |
| 6 | SBM3 | CD3, CD4 | SBM3CD3CD4 | TIMING T6 |
| . | . | . | . | . |
| . | . | . | . | . |

FIG.8

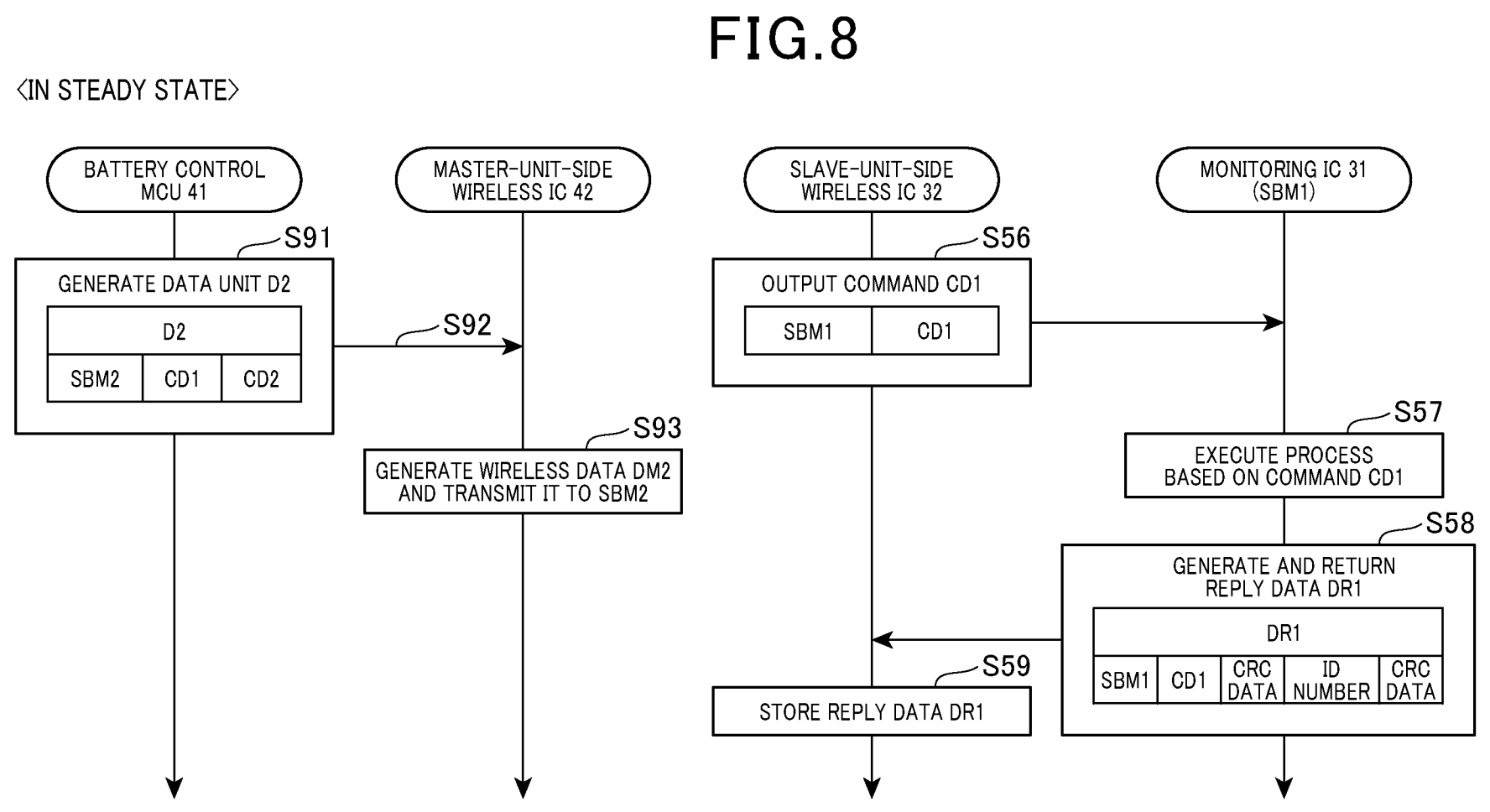

MONITORING IC 31
(SBM1)

S57 — EXECUTE PROCESS BASED ON COMMAND CD1

S58 — GENERATE AND RETURN REPLY DATA DR1

| DR1 | | | | | |
|---|---|---|---|---|---|
| SBM1 | CD1 | CRC DATA | ID NUMBER | CRC DATA | DATA |

SLAVE-UNIT-SIDE WIRELESS IC 32

S56 — OUTPUT COMMAND CD1

| | |
|---|---|
| SBM1 | CD1 |

S59 — STORE REPLY DATA DR1

MASTER-UNIT-SIDE WIRELESS IC 42

S92

S93 — GENERATE WIRELESS DATA DM2 AND TRANSMIT IT TO SBM2

BATTERY CONTROL MCU 41

S91 — GENERATE DATA UNIT D2

| D2 | | |
|---|---|---|
| SBM2 | CD1 | CD2 |

⟨IN STEADY STATE⟩

BATTERY MONITORING SYSTEM

CROSS-REFERENCE TO RELATED APPLICATIONS

The present application is a continuation application of International Application No. PCT/JP2021/043409 filed on Nov. 26, 2021, which is based on and claims priority from Japanese Patent Application No. 2021-141850 filed on Aug. 31, 2021. The entire contents of these applications are incorporated by reference into the present application.

BACKGROUND

1 Technical Field

The present disclosure relates to battery monitoring systems.

2 Description of Related Art

A battery monitoring system includes a battery monitoring device that detects battery information (voltages, etc.) of battery cells, and a battery ECU. The battery ECU transmits various control signals (or commands) to the battery monitoring device; and the battery monitoring device returns, based on the received control signals, the detected battery information to the battery ECU (see, for example, Japanese Unexamined Patent Application Publication No. JP 2020-078115 A).

SUMMARY

Conventionally, communication between a battery monitoring device and a battery ECU has been performed in a wired manner. On the other hand, as disclosed in the aforementioned patent document, wireless communication has been investigated between a battery monitoring device and a battery ECU. However, in the case of performing wireless communication, concerns have arisen as to whether the wireless communication can be properly performed.

The present disclosure has been accomplished in view of the above circumstances.

According to the present disclosure, there is provided a first battery monitoring system which comprises: a battery; a battery monitoring device that monitors a state of the battery; and a battery control device that performs wireless communication with the battery monitoring device to acquire battery information representing results of the monitoring by the battery monitoring device and execute various controls. Moreover, the battery monitoring device is configured to execute, while executing a first process between it and the battery control device via the wireless communication, a second process that is different from the first process.

Consequently, it becomes possible to execute the first process and the second process in parallel; thus, it becomes possible to use time effectively.

According to the present disclosure, there is also provided a second battery monitoring system which comprises: batteries; a plurality of battery monitoring devices each of which monitors a state of a corresponding one of the batteries; and a battery control device that performs wireless communication with the battery monitoring devices to acquire battery information representing results of the monitoring by the battery monitoring devices and execute various controls. Moreover, the plurality of battery monitoring devices comprise a first battery monitoring device and a second battery monitoring device. During a process executed by the first battery monitoring device, the battery control device instructs a content of a process to the second battery monitoring device and causes the second battery monitoring device to execute the process whose content is instructed by the battery control device.

Consequently, it becomes possible to cause the first battery monitoring device and the second battery monitoring device to execute the processes in parallel; thus, it becomes possible to use time effectively.

According to the present disclosure, there is also provided a third battery monitoring system which comprises: a battery; a battery monitoring device that monitors a state of the battery; and a battery control device that performs wireless communication with the battery monitoring device to acquire battery information representing results of the monitoring by the battery monitoring device and execute various controls. Moreover, the battery monitoring device comprises: a monitoring unit that monitors the state of the battery; and a slave-unit-side wireless control unit that transmits/receives data to/from the monitoring unit and performs the wireless communication. The battery control device comprises: a battery control unit that executes the various controls; and a master-unit-side wireless control unit that transmits/receives data to/from the battery control unit and performs the wireless communication. The battery control unit transmits a plurality of commands to the battery monitoring device, thereby having the plurality of commands stored in the battery monitoring device. The slave-unit-side wireless control unit sequentially transmits the plurality of commands to the monitoring unit, causes the monitoring unit to sequentially execute processes based on the plurality of commands, and returns results of the processes collectively to the battery control device.

Consequently, it becomes possible to reduce the communication data volume.

BRIEF DESCRIPTION OF THE DRAWINGS

FIG. 6 is a diagram illustrating a specific example of the processing sequence of the wireless communication.

FIG. 8 is another diagram illustrating the specific example of the processing sequence of the wireless communication.

FIG. 14 is a cross-sectional view taken along the line 14-14 in FIG. 13.

FIG. 18 is a cross-sectional view taken along the line 18-18 in FIG. 13.

FIG. 21 is a cross-sectional view taken along the line 21-21 in FIG. 20.

FIG. 32 is a cross-sectional view taken along the line 32-32 in FIG. 31.

FIG. 33 is a cross-sectional view of a battery pack according to a modification of the embodiment E.

DESCRIPTION OF EMBODIMENTS

Figure 1:
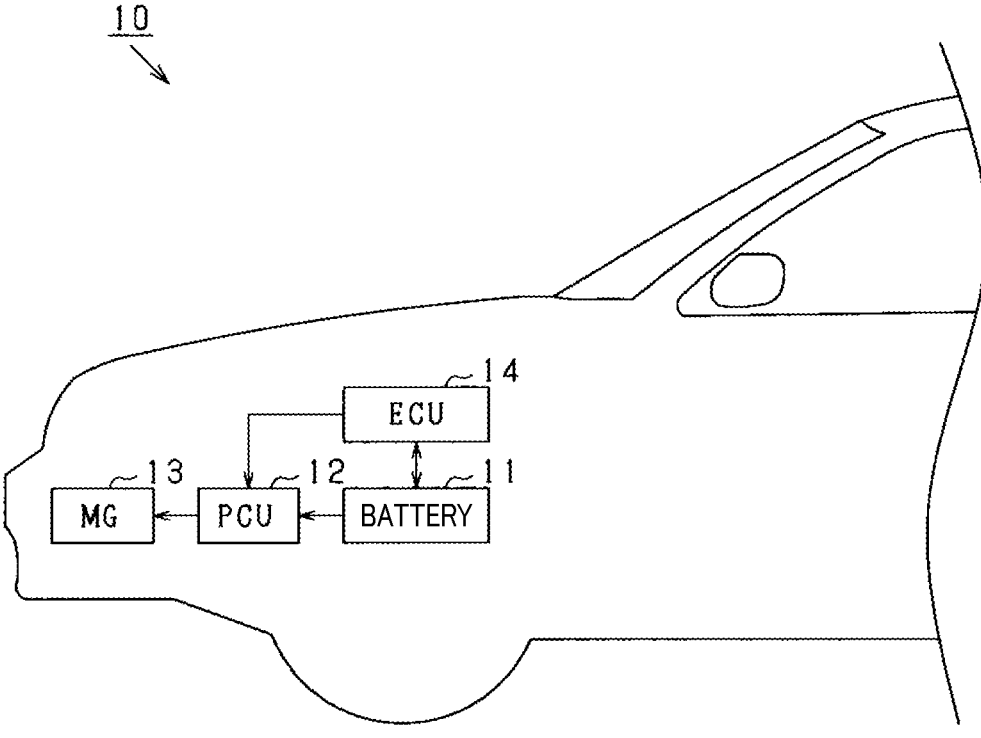
FIG. 1 is a configuration diagram of a vehicle.

Hereinafter, embodiments of battery monitoring systems according to the present disclosure will be described in detail with reference to the drawings. It should be noted that: identical or equivalent parts are designated by the same reference numerals in the drawings; and descriptions thereof will not be repeated in principle. Moreover, it also should be noted that although the battery monitoring systems 1 according to the present disclosure are used in vehicles in the following embodiments, the battery monitoring systems 1 may also be used in other applications than vehicles.

First Embodiment (Overall Configuration of Vehicle 10)

FIG. 1 is a schematic diagram illustrating the configuration of a vehicle 10. The vehicle 10 includes a battery pack 11 (denoted by "BATTERY" in FIG. 1), a Power Control Unit (PCU) 12, a motor 13 (denoted by "MG" in FIG. 1), and a vehicle ECU 14 (denoted by "ECU" in FIG. 1).

The battery pack 11 is installed in the vehicle 10 as a drive power source of the vehicle 10. It should be noted that although the battery pack 11 is arranged in an engine compartment of the vehicle 10 in FIG. 1, it may alternatively be arranged in other locations in the vehicle 10, such as in a luggage compartment, under a seat or under the floor of the vehicle 10. In addition, the vehicle 10 may be an electric vehicle that runs on electric power stored in the battery pack 11, or a hybrid vehicle.

The battery pack 11 includes an assembled battery 20 that is constituted of a number of battery cells 22 (or secondary cells). In the assembled battery 20, there is stored electric power for driving the motor 13. The battery pack 11 can supply electric power to the motor 13 through the PCU 12. Moreover, during the regenerative power generation by the motor 13 when the vehicle 10 is braked, the battery pack 11 can receive, through the PCU 12, electric power generated by the motor 13 and be charged with the received electric power.

Moreover, in the battery pack 11, there are provided battery monitoring devices 30 that monitor the assembled battery 20 and a battery control device 40 that controls the battery monitoring devices 30. That is, in the battery pack 11 according to the present embodiment, there is accommodated an inter-battery system 1 that includes the assembled battery 20, the battery monitoring devices 30 and the battery control device 40. In addition, the configurations of the battery monitoring devices 30 and the battery control device 40 will be described in detail later with reference to FIG. 2.

The PCU 12 performs bidirectional electric power conversion between the battery pack 11 and the motor 13 according to control signals from the vehicle ECU 14. The PCU 12 includes an inverter that drives the motor 13 and a converter that boosts a DC voltage supplied to the inverter to a level higher than or equal to the output voltage of the battery pack 11.

The motor 13 is an AC rotating electric machine. The motor 13 may be implemented by, for example, a three-phase AC synchronous motor which has permanent magnets embedded in a rotor. The motor 13 is driven by the PCU 12 to generate a rotational drive force; and the drive force generated by the motor 13 is transmitted to driving wheels of the vehicle 10. On the other hand, during braking of the vehicle 10, the motor 13 operates as an electric generator and performs regenerative power generation. The electric power generated by the motor 13 is supplied to the battery pack 11 through the PCU 12, and stored in the assembled battery 20 in the battery pack 11.

The vehicle ECU 14 includes a CPU, a ROM, a RAM, and input/output ports for inputting/outputting various signals. The CPU deploys programs stored in the ROM to the RAM and executes them. The programs stored in the ROM describe processes of the vehicle ECU 14. For example, as a main process, the vehicle ECU 14 receives, from the battery pack 11, information such as the voltage, current and SOC (State of Charge) of the assembled battery 20; then the vehicle ECU 14 controls drive of the motor 13 and charge/discharge of the battery pack 11 by controlling the PCU 12 based on the received information.

(Configuration of Battery Pack 11)

Figure 2:
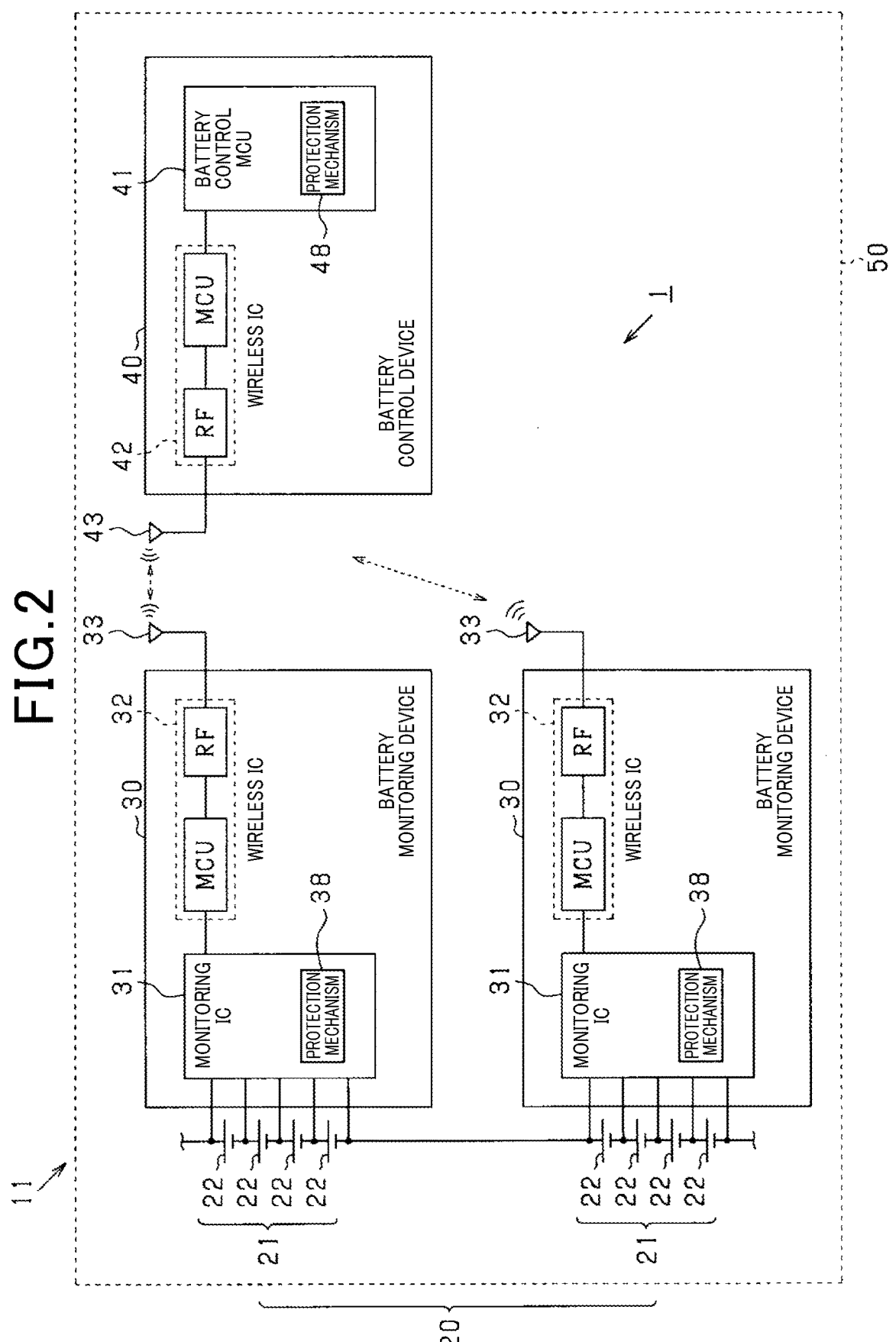
FIG. 2 is a block diagram illustrating the overall configuration of a battery pack.

FIG. 2 is a schematic diagram illustrating the configuration of the battery pack 11. The battery pack 11 includes the assembled battery 20, the battery monitoring devices 30, the battery control device 40, and a housing 50 (represented by dashed lines in FIG. 2) that accommodates the aforementioned components. It should be noted that although the battery control device 40 is accommodated in the housing 50 in the present embodiment, it may alternatively be arranged outside the housing 50.

(Configuration of Assembled Battery 20)

The assembled battery 20 includes a plurality of battery blocks (may also be referred to as battery stacks or battery modules) 21. The assembled battery 20 is formed by connecting the battery blocks 21 in series and/or in parallel with one another. Moreover, each of the battery blocks 21 includes a plurality of battery cells 22. Each of the battery cells 22 may be implemented by, for example, a lithium-ion secondary battery, a nickel-metal hydride secondary battery or the like. In addition, lithium-ion secondary batteries are secondary batteries which use lithium ions as charge carriers. Lithium-ion secondary batteries may include not only general lithium-ion secondary batteries whose electrolyte is a liquid, but also so-called solid-state batteries that use a solid electrolyte. Each of the battery blocks 21 is formed by connecting the battery cells 22 in series and/or in parallel with one another.

(Configuration of Battery Monitoring Devices 30)

The battery monitoring devices 30 are also called Satellite Battery Modules (SBM). In each of the battery blocks 21, there is provided a corresponding one of the battery monitoring devices 30. As shown in FIG. 2, each of the battery monitoring devices 30 includes a monitoring IC 31 as a monitoring unit, a wireless IC 32 as a slave-unit-side wireless control unit, and a wireless antenna 33. The monitoring IC 31, which is also called a Cell Supervising Circuit (CSC), acquires battery information from the battery cells 22 constituting the battery block 21 or from a sensor (not shown). The battery information includes, for example, voltage information, temperature information and current information of the battery cells 22. Moreover, the monitoring IC 31 performs a self-diagnosis and generates self-diagnosis information. The self-diagnosis information is, for example, information related to the operation check of the battery monitoring device 30, i.e., information related to an abnormality or failure of the battery monitoring device 30. More specifically, the self-diagnosis information is information related to the operation check of the monitoring IC 31 and the wireless IC 32 that constitute the battery monitoring device 30.

The wireless IC 32 is connected with the monitoring IC 31 in a wired manner. The wireless IC 32 includes a wireless MCU (Micro Control Unit) and an RF device (or high-frequency device module). The wireless IC 32 wirelessly transmits, via the wireless antenna 33, data (including control signals) received from the monitoring IC 31. Moreover, the wireless IC 32 sends data, which is received via the wireless antenna 33, to the monitoring IC 31.

(Configuration of Battery Control Device 40)

The battery control device 40, which is also called a battery ECU or BMU (Battery Management Unit), is mounted to outer side surfaces of the battery blocks 21. The battery control device 40 is configured so that it can wirelessly communicate with each of the battery monitoring devices 30.

Specifically, as shown in FIG. 2, the battery control device 40 includes a battery control MCU 41 as a battery control unit, a wireless IC 42 as a master-side wireless control unit, and a wireless antenna 43. The battery control MCU 41 is configured with a microcomputer which includes a CPU, a ROM, a RAM and input/output interfaces. The CPU of the battery control MCU 41 deploys programs stored in the ROM to the RAM and executes them. The programs stored in the ROM describe processes related to battery control.

For example, as a main process, the battery control MCU 41 commands the battery monitoring devices 30 to acquire and transmit the battery information. Further, based on the battery information received from the battery monitoring devices 30, the battery control MCU 41 monitors the assembled battery 20, the battery blocks 21 and the battery cells 22. Furthermore, based on the monitoring results, the battery control MCU 41 controls a relay switch that switches the assembled battery 20 between a connected state in which it is connected with the PCU 12 and the motor 13 and a disconnected state in which it is disconnected from the PCU 12 and the motor 13. Moreover, the battery control MCU 41 may transmit an equalization signal for equalizing the voltages of the battery cells 22. It should be noted that although the vehicle ECU 14 instructs the PCU 12 to control charge/discharge of the assembled battery 20 in the present embodiment, the battery control MCU 41 may be configured to perform the task of the vehicle ECU 14.

The wireless IC 42 is connected with the battery control MCU 41 in a wired manner. Similar to the wireless IC 32, the wireless IC 42 includes a wireless MCU and an RF device. The wireless IC 42 wirelessly transmits, via the wireless antenna 43, data received from the battery control MCU 41. Moreover, the wireless IC 42 sends data, which is received via the wireless antenna 43, to the battery control MCU 41. In addition, in the present embodiment, the wireless MCU of the wireless IC 42 of the battery control device 40 represents a master-unit-side wireless IC 42; and the wireless MCU of the wireless IC 32 of each battery monitoring device 30 represents a slave-unit-side wireless IC 32.

(Configuration of Housing 50)

The housing 50 is formed of an electrical conductor such as a metal. The housing 50 is formed in a metal box shape, and has a substantially rectangular parallelepiped shape. The housing 50 accommodates the assembled battery 20, the battery monitoring devices 30 and the battery control device 40.

It is desirable for the housing 50 of the battery pack 11 to be configured to cover the contents, such as the battery monitoring devices 30, with an electrical conductor and completely block external radio waves. However, in reality, it is difficult to completely cover the contents with an electrical conductor. For example, it is necessary to provide a seal member, an explosion prevention valve, a connector and the like in the housing 50; the seal member fills a gap between a housing body and a cover. However, it is easy for external radio waves to intrude into the housing 50 through these members. On the other hand, for reducing the weight, it is desirable for the housing 50 to be formed of a resin or the like. However, in this case, it would be impossible to block external radio waves.

Therefore, in order to reliably perform wireless communication between the battery monitoring devices 30 and the battery control device 40, processes that are unnecessary in wired communication, such as authentication and error detection, are executed in the present embodiment. However, due to the execution of the processes, the communication data volume increases compared to wired communication. Accordingly, wireless communication generally involves a problem that the time required for the communication tends to become longer than that of wired communication.

In the present embodiment, in order to reliably perform wireless communication and shorten the time required for the communication, the following configuration and wireless communication method are implemented.

(Processes Related to Wireless Communication)

Next, processes related to wireless communication will be described. Hereinafter, processes at the time of start of the communication will be first described; then, processes related to the wireless communication in a steady state will be described; thereafter, processes at the time of termination of the communication will be described. Further, explanation will be given of protection mechanisms for properly detecting the effects of noise and the like.

(Processes at the Time of Start of Communication)

Figure 3:
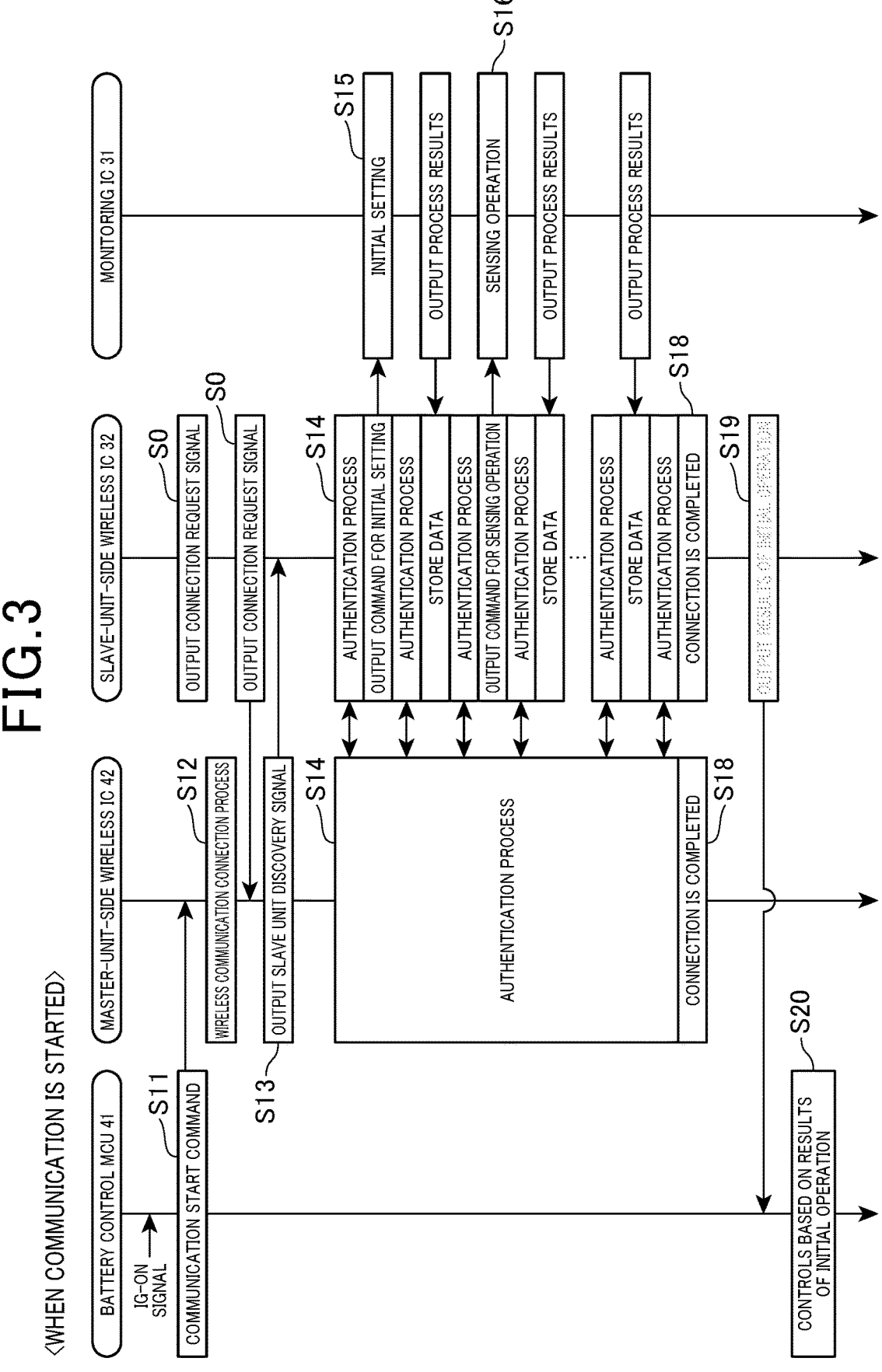
FIG. 3 is a schematic diagram illustrating a processing sequence of wireless communication when the wireless communication is started.

As shown in FIG. 3, when starting the wireless communication, the battery control MCU 41 outputs a communication start command to the master-unit-side wireless IC 42 (step S11). The trigger for outputting the communication start command may be, for example, the input of an IG-ON signal indicating that an ignition switch is turned on. In addition, the trigger for outputting the communication start command is not limited to the input of the IG-ON signal; instead, the communication start command may be outputted at any timing. For example, the communication start command may be outputted when a predetermined time has elapsed since the wireless communication was interrupted. Alternatively, the communication start command may be outputted at a predetermined timing. Specifically, in the case of checking variation in the cell voltages at regular time intervals and performing the process of equalizing the cell voltages, the communication start command may be outputted at the timing of checking and equalizing the cell voltages. It should be noted that although the trigger for starting the communication is determined by the battery control MCU 41 in the present embodiment, it may alternatively be determined by the master-unit-side wireless IC 42.

In response to the input of the communication start command thereto, the master-unit-side wireless IC 42 executes a wireless communication connection process (step S12). Specifically, the master-unit-side wireless IC 42 searches for and detects any connection request signal that is periodically outputted from a slave-unit-side wireless IC 32 (step S0). It should be noted that the connection request signal may alternatively be outputted randomly. When a connection request signal is detected and the slave-unit-side wireless IC 32 having outputted the connection request signal is discovered, the master-unit-side wireless IC 42 outputs a slave unit discovery signal to the slave-unit-side wireless IC 32 (step S13); the slave unit discovery signal is a signal for informing the slave-unit-side wireless IC 32 that the master-unit-side wireless IC 42 has discovered the slave-unit-side wireless IC 32.

In response to the input of the slave unit discovery signal thereto, the slave-unit-side wireless IC 32 executes an authentication process between it and the master-unit-side wireless IC 42 (step S14). Specifically, in the authentication process, the slave-unit-side wireless IC 32 and the master-unit-side wireless IC 42 communicate with each other a plurality of times to exchange information related to authentication, and perform authentication and various settings.

Moreover, in response to the input of the slave unit discovery signal thereto, the slave-unit-side wireless IC 32 performs, in parallel with the authentication process, an operation instruction to the monitoring IC 31; the operation instruction is related to an initial operation. Specifically, in the authentication process, as described above, the slave-unit-side wireless IC 32 and the master-unit-side wireless IC

42 communicate with each other a plurality of times to exchange information. Therefore, the slave-unit-side wireless IC 32 has a waiting time after transmitting information to the master-unit-side wireless IC 42 until receiving a reply from the master-unit-side wireless IC 42. Utilizing the waiting time, the slave-unit-side wireless IC 32 outputs (or issues) to the monitoring IC 31 a command related to the initial operation, thereby causing the initial operation to be executed by the monitoring IC 31 in parallel with the authentication process. In addition, it is possible to: provide a plurality of processors in the slave-unit-side wireless IC 32; and cause one of the processors to execute the authentication process while causing another of the processors to output the command related to the initial operation.

The operation instruction related to the initial operation is realized by sequentially outputting to the monitoring IC 31 commands to be executed by the monitoring IC 31 in the initial operation. There are a plurality of types of commands to be executed by the monitoring IC 31 in the initial operation; and these commands are stored in advance in a storage device of the slave-unit-side wireless IC 32.

Specifically, in the initial operation, the slave-unit-side wireless IC 32 transmits to the monitoring IC 31 a command that instructs the monitoring IC 31 to execute an initial setting. Consequently, the monitoring IC 31 executes the initial setting (step S15). In the initial setting, refreshing and setting of an ID number are performed by the monitoring IC 31. The ID number is assigned by the battery control MCU 41. In addition, different ID numbers are assigned respectively to different monitoring ICs 31 and stored and managed by the battery control MCU 41. It should be noted that the ID number is included in advance in the command that instructs the monitoring IC 31 to execute the initial setting. Upon completion of the initial setting, the monitoring IC 31 returns, as the process results, information as to whether the initial setting has been successfully completed to the slave-unit-side wireless IC 32. Then, the slave-unit-side wireless IC 32 stores the returned information in the storage device of the slave-unit-side wireless IC 32.

Moreover, the slave-unit-side wireless IC 32 transmits to the monitoring IC 31 a command that instructs the monitoring IC 31 to execute a sensing operation for detecting various battery information (step S16). Specifically, the command specifies what kind of battery information (e.g., the cell voltages, the block voltage, the battery temperature, etc.) is to be detected in the sensing operation. Consequently, the monitoring IC 31 detects the battery information of the specified type and returns the battery information as the detection result to the slave-unit-side wireless IC 32. Then, the slave-unit-side wireless IC 32 stores the returned battery information in the storage device of the slave-unit-side wireless IC 32.

Furthermore, the slave-unit-side wireless IC 32 transmits to the monitoring IC 31 a command that instructs the monitoring IC 31 to execute a self-diagnosis. Consequently, the monitoring IC 31 executes the self-diagnosis and returns self-diagnosis information as the self-diagnosis result to the slave-unit-side wireless IC 32. Then, the slave-unit-side wireless IC 32 stores the returned self-diagnosis information in the storage device of the slave-unit-side wireless IC 32. Thereafter, during the authentication process, the slave-unit-side wireless IC 32 similarly repeats the process of performing the operation instruction to the monitoring IC 31 and receiving the process results.

The commands outputted in the initial operation were received from the battery control device 40 when, for example, the ignition switch was turned off at the time of termination of the previous wireless communication, and have been stored in the storage device of the slave-unit-side wireless IC 32 (the details will be described later). The types, execution sequence and number of the commands stored in the storage device were specified at that time.

In addition, the types and the like (i.e., types, number, execution sequence, output timings, etc.; the same applies hereinafter) of the commands related to the initial operation may be changed depending on the situation. For example, in the case where the communication is started in response to the input of a signal such as the IG-ON signal, the commands related to the initial operation include those related to the aforementioned initial setting and the like. Otherwise, in the case where the communication is started at the timing of checking and equalizing the cell voltages, the commands related to the initial operation may include a command related to the equalization process.

As described above, when the initial operation is executed, the slave-unit-side wireless IC 32 stores the process results (i.e., the battery information and the like) related to the initial operation in the storage device of the slave-unit-side wireless IC 32. Then, upon completion of the authentication process and the processes related to the initial operation (step S18), the slave-unit-side wireless IC 32 transmits the process results related to the initial operation which are stored in the storage device of the slave-side wireless IC 32 (step S19). Upon receipt of the process results related to the initial operation, the battery control MCU 41 executes various controls based on the battery information and the like which are detected in the initial operation. For example, when it is determined based on the self-diagnosis information and the battery information that there is no abnormality in the assembled battery 20 or the battery monitoring device 30 and the assembled battery 20 is in a state of being chargeable/dischargeable, the battery control MCU 41 allows charge/discharge of the assembled battery 20. When charge/discharge of the assembled battery 20 is allowed, the assembled battery 20 is charged with electric power or electric power is discharged from the assembled battery 20 according to the vehicle request or the like. Moreover, when both the assembled battery 20 and the battery monitoring device 30 are determined to be normal, a steady state is established and data exchange required for the battery control is performed by wireless communication. (Communication Processes in Steady State)

In the steady state, in principle, the battery control device 40 collectively transmits a plurality of commands which specify the contents of processes to be executed by the battery monitoring device 30; then, the battery control device 40 collectively receives the results of the processes executed by the battery control device 40. Thereafter, this series of processes is repeatedly executed. Hereinafter, the processes will be described in more detail.

Figure 4:
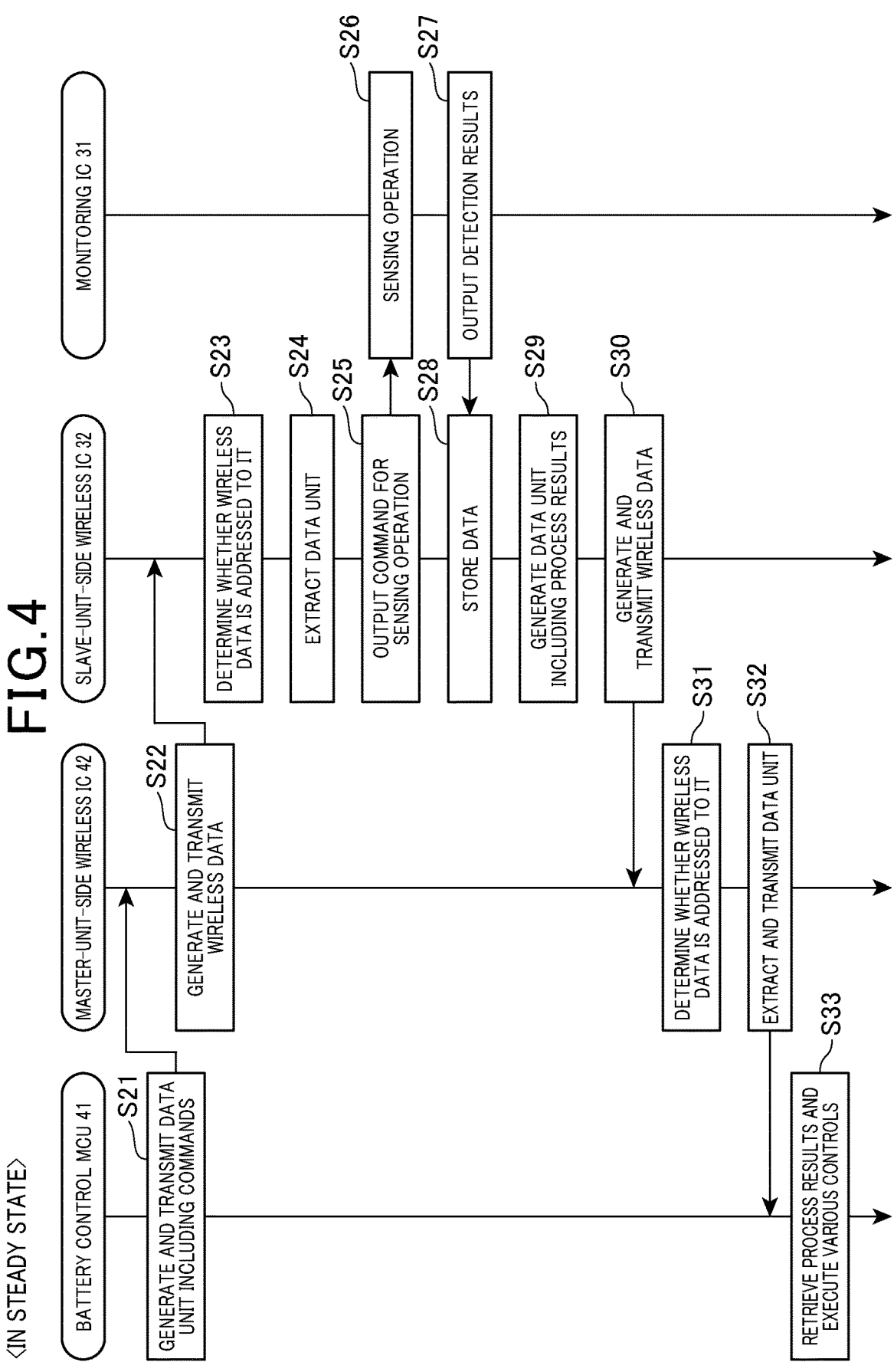
FIG. 4 is a schematic diagram illustrating a processing sequence of the wireless communication in a steady state.

As shown in FIG. 4, the battery control MCU 41 of the battery control device 40 generates a data unit that includes commands specifying the contents of the processes to be executed by the battery monitoring device 30 according to a communication schedule; then, the battery control MCU 41 transmits the data unit to the master-unit-side wireless IC 42 in a wired manner (step S21). The data unit includes a plurality of types of commands. For example, the data unit includes: an execution instruction command that instructs the battery monitoring device 30 to detect the cell voltages; a retrieval instruction command that instructs the battery monitoring device 30 to retrieve the detected cell voltages; an execution instruction command that instructs the battery monitoring device 30 to detect the block voltage; a retrieval instruction command that instructs the battery monitoring device 30 to retrieve the detected block voltage; an execution instruction command that instructs the battery monitoring device 30 to detect the battery temperature; and a retrieval instruction command that instructs the battery monitoring device 30 to retrieve the detected battery temperature. It should be noted that the types and number of the commands included in the single data unit may be changed arbitrarily. For example, the data unit may further include a command that instructs the battery monitoring device 30 to perform the self-diagnosis.

The master-unit-side wireless IC 42 of the battery control device 40 generates wireless data by adding, to the received data unit, data (or information) necessary for wireless communication such as communication control information (step S22). Then, the master-unit-side wireless IC 42 of the battery control device 40 wirelessly transmits the generated wireless data via the wireless antenna 43 (step S22).

Upon receipt of the wireless data via the wireless antenna 33, the slave-unit-side wireless IC 32 of the battery monitoring device 30 determines, based on the communication control information of the wireless data, whether the wireless data is addressed to it (step S23). If the wireless data is determined to be addressed to the slave-unit-side wireless IC 32, then the slave-unit-side wireless IC 32 extracts the data unit from the wireless data (step S24). Thereafter, the slave-unit-side wireless IC 32 sequentially transmits the commands included in the data unit to the monitoring IC 31 in a wired manner (step S25). It should be noted that the transmission sequence and transmission timings of the commands may be either included in the data unit or determined by the slave-unit-side wireless IC 32 based on the types and the like of the commands.

Upon receipt of the commands from the slave-unit-side wireless IC 32, the monitoring IC 31 executes the processes whose contents are specified by the received commands (step S26). For example, in response to the input of an execution instruction command that instructs the monitoring IC 31 to detect the battery information, the monitoring IC 31 detects the battery information of the instructed type and stores it in a storage device of the monitoring IC 31. Moreover, in response to the input of a retrieval instruction command that instructs the monitoring IC 31 to retrieve the battery information, the monitoring IC 31 retrieves the battery information of the instructed type from the storage device, converts the retrieved battery information into electronic data, and transmits the electronic data to the slave-unit-side wireless IC 32 (step S27). Then, the slave-unit-side wireless IC 32 stores the received electronic data in the storage device of the slave-unit-side wireless IC 32 (step S28). Thereafter, the slave-unit-side wireless IC 32 repeats the processes of steps S25 to S28 until all the commands are outputted to the monitoring IC 31.

When all the commands have been transmitted to the monitoring IC 31 and all the processes whose contents are specified by the commands have been executed by the monitoring IC 31, the slave-unit-side wireless IC 32 generates a data unit from the battery information and the like which are stored in the storage device of the slave-unit-side wireless IC 32 (step S29). Then, the slave-unit-side wireless IC 32 generates wireless data by adding, to the data unit, data (or information) necessary for wireless communication such as communication control information. Thereafter, the slave-unit-side wireless IC 32 of the battery monitoring device 30 transmits (or returns) the generated wireless data to the master-unit-side wireless IC 42 of the battery control device 40 via the wireless antenna 33 (step S30).

Upon receipt of the wireless data via the wireless antenna 43, the master-unit-side wireless IC 42 of the battery control device 40 determines, based on the communication control information of the wireless data, whether the wireless data is addressed to it (step S31). If the wireless data is determined to be addressed to the master-unit-side wireless IC 42, then the master-unit-side wireless IC 42 extracts the data unit from the wireless data and transmits the extracted data unit to the battery control MCU 41 in the wired manner (step S32).

Upon receipt of the data unit from the master-unit-side wireless IC 42, the battery control MCU 41 acquires the process results (i.e., the battery information and the like) from the data unit (step S33). Then, the battery control MCU 41 executes various controls based on the acquired process results (step S33). For example, the battery control MCU 41 notifies the external vehicle ECU 14 of the received battery information. Moreover, when an abnormality is detected in the battery cells 22 based on the battery information, the battery control MCU 41 outputs a signal to the external vehicle ECU 14 to stop charging/discharging the assembled battery 20. Furthermore, when there is variation in the voltages of the battery cells 22, the battery control MCU 41 executes the equalization process.

Thereafter, the battery control device 40 repeatedly executes the series of processes according to the communication schedule until the steady state is terminated, i.e., until the wireless communication is terminated. In addition, after transmitting the data unit to a first battery monitoring device 30 (step S21), the battery control MCU 41 may further transmit, during a period until receiving the process results from the first battery monitoring device 30 (step S33), the data unit to a second battery monitoring device 30. In this case, it will become possible for the battery control device 40 to communicate with the second battery monitoring device 30 in parallel with the processing by the first battery monitoring device 30 and/or to cause the processing by the second battery monitoring device 30 to be executed in parallel with the processing by the first battery monitoring device 30. Moreover, since the battery control device 40 transmits the commands collectively and receives the process results collectively, it will also become possible to reduce the communication data volume.

(Processes at the Time of Termination of Communication)

Figure 5:
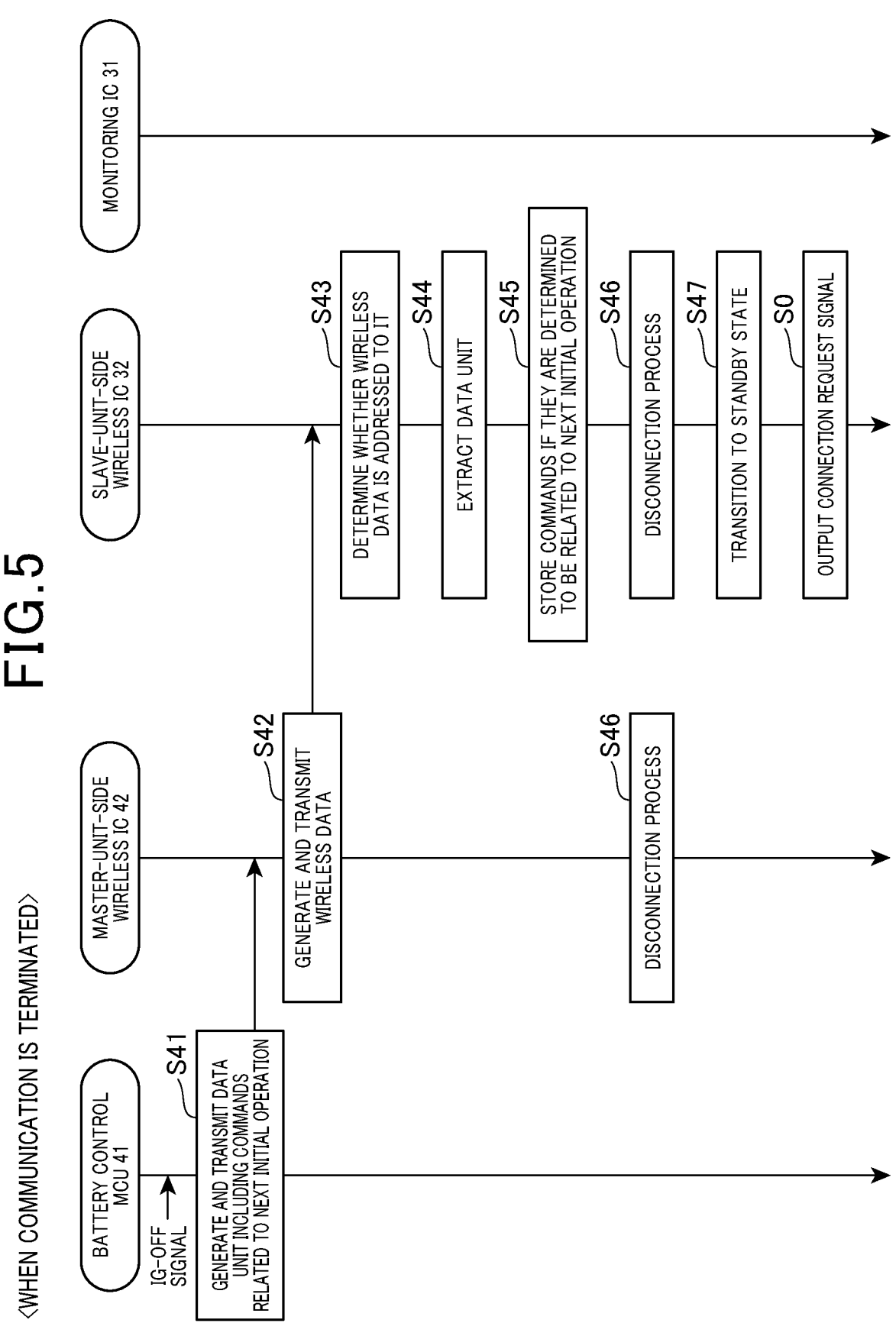
FIG. 5 is a schematic diagram illustrating a processing sequence of the wireless communication when the wireless communication is terminated.

As shown in FIG. 5, when terminating the wireless communication in response to the ignition switch being turned off (or in response to the input of an IG-OFF signal), the battery control device 40 executes the processes related to the termination of the communication. Specifically, the battery control device 40 first performs an operation instruction related to the initial operation to be executed during the authentication process at the time of start of the next wireless communication. More specifically, the battery control MCU 41 of the battery control device 40 generates a data unit that includes various commands related to the initial operation; then, the battery control MCU 41 transmits the data unit to the master-unit-side wireless IC 42 in the wired manner (step S41). In addition, in the case where the command related to the initial setting is outputted, the command includes the ID number assigned to the connection destination, i.e., the monitoring IC 31 to which the command is to be transmitted.

The master-unit-side wireless IC 42 of the battery control device 40 generates wireless data by adding, to the received data unit, data (or information) necessary for wireless communication such as communication control information. Then, the master-unit-side wireless IC 42 of the battery control device 40 wirelessly transmits the generated wireless data via the wireless antenna 43 (step S42).

Upon receipt of the wireless data via the wireless antenna 33, the slave-unit-side wireless IC 32 of the battery monitoring device 30 determines, based on the communication control information of the wireless data, whether the wireless data is addressed to it (step S43). If the wireless data is determined to be addressed to the slave-unit-side wireless IC 32, then the slave-unit-side wireless IC 32 extracts the data unit from the wireless data (step S44). Further, if it is determined that the data unit includes the various commands related to the initial operation, the slave-unit-side wireless IC 32 stores the commands in the storage device of the slave-unit-side wireless IC 32 (step S45). For example, in step S45, the command related to the initial setting and the command related to the equalization process are stored in the storage device.

Thereafter, the battery control device 40 and the battery monitoring device 30 execute a process (such as a disconnection process) for terminating the wireless communication (step S46), and then transition to a standby state (step S47). In the standby state, the slave-unit-side wireless IC 32 outputs the connection request signal for each predetermined period as described above (step S0). It should be noted that the connection request signal may alternatively be outputted at random timings.

(Configuration of Protection Mechanisms 38 and 48)

As described above, external noise radio waves may intrude into the housing 50 of the battery pack 11. Therefore, in each battery monitoring device 30 and the battery control device 40, there are respectively provided protection mechanisms 38 and 48 for detecting communication errors such as errors in communication data when performing wireless communication. The protection mechanisms 38 and 48 are respectively provided in the monitoring IC 31 of each battery monitoring device 30 and the battery control MCU 41 of the battery control device 40. Specifically, the monitoring IC 31 of each battery monitoring device 30 functions as the protection mechanism 38 by executing a program stored in the ROM by the CPU thereof. Similarly, the battery control MCU 41 of the battery control device 40 functions as the protection mechanism 48 by executing a program stored in the ROM by the CPU thereof. It should be noted that the protection mechanisms 38 and 48 may alternatively be configured by hardware (e.g., circuits and the like) and be respectively mounted on the monitoring IC 31 of each battery monitoring device 30 and the battery control MCU 41 of the battery control device 40.

Message data (or protected data) such as the commands and the battery information transmitted/received via the wireless communication is protected by the monitoring IC 31 of each battery monitoring device 30 and the battery control MCU 41 of the battery control device 40 that together check whether the message data is correctly transmitted/received; the battery control MCU 41 of the battery control device 40 functions as the protection mechanism 48 on the transmission side, while the monitoring IC 31 of each battery monitoring device 30 functions as the protection mechanism 38 on the reception side.

In the present embodiment, the battery pack 11 is configured to be capable of performing a plurality of checks. For example, the battery pack 11 may perform a Cyclic Redundancy Check (CRC), an ID check, a sequence check, a timeout check, a check by a feedback response, and a destination confirmation. Moreover, in addition to the aforementioned checks, other checks may also be performed between the wireless ICs 32 and 42. It should be noted that:

it is unnecessary to always carry out all of the check methods; instead, it is possible to select and carry out only some of the check methods as needed. Furthermore, there may be cases where no check is performed. Hereinafter, the outline of each check method will be described; and then specific examples of the check methods will be illustrated.

(Check by Feedback Response)

When the monitoring IC 31 of each battery monitoring device 30 receives a combination of destination information and a command from the battery control MCU 41 of the battery control device 40, the monitoring IC 31 returns the received combination of the destination information and the command as it is (i.e., feedback response) to the battery control MCU 41. Then, the battery control MCU 41 determines whether the combination of the destination information and the command received as the feedback response from the monitoring IC 31 matches the combination of the destination information and the command transmitted to the monitoring IC 31. If they match each other, the battery control MCU 41 determines that the wireless communication was performed normally. In contrast, if they do not match each other, the battery control MCU 41 determines that there is a possibility that the wireless communication was not performed normally. In addition, when making the feedback response, the monitoring IC 31 may return the received combination of the destination information and the command with a data section such as the battery information added thereto. In this case, the determination is performed not on the added data section, but performed on the feedback-responded combination of the destination information and the command.

(Sequence Check)

The sequence check is a method of checking whether data is transmitted/received according to a communication schedule. In the sequence check, the battery control MCU 41 on the transmission side transmits a data unit in which a sequence number is included according to the communication schedule. In the present embodiment, the sequence number is a combination of the address of the destination monitoring IC 31, which is the destination information, and commands to be transmitted the monitoring IC 31. However, individual numbers may be assigned to different sequence numbers in the order of transmission. As shown in FIG. 6, in the communication schedule, sequence numbers are arranged in the order of transmission.

Then, the monitoring IC 31 on the reception side returns the sequence number included in the received data unit as it is by the feedback response to the battery control MCU 41. Thereafter, the battery control MCU 41 checks whether data is transmitted/received according to the communication schedule by determining whether the sequence number included in the received data unit conforms to the communication schedule.

It should be noted that although the battery control MCU 41 performs both the assignment of the sequence number and the determination of the returned sequence number in the present embodiment, the determination of the sequence number may alternatively be performed by the monitoring IC 31. In this case, the monitoring IC 31 also has the communication schedule. Alternatively, the assignment of the sequence number may be performed by the monitoring IC 31; and the determination of the sequence number may be performed by the battery control MCU 41.

(Timeout Check)

The timeout check is a method of checking whether there is a data delay. In the timeout check, the battery control MCU 41 on the transmission side generates and transmits a data unit as described above; the data unit includes a sequence number according to the output timing determined by the communication schedule as shown in FIG. 6. Then, the monitoring IC 31 on the reception side returns, by the feedback response, the sequence number included in the received data unit as it is to the battery control MCU 41. Thereafter, with reference to the communication schedule, the battery control MCU 41 determines, based on the sequence number included in the received data unit, whether the received data unit has been received within a predetermined time from a predetermined reception timing. If the actual reception time of the received data unit is delayed from the predetermined reception timing by a predetermined time or longer, the battery control MCU 41 detects a communication error with reference to the communication schedule.

It should be noted that although the timeout determination is performed by the battery control MCU 41 in the present embodiment, the timeout determination may alternatively be performed by the monitoring IC 31. In this case, the monitoring IC 31 also has the communication schedule. Alternatively, the battery control MCU 41 and the monitoring IC 31 may together perform the timeout determination.

(ID Check)

The ID check is a method of checking, when a data unit is transmitted by the monitoring IC 31 to the battery control MCU 41, whether the transmission source is correct by adding an ID number to the data unit; the ID number is a unique ID set by the battery control MCU 41.

Specifically, when transmitting a data unit to the monitoring IC 31, the battery control MCU 41 specifies the destination by including the address (or the destination information) of the destination monitoring IC 31 in the data unit. Upon receipt of the data unit from the battery control MCU 41, the monitoring IC 31 generates a data unit by adding its own ID number to the process results; then, the monitoring IC 31 returns the generated data unit to the battery control MCU 41. Upon receipt of the data unit from the monitoring IC 31, the battery control MCU 41 determines whether the data unit transmitted by it has been transmitted to the correct destination by determining whether the destination information included in the data unit transmitted by it and the ID number attached to the data unit received by it match.

In addition, the ID number of the monitoring IC 31 is individually set by the battery control MCU 41 for the connected monitoring IC 31 during the initial setting as described above, and is stored and managed by the battery control MCU 41.

Moreover, as described above, in the present embodiment, upon receipt of the data unit from the battery control MCU 41, the monitoring IC 31 returns the data unit, to which the ID number of the monitoring IC 31 is added, to the battery control MCU 41. However, depending on the types of the commands included in the data unit, the ID number may not be added to the data unit. For example, in the case where the monitoring IC 31 simply feedback-responds to a command without adding the data generated by it (i.e., the detected battery information and the like) to the data unit, the ID number may not be added to the data unit.

(Cyclic Redundancy Check)

The cyclic redundancy check is a type of check that uses an error detection code. In the present embodiment, when the monitoring IC 31 is on the transmission side, the monitoring IC 31 regards the protected data to be transmitted as a value, divides it by a predetermined generator polynomial, and generates the remainder as CRC data. Then, the monitoring IC 31 on the transmission side puts the CRC data in the data unit to be transmitted. Thereafter, the battery control MCU 41 on the reception side regards the received protected data as a value, divides it by the same generator polynomial as that on the transmission side, compares the remainder with the CRC data included in the received data unit and thereby analyzes whether an error or corruption has occurred in the protected data.

In the present embodiment, when generating CRC data, the range of data to be used as the protected data may be changed arbitrarily. For example, a combination of destination information and commands (or sequence number), which is a feedback response, may be used as the protected data; or the result of adding a transmission data section such as an ID number and battery information to the combination may be used as the protected data. Furthermore, in addition to generating CRC data for the combination of destination information and commands, CRC data for other data (e.g., a transmission data section such as an ID number and battery information) may be generated separately.

(Destination Confirmation)

As described above, the battery control device 40 transmits a data unit, in which a plurality of commands are included collectively, to the battery monitoring device 30. Then, the slave-unit-side wireless IC 32 sequentially transmits the plurality of commands included in the data unit to the monitoring IC 31. Thereafter, the monitoring IC 31 performs the processes based on the commands, adds its own ID number to each of the commands, and transmits the commands as the feedback response to the slave-unit-side wireless IC 32. When the plurality of commands included in the data unit are returned from the monitoring IC 31, the slave-unit-side wireless IC 32 generates a data unit by collecting the commands to which the ID numbers is assigned, and transmits the generated data unit to the battery control device 40. Thereafter, if the ID number assigned to each of the commands included in the received data unit matches the destination information, the battery control MCU 41 determines that all of the wired communication between the battery control MCU 41 and the master-unit-side wireless IC 42, the wireless communication between the master-unit-side wireless IC 42 and the slave-unit-side wireless IC 32 and the wired communication between the slave-unit-side wireless IC 32 and the monitoring IC 31 have been performed normally.

(Communication Protection in Wireless ICs)

As described above, in the present embodiment, when data is transmitted/received in the communication layer between the battery control MCU 41 and the monitoring IC 31, the data is protected by the protection mechanisms 38 and 48. In addition, in the present embodiment, data protection is also performed in the communication layer between the wireless ICs 32 and 42. Hereinafter, the data protection will be described in detail below.

When wireless data is transmitted/received between the wireless ICs 32 and 42, the wireless data is protected by the wireless ICs 32 and 42 that together check whether the wireless data is correctly transmitted/received.

Specifically, upon receipt of a data unit from the battery control MCU 41 or the monitoring IC 31, the wireless IC 32 or 42 on the transmission side generates wireless data by adding communication control information and communication protection data to the received data unit and transmits the generated wireless data. The communication control information is information necessary for performing wireless communication, such as a transmission source address and a transmission destination address. The communication protection data is data for checking and protecting the communication control information. The communication protection data is generated by the wireless IC 32 or 42 on the transmission side according to predetermined rules.

Upon receipt of the wireless data, the wireless IC 32 or 42 on the reception side checks the received communication control information according to the predetermined rules and based on the communication protection data of the received wireless data, and analyzes (or determines) whether the wireless data is transmitted/received correctly. After the analysis, the wireless IC 32 or 42 acquire the data unit and transmit it to the battery control MCU 41 or the monitoring IC 31.

In the present embodiment, similar to the protection mechanisms 38 and 48, the wireless ICs 32 and 42 also perform a plurality of types of checks, such as a cyclic redundancy check, an ID check, a sequence check and timeout check. More particularly, these checks are performed by executing programs stored in the ROMs of the wireless ICs 32 and 42 by the CPUs of the wireless ICs 32 and 42. Alternatively, checking means may be configured by hardware (e.g., circuits and the like) and mounted on the wireless ICs 32 and 42. The contents of the checks performed by the wireless ICs 32 and 42 are substantially the same as those of the checks performed by the protection mechanisms 38 and 48; therefore, description thereof will be omitted hereinbelow.

Specific Examples of Check Methods

Hereinafter, how checks are performed in the wireless communication in the steady state will be described with reference to FIGS. 7 to 11.

Figure 7:
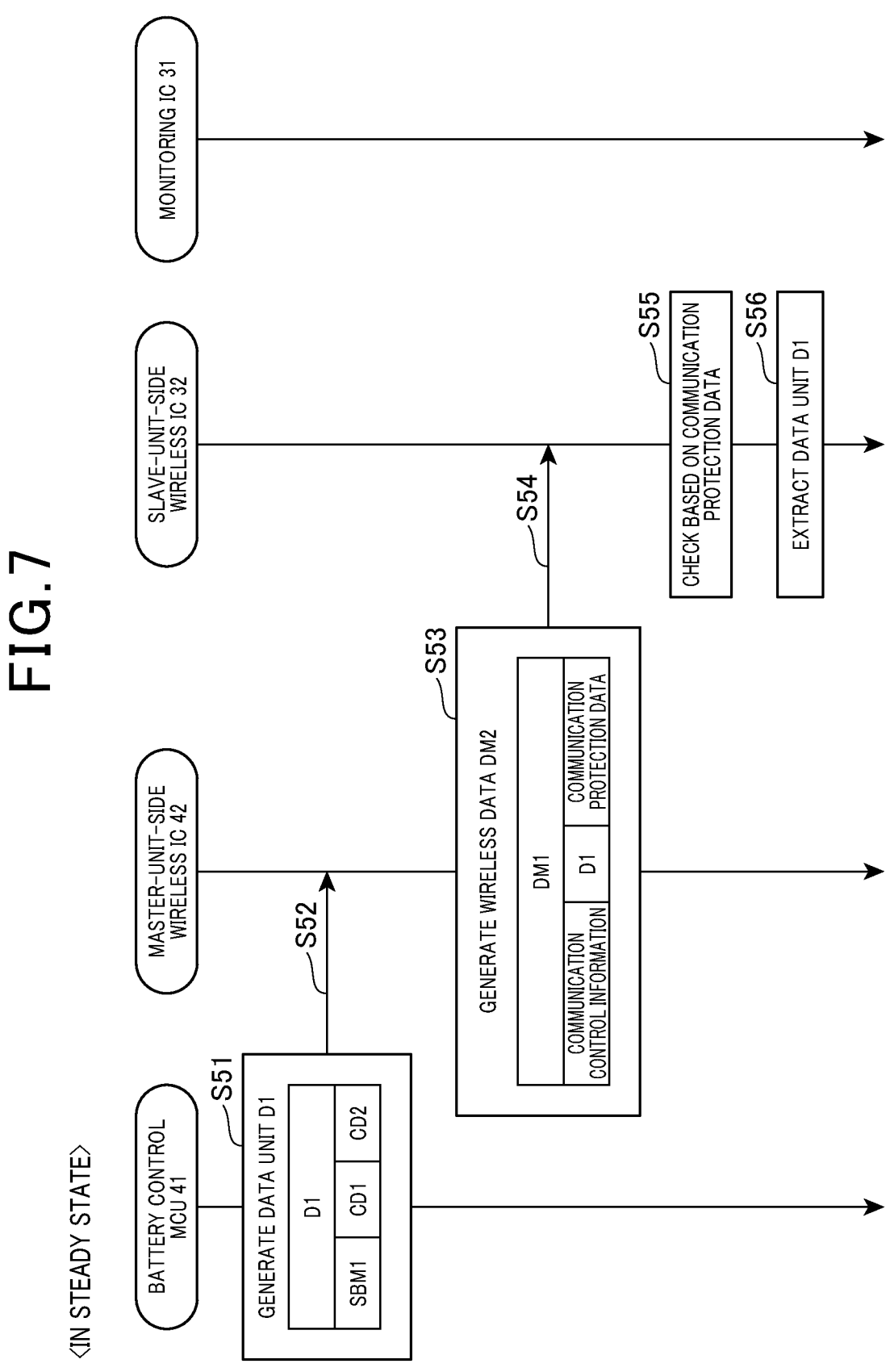
FIG. 7 is another diagram illustrating the specific example of the processing sequence of the wireless communication.

As shown in FIG. 7, the battery control MCU 41 specifies, according to the communication schedule shown in FIG. 6, the destination information and the types and number of the commands which are in first place in the transmission order, and generates a data unit D1 (step S51). It should be noted that although the types and number of the commands included in the data unit may be set arbitrarily, it is desirable for the data unit to include a pair of an execution instruction command specifying a process (e.g., the sensing operation) to be executed by the monitoring IC 31 and a retrieval instruction command instructing the monitoring IC 31 to retrieve the results of the process (e.g., the detected battery information).

As shown in FIG. 7, the battery control MCU 41 transmits the data unit D1 to the master-unit-side wireless IC 42 at a predetermined output timing according to the communication schedule (step S52). Then, the master-unit-side wireless IC 42 generates wireless data DM1 by adding communication control information and communication protection data to the received data unit D1 (step S53).

The master-unit-side wireless IC 42 transmits the wireless data DM1 to the slave-unit-side wireless IC 32 (step S54). Then, the slave-unit-side wireless IC 32 performs, when determining whether the wireless data DM1 is addressed to it, a check based on the communication protection data (step S55). If the check result is normal, the slave-unit-side wireless IC 32 extracts the data unit D1 from the received wireless data DM1 (step S56).

As shown in FIG. 8, the slave-unit-side wireless IC 32 transmits the command CD1 included in the data unit D1 to the monitoring IC 31 based on the destination information (step S56). It should be noted that in the present embodiment, explanation will be made on the assumption that the command CD1 is an execution instruction command. Moreover, the destination information is transmitted along with the command CD1.

The monitoring IC 31 executes the process specified by the command CD1 (step S57). Upon completion of the process, the monitoring IC 31 generates reply data DR1 to be returned to the slave-unit-side wireless IC 32 (step S58). Specifically, the monitoring IC 31 puts the destination information and the command CD1 (or the sequence number) in the reply data DR1 to be returned to the slave-unit-side wireless IC 32 as the feedback response. Moreover, the monitoring IC 31 generates CRC data for the destination information and the command CD1, and puts the generated CRC data also in the reply data DR1. At the same time, the monitoring IC 31 may further put its own ID number and CRC data of the ID number in the reply data DR1.

Then, the monitoring IC 31 transmits the reply data DR1 to the slave-unit-side wireless IC 32 (step S58). Upon receipt of the reply data DR1, the slave-unit-side wireless IC 32 stores the received reply data DR1 in the storage device of the slave-unit-side wireless IC 32 (step S59).

Figure 9:
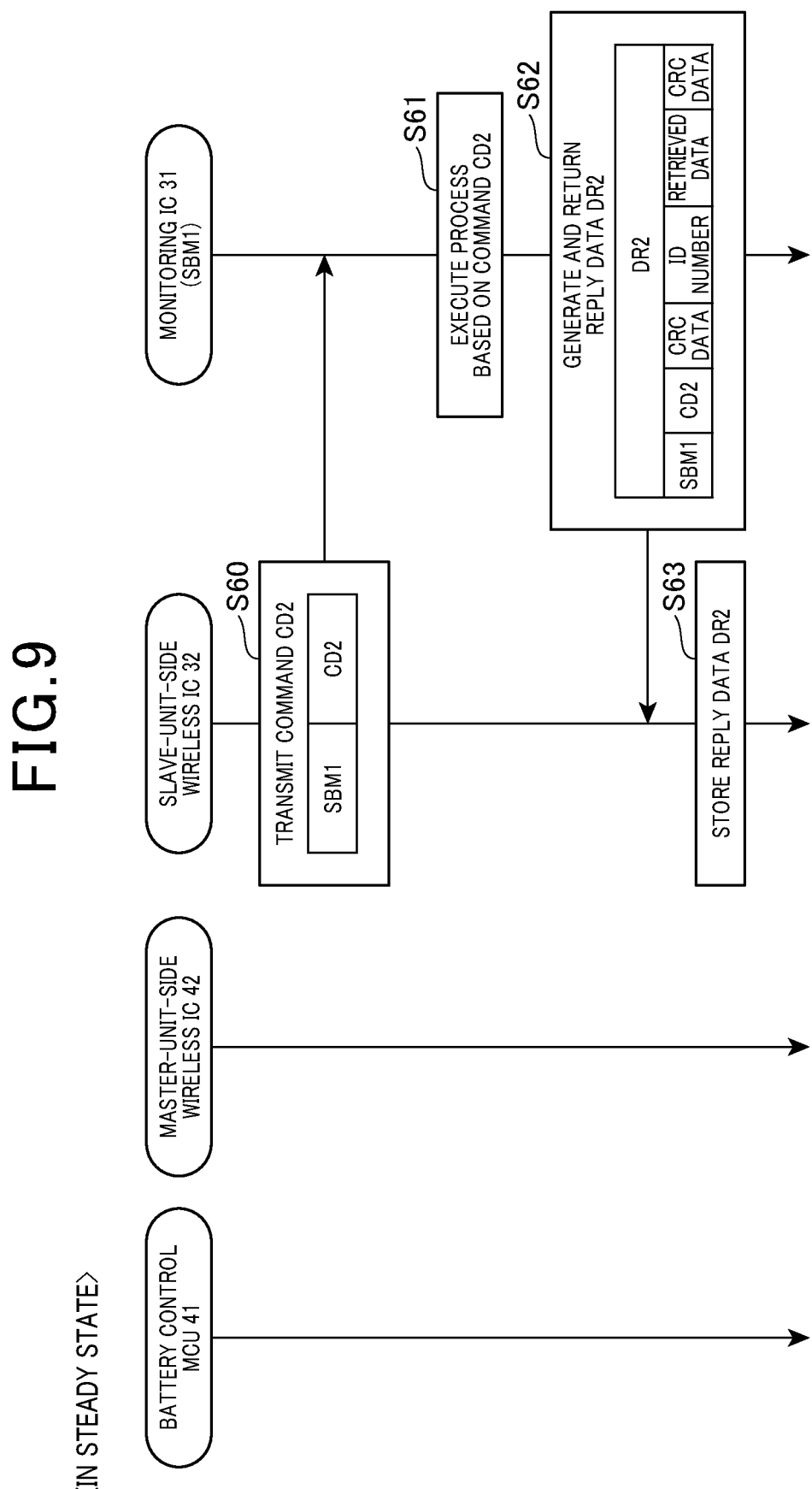
FIG. 9 is another diagram illustrating the specific example of the processing sequence of the wireless communication.

Then, as shown in FIG. 9, the slave-unit-side wireless IC 32 retrieves the next command CD2 included in the data unit D1, and transmits it to the monitoring IC 31 in the same manner as described above (step S60). In the present embodiment, the command CD2 is assumed to be a retrieval instruction command for retrieving the results of the process specified by the command CD1. The processes in subsequent steps S61 to S63 are almost the same as those in steps S56 to S59; therefore, detailed description thereof will be omitted hereinbelow. In addition, the command CD2 is a retrieval instruction command for retrieving the results of the process specified by the command CD1; therefore, in step S62, the retrieved data such as the detected battery information is included in the reply data DR2 and also subject to CRC data.

Moreover, as shown in FIG. 8, during the processes in steps S56 to S63, the battery control MCU 41 may transmit the next data unit D2 to another battery monitoring device 30 (e.g., SBM2 in FIG. 8) according to the communication schedule (steps S91 to S93). That is, during the processes of a first battery monitoring device 30 (e.g., SBM1), the battery control device 40 may perform wireless communication with a second battery monitoring device 30 (e.g., SBM2) in parallel with the processes of the first battery monitoring device 30. Consequently, it will become possible to allow the processes of the second battery monitoring device 30 (e.g., SBM2) to be performed in parallel with the processes of the first battery monitoring device 30 (e.g., SBM1).

Figure 10:
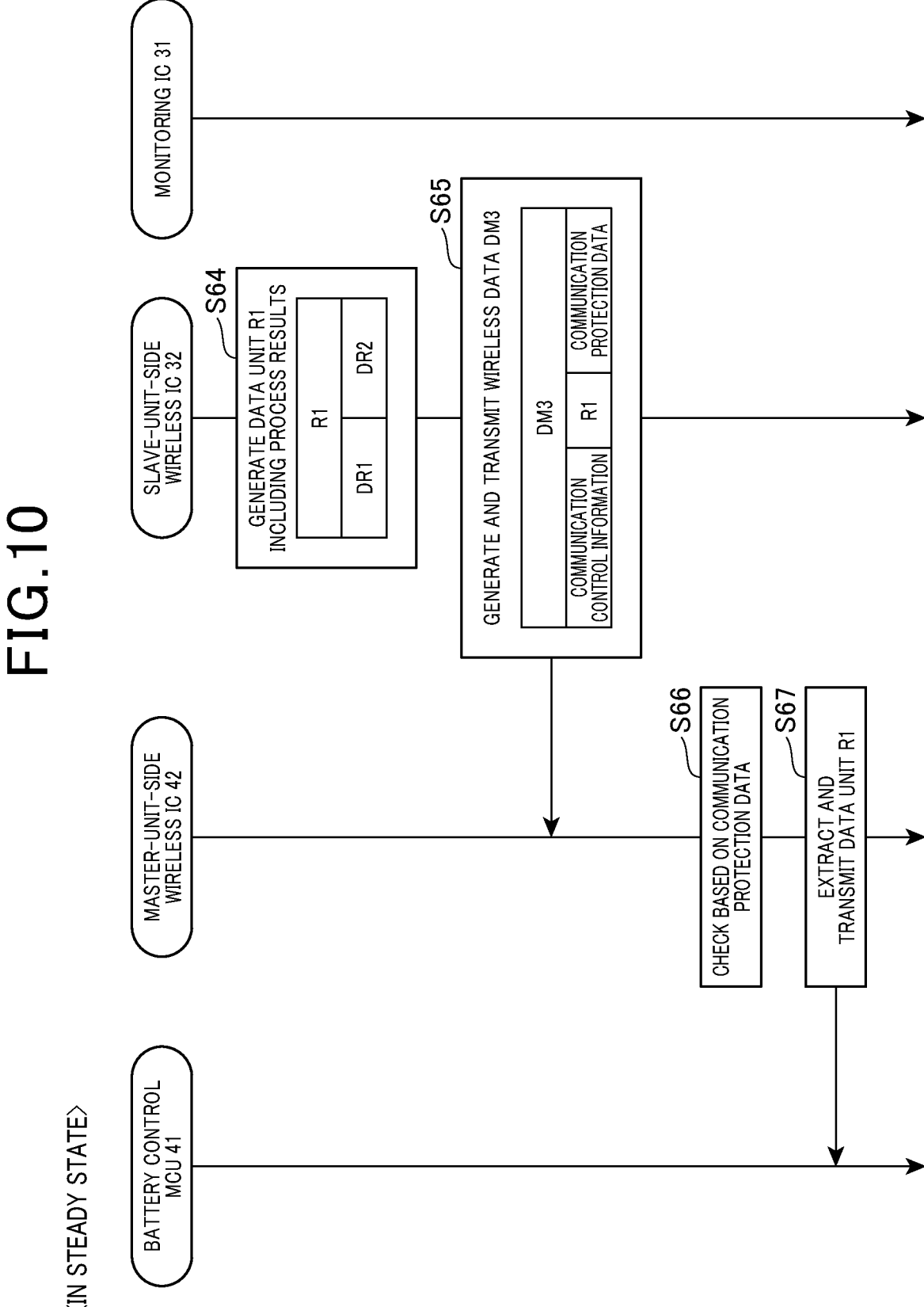
FIG. 10 is another diagram illustrating the specific example of the processing sequence of the wireless communication.

When all the commands CD1 and CD2 included in the data unit D1 have been outputted and the reply data DR1 and DR2 indicating the results of the processes specified by the commands CD1 and CD2 have been stored, as shown in FIG. 10, the slave-unit-side wireless IC 32 generates a reply data unit RI in which the reply data DR1 and DR2 are included collectively (step S64). Then, the slave-unit-side wireless IC 32 converts the reply data unit RI into wireless data DM3 and transmits it to the master-unit-side wireless IC 42 (step S65). The master-unit-side wireless IC 42 performs, when determining whether the wireless data DM3 is addressed to it, a check based on the communication protection data (step S66). If the check result is normal, the master-unit-side wireless IC 42 extracts the reply data unit RI from the received wireless data DM3 and transmits it to the battery control MCU 41 (step S67).

Figure 11:
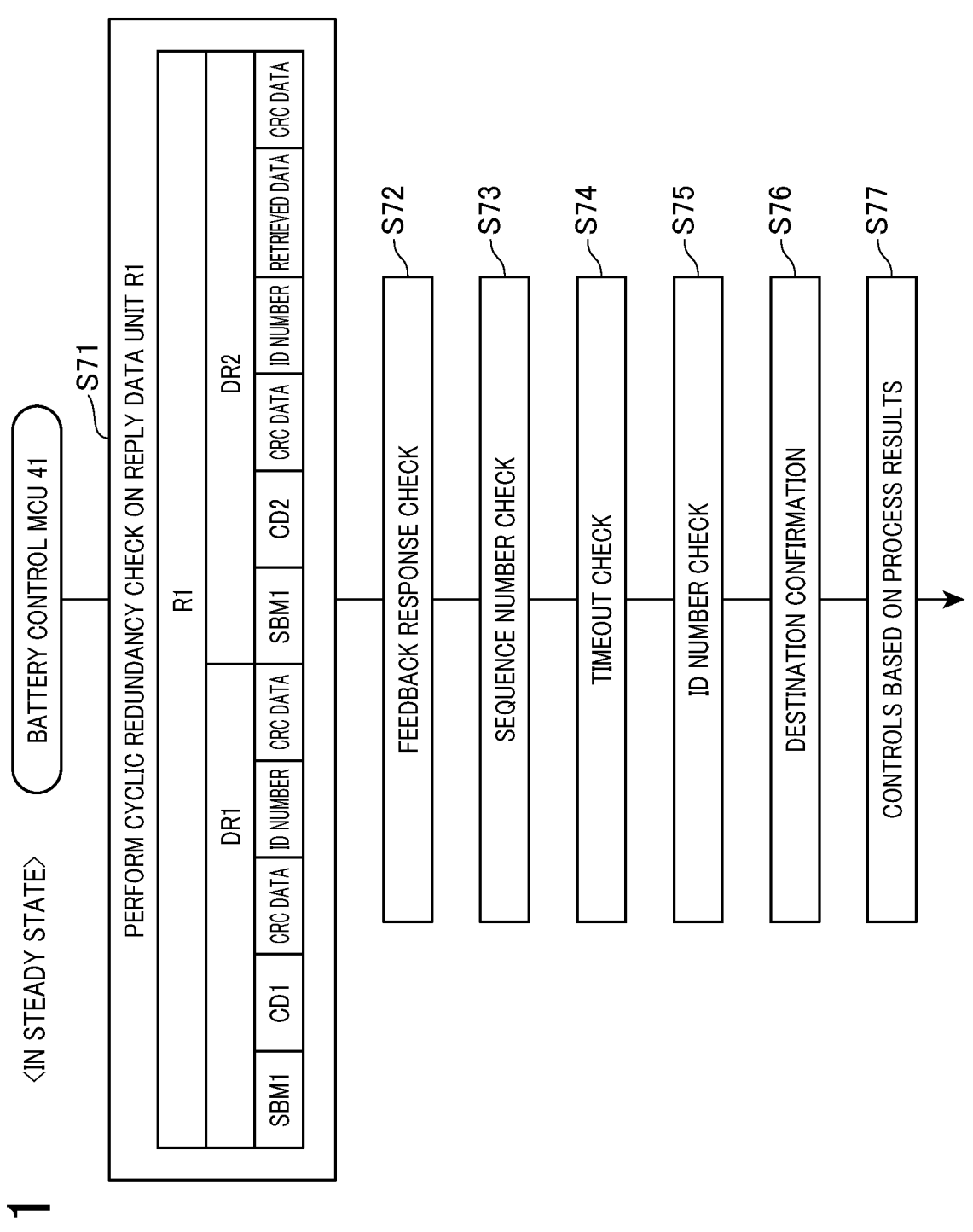
FIG. 11 is another diagram illustrating the specific example of the processing sequence of the wireless communication.

As shown in FIG. 11, the reply data unit RI includes the destination information and the commands (or sequence number), the CRC data of the destination information and the commands, the data sections including the ID number and the retrieved data, and the CRC data of the data sections.

The battery control MCU 41 generates CRC data from the protected data and performs a cyclic redundancy check by determining whether the generated CRC data matches the CRC data included in the reply data unit RI (step S71).

Next, the battery control MCU 41 performs a feedback response check of determining whether the combination of the destination information and the commands included in the reply data unit RI matches the transmitted one (step S72).

Next, the battery control MCU 41 checks the combination of the destination information and the commands (or sequence number) according to the communication schedule (step S73). Further, the battery control MCU 41 performs a timeout check of determining whether a predetermined time has elapsed from the time of transmission to the time of reception according to the communication schedule (step S74). Furthermore, the battery control MCU 41 performs an ID check of determining whether the ID number included in the reply data unit RI corresponds to the destination information (step S75). Furthermore, the battery control MCU 41 performs a destination confirmation of determining whether the ID number associated with each command included in the reply data unit RI matches the destination information (step S76).

If there is no abnormality in the above checks, the battery control MCU 41 determines that normal communication has been performed. In contrast, if there is an abnormality in any of the above checks, the battery control MCU 41 performs notification of the communication error. Further, if it is determined that normal communication has been performed, the battery control MCU 41 acquires the process results such as the battery information from the retrieved data and performs various controls based on the process results (step S77).

Hereinafter, advantageous effects achievable according to the first embodiment will be described.

When the communication is started, the slave-unit-side wireless IC 32 executes the authentication process with the master-unit-side wireless IC 42 and performs the operation instruction, which is related to the initial operation, to the monitoring IC 31 in parallel with the execution of the authentication process. Consequently, it becomes possible to cause the monitoring IC 31 to execute the initial operation without waiting for the completion of the authentication process. As a result, the initial operation can be completed quickly. Hence, it becomes possible to shorten the time from when the ignition switch is turned on until the vehicle becomes able to run.

The battery monitoring device 30 has a plurality of commands related to the initial operation stored therein. Therefore, the battery monitoring device 30 can instruct the initial operation without communicating with the battery control device 40. Moreover, when the communication is terminated, the battery control device 40 outputs commands related to the next initial operation to the battery monitoring device 30 and the commands are stored in the slave-unit-side wireless IC 32 of the battery monitoring device 30. Therefore, the battery control device 40 can change the commands related to the next initial operation depending on the situation at the time of termination of the communication.

In the battery monitoring device 30 and the battery control device 40, there are respectively provided the protection mechanisms 38 and 48 for protecting the battery information during the wireless communication. Therefore, even if external radio waves intrude into the housing 50, it is possible to detect them and ensure that the wireless communication be performed properly.

Moreover, the protection mechanisms 38 and 48 are provided respectively in the monitoring IC 31 and the battery control MCU 41. In the communication layer between the monitoring IC 31 and the battery control MCU 41, the protection mechanisms 38 and 48 on the transmission side and the reception side together check the battery information, thereby protecting the battery information. Consequently, it becomes possible to protect the data unit between the monitoring IC 31 and the battery control MCU 41 without considering the configuration of the communication layer between the monitoring-side wireless IC 32 and the control-side wireless IC 42. In other words, each communication layer can be designed independently, thereby simplifying the design.

When transmitting the protected data such as the battery information, the monitoring IC 31 generates the CRC data (or error detection code) for detecting errors based on the protected data and puts the CRC data in the transmitted data unit. The battery control MCU 41 checks, based on the CRC data included in the received data unit, whether there is any error in the protected data. In other words, a cyclic redundancy check is performed. Consequently, it becomes possible to check for errors due to the influence of external radio waves in the wireless communication.

When transmitting the data unit, the monitoring IC 31 has the identification information (i.e., the ID number) of the transmission source included in the data unit. The battery control MCU 41 checks whether the transmission source is correct based on the ID number included in the received data unit. In other words, an ID check is performed. Therefore, when performing the wireless communication, it is possible to check for transmission source errors whose occurrence probability increases due to the influence of external radio waves in the wireless communication.

The sequence information (i.e., the sequence number) is included in the transmitted/received data unit. Based on the sequence number included in the received data unit, the battery control MCU 41 checks whether the data unit has been received at the reception timing determined according to the communication schedule. That is, a sequence check and a timeout check are performed. Therefore, when performing the wireless communication, it is possible to check for transmission order errors, transmission omissions, transmission delays and the like which are likely to occur due to the influence of external radio waves in the wireless communication.

Checks are also performed in the communication layer between the wireless IC 32 on the monitoring side and the wireless IC 42 on the control side. That is, double checks are performed in the communication layer between the monitoring IC 31 and the battery control MCU 41 and the communication layer between the monitoring-side wireless IC 32 and the control-side wireless IC 42. Consequently, it becomes possible to more reliably transmit the battery information. Moreover, since the communication protection data provided between the wireless ICs 32 and 42 is data for checking and protecting the communication control information, the redundancy of the wireless data can be suppressed as compared with the case where the protection is performed with the battery information included in the wireless data. Consequently, the power consumption can be suppressed.

When the monitoring IC 31 receives a combination of destination information and a command from the battery control MCU 41, the monitoring IC 31 returns the received combination of the destination information and the command as it is (i.e., feedback response) to the battery control MCU 41. Then, the battery control MCU 41 determines whether the combination of the destination information and the command received as the feedback response from the monitoring IC 31 matches the combination of the destination information and the command transmitted to the monitoring IC 31. In this manner, it is possible to check whether the command has been transmitted without errors.

The battery control device 40 transmits a plurality of commands included collectively in a data unit to the battery monitoring device 30. The collectively transmitted commands include a pair of an execution instruction command that instructs a process and a retrieval instruction command that instructs return of the results of the process. The slave-unit-side wireless IC 32 sequentially transmits the plurality of commands included in the received data unit to the monitoring IC 31. Then, the monitoring IC 31 performs the processes based on the commands, adds its own ID number to each of the commands, and transmits the commands as the feedback response to the slave-unit-side wireless IC 32. When the plurality of commands included in the data unit are returned from the monitoring IC 31, the slave-unit-side wireless IC 32 generates a data unit by collecting the commands to which the ID numbers is assigned, and transmits the generated data unit to the battery control device 40. Thereafter, if the ID number assigned to each of the commands included in the received data unit matches the destination information, the battery control MCU 41 determines that all of the wired communication between the battery control MCU 41 and the master-unit-side wireless IC 42, the wireless communication between the master-unit-side wireless IC 42 and the slave-unit-side wireless IC 32 and the wired communication between the slave-unit-side wireless IC 32 and the monitoring IC 31 have been performed normally.

Moreover, a pair of an execution instruction command instructing a process and a retrieval instruction command instructing return of the results of the process is included in one data unit. Therefore, in the destination confirmation, it is possible to confirm that the monitoring IC 31 that executed the process and the monitoring IC 31 from which the results of the process are retrieved are the same.

The battery control device 40 transmits a plurality of commands included collectively in a data unit to the battery monitoring device 30; and the plurality of commands are stored in the battery monitoring device 30. Then, while the slave-unit-side wireless IC 32 sequentially transmits the plurality of commands included in the data unit to the monitoring IC 31, the battery control device 40 transmits a data unit to another battery monitoring devices 30. Consequently, during the processes of one battery monitoring device 30, the battery control device 40 can perform wireless communication with another battery monitoring device 30. Moreover, it is possible to cause two or more battery monitoring devices 30 to perform processes in parallel. As a result, it is possible to efficiently use time. In addition, since a plurality of commands are transmitted collectively, the number of communications can be reduced, thereby making it possible to suppress the total communication data volume.

When the destination battery monitoring device 30 is changed, the battery control device 40 generates, by changing the destination information even if the commands remain the same, a data unit to be transmitted. Consequently, it becomes possible to reliably specify the destination monitoring IC 31 and transmit the data unit to the destination monitoring IC 31.

The battery control device 40 assigns an ID number individually to each monitoring IC 31. Consequently, it becomes possible to reliably specify the destination monitoring IC 31.

Modifications of First Embodiment

Hereinafter, explanation will be given of modifications in which the configuration of the battery pack 11 according to the first embodiment is partially modified. It should be noted that in the following modifications, components identical to those in the first embodiment will be designated by the same reference signs as those in the first embodiment; and description thereof will be omitted hereinafter.

In the above-described embodiment, the monitoring IC 31 may perform a cyclic redundancy check on the data unit received from the battery control MCU 41. In this case, it is desirable for the battery control MCU 41 to generate and add to the data unit CRC data for each command to be transmitted. Alternatively, the generation and addition of CRC data by the battery control MCU 41 may be omitted. In this case, upon receipt of the data unit from the battery control MCU 41, the slave-unit-side wireless IC 32 may add CRC data corresponding to the received commands to the data unit by refereeing to a correspondence table between commands and CRC data, and then transmit the data unit to the monitoring IC 31. In addition, as described above, checks and protection of data are also performed in the communication layer between the master-unit-side wireless IC 42 and the slave-unit-side wireless IC 32. Therefore, even if no CRC data is added by the battery control MCU 41 to the data unit, data errors could still be detected between the master-unit-side wireless IC 42 and the slave-unit-side wireless IC 32.

In the above-described embodiment, the sequence numbers may be changed to any number. For example, the sequence numbers may be set sequentially using a counter.

In the above-described embodiment, the subject of the feedback response is not limited to the destination information and commands. For example, in the case where other data (such as CRC data) is added to the destination information and commands, these may be transmitted as the feedback response.

In the above-described embodiment, all the battery information is protected by the protection mechanisms 38 and 48. Alternatively, the battery information may be selectively protected. Specifically, the battery information to be protected may be selected depending on the degree of importance and/or the environment.

For example, the temperature of the battery cells 22 generally changes less easily than the voltages and SOCs thereof. Therefore, compared to the voltage information and the SOC information, it is less problematic to update the temperature information less frequently. Accordingly, it is possible to protect, of the battery information, only information that needs to be updated frequently (such as the voltage information and the SOC information) without protecting information that needs to be updated less frequently (such as the temperature information). On the other hand, in an environment where it is easy for the temperature in the vehicle 10 and thus the temperature of the battery cells 22 to increase, it is possible to protect the temperature information as well.

In the above-described embodiment, the protection mechanism 38 is provided for each of all the monitoring ICs 31 of the battery monitoring devices 30. Alternatively, the protection mechanism 38 may be provided for each of only some of the monitoring ICs 31. That is, the protection mechanism 38 may be provided for each of, at least, those monitoring ICs 31 of the battery monitoring devices 30 which are susceptible to external radio waves.

In the above-described embodiment, the battery monitoring device 30 is provided for each of the battery blocks 21. As an alternative, a single battery monitoring device 30 may be provided for a plurality of battery blocks 21. As another alternative, a plurality of battery monitoring devices 30 may be provided for a single battery block 21. In the above-described embodiment, in each of the battery monitoring devices 30, there is provided a single monitoring IC 31. Alternatively, in each of the battery monitoring devices 30, there may be provided a plurality of monitoring ICs 31. In this case, a plurality of wireless ICs 32 may be provided respectively for the plurality of monitoring ICs 31, or only a single wireless IC 32 may be provided for all the plurality of monitoring ICs 31. Further, in the case of providing only a single wireless IC 32 for all the plurality of monitoring ICs 31, the wireless IC 32 may transmit the battery information received from the monitoring ICs 31 separately, or may transmit all the battery information received from the monitoring ICs 31 collectively.

In the above-described embodiment, each monitoring IC 31 is provided for a plurality of battery cells 22. Alternatively, each monitoring IC 31 may be provided for only a single battery cell 22.

In the above-described embodiment, the monitoring IC 31 collectively transmits all the battery information of the battery cells 22 that together constitute the battery block 21 to be monitored. Alternatively, the monitoring IC 31 may transmit the battery information of the battery cells 22 separately. Moreover, the monitoring IC 31 may select some of the battery cells 22 that together constitute the battery block 21 to be monitored and transmit the battery information of only the selected battery cells 22. For example, as described above, those battery cells 22 whose information is to be transmitted may be selected depending on the degree of importance and/or the environment.

In the above-described embodiment, the monitoring IC 31 protects all the battery information of the battery cells 22 that together constitute the battery block 21 to be monitored. Alternatively, the monitoring IC 31 may select some of the battery cells 22 that together constitute the battery block 21 to be monitored and protect the battery information of only the selected battery cells 22. For example, as described above, those battery cells 22 whose information is to be protected may be selected depending on the degree of importance and/or the environment.

In the above-described embodiment, the single battery control device 40 is provided in the battery pack 11. Alternatively, a plurality of battery control devices 40 may be provided in the battery pack 11.

In the above-described embodiment, it is unnecessary for the battery control device 40 to perform wireless communication with all the battery monitoring devices 30. That is, the battery control device 40 may perform wired communication with some of the battery monitoring devices 30. Specifically, when the environment is not suitable for the battery control device 40 to perform wireless communication with some of the battery monitoring devices 30, for example, when the distances between some of the battery monitoring devices 30 and the battery control device 40 are long and transmissive parts are placed therebetween, the battery control device 40 may be connected with these battery monitoring devices 30 by wires to perform wired communication with them.

In the above-described embodiment, the wireless ICs 32 and 42 check and protect the wireless communication control information, but the message data including the battery information and the like may be similarly checked and protected. Moreover, the data units may also be similarly checked and protected. Consequently, it would become possible to more reliably transmit/receive the battery information.

In the above-described embodiment, the wireless ICs 32 and 42 may perform a timeout check for the wireless data transmitted/received between them. In this case, a threshold time used for the timeout check in the communication between the wireless ICs 32 and 42 may be set to be different from that used for the timeout check in the communication between the monitoring IC 31 and the battery control MCU 41. Specifically, the threshold time used for the timeout check in the communication between the wireless ICs 32 and 42 may be set to be shorter than that used for the timeout check in the communication between the monitoring IC 31 and the battery control MCU 41.

More specifically, the timeout check between the wireless ICs 32 and 42 is mainly for ensuring the reliability of the wireless data by, for example, detecting whether the wireless data is received correctly without delay and retransmitting the wireless data. Therefore, it is desirable to perform the timeout check each time the wireless data is transmitted/received. On the other hand, the battery information only needs to be correctly transmitted/received within a time period between the occurrence of an abnormality and the occurrence of a dangerous situation. Therefore, there is more leeway in the transmission/reception of the battery information than in the wireless communication between the wireless ICs 32 and 42. Accordingly, the threshold time used for the timeout check in the communication between the monitoring IC 31 and the battery control MCU 41 may be set to be longer than that used for the timeout check in the communication between the wireless ICs 32 and 42.

In the above-described embodiment, the wireless ICs 32 and 42 may perform an ID check in the communication between them. In this case, the frequency (or cycle) of checking the ID numbers of the wireless ICs 32 and 42 in the communication between them may be set to be different from that of performing the ID check in the communication between the monitoring IC 31 and the battery control MCU 41. Specifically, the cycle of performing the ID check in the communication between the wireless ICs 32 and 42 may be set to be shorter than the cycle of performing the ID check in the communication between the monitoring IC 31 and the battery control MCU 41.

In the above-described embodiment, the wireless ICs 32 and 42 may perform a Cyclic Redundancy Check (CRC) on the wireless data transmitted/received between them. In this case, the CRC may be performed only on the communication control information; that is, it is unnecessary to perform the CRC on the data units as well. As a matter of course, the CRC may be performed on the battery information transmitted/received between the wireless ICs 32 and 42.

In the above-described embodiment, the wireless ICs 32 and 42 may perform a sequence check on the wireless data transmitted/received between them. In this case, the frequency (or cycle) of performing the sequence check between the wireless ICs 32 and 42 may be set to be different from that of the sequence check performed between the monitoring IC 31 and the battery control MCU 41. Specifically, the cycle of performing the sequence check between the wireless ICs 32 and 42 may be set to be shorter than that of the sequence check performed between the monitoring IC 31 and the battery control MCU 41.

In the above-described embodiment, checks are also performed in the communication layer between the wireless IC 32 and the wireless IC 42. However, the checks in the communication layer between the wireless IC 32 and the wireless IC 42 may be omitted provided that the checks are performed on the data units transmitted/received the monitoring IC 31 and the battery control MCU 41.

In the above-described embodiment, the checks are performed on the communication control information transmitted/received between the wireless IC 32 and the wireless IC 42. However, checks may be performed on the data units transmitted/received between the wireless IC 32 and the wireless IC 42 as well as on the communication control information transmitted/received between the same. Consequently, it would become possible to more reliably perform the wireless communication between the wireless IC 32 and the wireless IC 42.

In the above-described embodiment, errors in the message data including the battery information and commands are detected by the Cyclic Redundancy Check (CRC). Alternatively, errors in the message data may be detected by other methods. For example, errors in the message data may be detected by checking a parity, a checksum or hashes. Furthermore, after detection of errors in the message data, the detected errors may be corrected using an error detection/correction code.

In the above-described embodiment, the sequence number is included in the data to be checked; and the sequence check and the timeout check are performed based on the sequence number. Alternatively, time information such as a transmission time or timestamp may be included in the data to be checked; the sequence check and the timeout check may be performed based on the time information.

In the above-described embodiment, the battery control MCU 41 instructs the monitoring IC 31 to acquire and return the battery information; and the monitoring IC 31 acquires the battery information and returns it to the battery control MCU 41 in response to the instruction. Alternatively, the monitoring IC 31 may acquire and transmit to the battery control MCU 41 the battery information at a predetermined transmission timing according to a predetermined communication schedule. In this case, the battery control 2.5 MCU 41 may have stored therein the same communication schedule as that on the transmission side and check whether the battery information has been received at a predetermined reception timing according to the communication schedule. Consequently, it would become possible to reduce the communication volume and lower the possibility of occurrence of communication errors.

In the above-described embodiment, in the communication schedule, the output timings of the command instructing detection of the battery voltage may be determined so that the detection of the battery voltage can be periodically performed to the extent that the safety of the assembled battery 20 can be ensured. Similarly, in the communication schedule, the output timings of the command instructing detection of the battery temperature may be determined so that the detection of the battery temperature can be periodically performed to the extent that the safety of the assembled battery 20 can be ensured. Similarly, in the communication schedule, the output timings of the command instructing the self-diagnosis may be determined so that the self-diagnosis can be periodically performed to the extent that the safety of the assembled battery 20 can be ensured. Moreover, in the communication schedule, the activation timings of the equalization process and the execution timings of the initial operation may be similarly determined in advance to the extent that the safety of the assembled battery 20 can be ensured.

In the above-described embodiment, the protection mechanisms 38 and 48 may selectively perform the protection (or check) of the battery information depending on the state (i.e., voltages, SOCs and temperatures) of the battery cells 22 to be monitored.

For example, when the voltages, temperatures or SOCs of the battery cells 22 are outside a predetermined allowable range, the battery cells 22 may not be properly charged/discharged. Therefore, when the voltages, temperatures or SOCs of the battery cells 22 are in the vicinity of an upper limit or a lower limit of the allowable range (or within a predetermined range with reference to the upper limit or the lower limit), it is desirable for the protection mechanisms 38 and 48 to check, during the transmission/reception of the battery information between the monitoring IC 31 that monitors the battery cells 22 and the battery control MCU 41, whether the battery information is being properly transmitted/received and protect the battery information. Moreover, for example, when the battery information of the battery cells 22 has not been received for a predetermined time or longer, it is desirable for the protection mechanisms 38 and 48 to check, during the transmission/reception of the battery information between the monitoring IC 31 that monitors the battery cells 22 and the battery control MCU 41, whether the battery information is being properly transmitted/received and protect the battery information.

In the above-described embodiment, a check device provided outside the vehicle 10 may be employed, instead of the battery control device 40, to perform wireless communication with the battery monitoring devices 30. In this case, the check device provided outside the vehicle 10 has the same functions as the battery control device 40. Consequently, it would become possible to quickly collect the battery information.

In the above-described embodiment, when the wireless communication is started, the slave-unit-side wireless IC 32 outputs the connection request signal; upon detecting the connection request signal, the master-unit-side wireless IC 42 outputs the slave unit discovery signal; then, the authentication process is executed between the slave-unit-side wireless IC 32 and the master-unit-side wireless IC 42. Alternatively, when the wireless communication is started, the master-unit-side wireless IC 42 may output a connection request signal; the slave-unit-side wireless IC 32 may output, upon detecting the connection request signal, a master unit discovery signal; then, the authentication process may be executed between the slave-unit-side wireless IC 32 and the master-unit-side wireless IC 42. In this case, the slave-unit-side wireless IC 32 may instruct, in response to the input of the connection request signal thereto, the monitoring IC 31 to execute the initial operation.

Other Modifications

The configuration of a battery monitoring system is not limited to that described in the above embodiment.

Problems to be Solved by the Disclosure

A battery monitoring system includes a housing that accommodates a battery, a monitoring unit and a control unit. In order to perform communication between the monitoring unit and the control unit, it is desired to properly utilize the space within the housing.

The following first to eleventh configurations mainly aim to provide a battery pack capable of properly utilizing the space within a housing in order to perform communication between a monitoring unit and a control unit.

Means for Solving the Problems (First Configuration)

According to the first configuration, a battery monitoring system comprises: a battery (110);

a monitoring unit (200) that monitors a state of the battery and transmits battery information representing results of the monitoring;

a control unit (300) that performs communication with the monitoring unit to acquire the battery information and execute various controls; and a housing (400), wherein the housing has a bottom plate portion (410), wall portions (420, 430) formed along a peripheral edge of the bottom plate portion, and a cover (440) that covers the wall portions from above, the battery, the monitoring unit and the control unit are accommodated in an accommodation space (SP) formed by the bottom plate portion, the wall portions and the cover, on an upper surface of the cover, there is formed a protrusion (441, 442) that protrudes upward and extends in a specific direction along the upper surface of the cover, on a lower surface side of the cover at the protrusion, there is formed, along the protrusion, a recess (441a, 442a) that is recessed toward the upper surface side of the cover, and when the housing is viewed in a thickness direction of the cover, at least one of the monitoring unit and the control unit is located near the recess.

In the first configuration, the recess that is recessed toward the upper surface side of the cover is formed, along the protrusion, on the lower surface side of the cover at the protrusion. Moreover, when the housing is viewed in the thickness direction of the cover, at least one of the monitoring unit and the control unit is located near the recess. Therefore, the recess can be used as a communication path (e.g., a radio wave propagation path) when communication is performed in the specific direction between the monitoring unit and the control unit. Hence, with the first configuration, the recess formed integrally in the cover of the housing can be effectively utilized for performing communication between the monitoring unit and the control unit.

Here, the meaning of "at least one of the monitoring unit and the control unit is located near the recess" encompasses not only the arrangement of at least one of the monitoring unit and the control unit at a position under the recess, but also the arrangement of at least one of the monitoring unit and the control unit at a position apart from the position under the recess by several times the width of the recess in a direction perpendicular to both the specific direction and the vertical direction.

(Second Configuration)

According to the second configuration, in the above first configuration, the battery monitoring system further comprises:

a monitoring-side antenna (201) that transmits/receives data to/from the monitoring unit;

a control-side antenna (301) that transmits/receives data to/from the control unit and performs wireless communication with the monitoring-side antenna; and communication wiring (302) that electrically connects the control unit and the control-side antenna, wherein the control-side antenna and the communication wiring are arranged in the recess, the monitoring-side antenna is arranged below the recess in the accommodation space, and when the housing is viewed in the thickness direction of the cover, at least part of the monitoring-side antenna overlaps with the recess.

In the second configuration, the recess in the accommodation space of the housing can be effectively utilized as the arrangement space of the control-side antenna and the communication wiring for performing wireless communication.

Moreover, in the second configuration, the monitoring-side antenna is arranged below the recess in the accommodation space; and when the housing is viewed in the thickness direction of the cover, at least part of the monitoring-side antenna overlaps with the recess. Consequently, it becomes possible to locate the monitoring-side antenna and the control-side antenna close to each other; thus, it becomes possible to properly perform wireless communication between the monitoring unit and the control unit.

(Third Configuration)

According to the third configuration, in the above second configuration, a plurality of fastening parts (450), which protrude from the lower surface of the cover, are formed in alignment with each other in the specific direction in a region of the cover other than the region where the protrusion is formed, the battery comprises a plurality of batteries grouped into a plurality of monitoring target batteries (110), the monitoring unit comprises a plurality of monitoring units each of which is provided individually for a corresponding one of the monitoring target batteries, the monitoring-side antenna comprises a plurality of monitoring-side antennas each of which is provided individually for a corresponding one of the monitoring units, and when the housing is viewed in the thickness direction of the cover, each of the monitoring-side antennas is located at a position not overlapping any of the fastening parts.

With the third configuration, it is difficult for the fastening parts to interfere with radio waves exchanged between the control-side antenna and the monitoring-side antennas. Consequently, it becomes possible to improve the quality of the wireless communication.

(Fourth Configuration)

According to the fourth configuration, a battery monitoring system comprises:

a battery (110);

a monitoring unit (200) that monitors a state of the battery and transmits battery information representing results of the monitoring;

a control unit (300) that performs communication with the monitoring unit to acquire the battery information and execute various controls; and a housing (400), wherein the housing has a bottom plate portion (410), wall portions (420, 430) formed along a peripheral edge of the bottom plate portion, and a cover (440) that covers the wall portions from above, the battery, the monitoring unit and the control unit are accommodated in an accommodation space (SP) formed by the bottom plate portion, the wall portions and the cover, the battery comprises a plurality of batteries grouped into a plurality of monitoring target batteries (110, 130), the monitoring unit comprises a plurality of monitoring units each of which is provided individually for a corresponding one of the monitoring target batteries, wherein the battery monitoring system further comprises:

a plurality of monitoring-side antennas (201) each of which is provided individually for a corresponding one of the monitoring units and transmits/receives data to/from the corresponding monitoring unit; and a control-side antenna (301) that transmits/receives data to/from the control unit and performs wireless communication with the monitoring-side antennas, wherein the monitoring units, the monitoring-side antennas and the control-side antenna are arranged in gaps between the cover and the batteries in the accommodation space, the monitoring units and the monitoring-side antennas are arranged in the accommodation space which consists of a first accommodation space on one side of a lateral center of the housing and a second accommodation space on the other side of the lateral center of the housing, the control-side antenna comprises a plurality of control-side antennas, and some of the plurality of control-side antennas are arranged in the first accommodation space and the remainder of the plurality of control-side antennas are arranged in the second accommodation space.

In the fourth configuration, the monitoring units, the monitoring-side antennas and the control-side antennas are arranged between the cover and the batteries in the accommodation space of the housing. Moreover, the monitoring units and the monitoring-side antennas are arranged in the accommodation space of the housing which consists of the first accommodation space on one side of the lateral center of the housing and the second accommodation space on the other side of the lateral center of the housing.

Furthermore, in the fourth configuration, some of the plurality of control-side antennas are arranged in the first accommodation space and the remainder of the plurality of control-side antennas are arranged in the second accommodation space. Consequently, it becomes possible to locate the monitoring-side and control-side antennas, which are arranged in the gaps between the cover and the batteries in the first accommodation space, close to each other. Moreover, it also becomes possible to locate the monitoring-side and control-side antennas, which are arranged in the gaps between the cover and the batteries in the second accommodation space, close to each other. As a result, it becomes possible to facilitate transmission of radio waves between the control-side antennas and the monitoring-side antennas; thus, it becomes possible to improve the quality of wireless communication between the control unit and the monitoring units.

(Fifth Configuration)

The fourth configuration can be further implemented, for example, as the fifth configuration. According to the fifth configuration, the control unit is arranged near a center position in a lateral direction of the housing in the accommodation space.

(Sixth Configuration)

According to the sixth configuration, in the fourth or fifth configuration, the plurality of monitoring units are arranged in alignment with each other in a longitudinal direction of the housing in both the first accommodation space and the second accommodation space, and when the housing is viewed in the thickness direction of the cover, predetermined members (460, 450) are located, in the accommodation space, between those monitoring units which are accommodated in the first accommodation space and those monitoring units which are accommodated in the second accommodation space.

According to the sixth configuration, the predetermined members that may interfere with radio waves are arranged in a central part of the accommodation space of the housing in the lateral direction; in the accommodation space, spaces on both sides of the predetermined members in the lateral direction can be used as wireless communication spaces between the control-side antennas and the monitoring-side antennas. Consequently, it becomes difficult for the predetermined members to interfere with radio waves exchanged between the control-side antennas and the monitoring-side antennas; thus, it becomes possible to improve the quality of wireless communication between the control unit and the monitoring units.

(Seventh Configuration)

The sixth configuration can be further implemented, for example, as the seventh configuration. According to the seventh configuration, the distance between each adjacent pair of the monitoring units in the longitudinal direction of the housing is shorter than the distance between each adjacent pair of the monitoring units in the lateral direction of the housing, and each of the predetermined members is arranged between an adjacent pair of the monitoring units in the lateral direction of the housing.

(Eighth Configuration)

According to the eighth configuration, in the fourth configuration, the plurality of monitoring target batteries (130) are arranged in alignment with each other in the longitudinal direction of the housing in both the first accommodation space and the second accommodation space, in the first accommodation space, those monitoring units and monitoring-side antennas which correspond to the monitoring target batteries arranged in the first accommodation space are arranged in alignment with each other in the longitudinal direction of the housing, and in the second accommodation space, those monitoring units and monitoring-side antennas which correspond to the monitoring target batteries arranged in the second accommodation space are arranged in alignment with each other in the longitudinal direction of the housing, wherein the battery monitoring system further comprises:

first electroconductive members (620 to 622) that are arranged, in the first accommodation space, on both sides of the monitoring units and the monitoring-side antennas in the lateral direction of the housing and electrically connect the monitoring target batteries arranged in the first accommodation space; and second electroconductive members (620 to 622) that are arranged, in the second accommodation space, on both sides of the monitoring units and the monitoring-side antennas in the lateral direction of the housing and electrically connect the monitoring target batteries arranged in the second accommodation space, wherein the first electroconductive members are arranged in alignment with each other in the longitudinal direction of the housing in the first accommodation space, and the second electroconductive members are arranged in alignment with each other in the longitudinal direction of the housing in the second accommodation space.

According to the eighth configuration, it becomes possible to secure wireless communication paths in the arrangement direction of the monitoring units and the monitoring-side antennas in the accommodation space of the housing.

(Ninth Configuration)

According to the ninth configuration, in any one of the second to the eighth configurations, an upper surface of the battery is located above boundaries between the cover and the wall portions in a height direction of the housing.

External radio waves may intrude into the housing through the boundaries between the cover and the wall portions. In this regard, according to the ninth configuration, it becomes difficult for external radio waves to reach the space between the cover and the battery.

(Tenth Configuration)

According to the tenth configuration, in the ninth configuration, the cover is formed of a metal material, the wall portions and the bottom plate portion are formed of a synthetic resin, and in the accommodation space, the monitoring unit and the monitoring-side antenna are arranged between the cover and the battery.

According to the tenth configuration, the monitoring unit and the monitoring-side antenna are interposed between the cover and the battery both of which have an electromagnetic shielding effect. Consequently, it becomes difficult for external radio waves, which have intruded into the housing through the boundaries between the cover and the wall portions, to reach the monitoring unit and the monitoring-side antenna. Moreover, according to the tenth configuration, since the wall portions and the bottom plate portion are formed of a synthetic resin, it becomes possible to achieve reduction in the weight of the housing.

(Eleventh Configuration)

According to the eleventh configuration, in the ninth configuration, in a battery pack installed in a mobile object, at least one of the cover, the wall portions and the bottom plate portion is formed of a synthetic resin, the mobile object has a body (500) formed of a metal material, the housing is arranged in an accommodation space (SS) formed within the body, and in the accommodation space within the body, there is formed a gap between the body and the housing.

In the eleventh configuration, in order to achieve reduction in the weight of the housing, at least one of the cover, the wall portions and the bottom plate portion is formed of a synthetic resin. In this case, radio waves may leak externally through the at least one of the cover, the wall portions and the bottom plate portion which is formed of the synthetic resin; and external radio waves may intrude into the housing through the at least one of the cover, the wall portions and the bottom plate portion which is formed of the synthetic resin.

In this regard, in the eleventh configuration, the accommodation space is formed within the body that is formed of a metal material; and the housing is arranged in the accommodation space. Consequently, it becomes possible to suppress external leakage of radio waves and intrusion of external radio waves into the housing. Moreover, it becomes possible to utilize the gap formed between the body and the housing in the accommodation space as a wireless communication space; thus, it becomes possible to properly perform wireless communication between the monitoring unit and the control unit.

Problems to be Solved by the Disclosure

In the case of arranging a control unit in an accommodation space of a housing, it is necessary to provide a dedicated space for arranging the control unit within the accommodation space. Consequently, it may become impossible to achieve reduction in the size of the housing.

The following twelfth to twenty-second configurations mainly aim to provide a battery pack enabling reduction in the size of a housing.

Means for Solving the Problems (Twelfth Configuration)

According to the twelfth configuration, a battery monitoring system comprises:

a battery (110);

a monitoring unit (200) that monitors a state of the battery and transmits battery information representing results of the monitoring;

a control unit (300) that performs communication with the monitoring unit to acquire the battery information and execute various controls;

a control-side antenna (301) that transmits/receives data to/from the control unit; and a housing (400), wherein the housing has a bottom plate portion (410), wall portions (420, 430) formed along a peripheral edge of the bottom plate portion, and a cover (440) that covers the wall portions from above, and the battery and the monitoring unit are accommodated in an accommodation space (SP) formed by the bottom plate portion, the wall portions and the cover, the control unit and the control-side antenna are arranged on a surface or outside of the housing, the battery monitoring system further comprises a relay device (220, 230) that is provided to the housing to relay communication between the control-side antenna and the monitoring unit, and the control unit receives, via the relay device and the control-side antenna, the battery information transmitted from the monitoring unit.

According to the twelfth configuration, the control unit and the control-side antenna are arranged on the surface or outside of the housing. Consequently, it becomes possible to secure the degree of freedom in the installation of the control unit and the control-side antenna, such as becoming possible to arrange the control unit and the control-side antenna in a limited space in a vehicle. However, in this case, the housing may become an obstacle to transmission/reception of signals.

Therefore, according to the twelfth configuration, the relay device is provided to the housing to relay communication between the control-side antenna and the monitoring unit. Consequently, it becomes possible for the control unit to receive, via the relay device and the control-side antenna, the battery information transmitted from the monitoring unit.

(Thirteenth Configuration)

The twelfth configuration can be further implemented, for example, as the thirteenth configuration. According to the thirteenth configuration, a through-hole (441) is formed in the housing, the relay device has an elongated shape and is inserted in the through-hole, of two end portions of the relay device in a longitudinal direction thereof, one end portion which is located outside the housing constitutes an antenna (220a), and in the relay device, there is provided communication wiring that electrically connects the antenna and the monitoring unit.

(Fourteenth Configuration)

According to the fourteenth configuration, in the thirteenth configuration, the through-hole is formed in the cover, and a lower end of the relay device extends to the battery.

(Fifteenth Configuration)

According to the fifteenth configuration, in the fourteenth configuration, the lower end of the relay device extends to a gap between adjacent batteries that include the battery.

According to the fourteenth or fifteenth configuration, the monitoring unit arranged near the battery can be easily connected to the communication wiring of the relay device.

(Sixteenth Configuration)

According to the sixteenth configuration, in the fifteenth configuration, a partition wall portion (472) is provided in the gap between the adjacent batteries for separately arranging the batteries, and the monitoring unit is arranged, in the gap between the adjacent batteries, above the partition wall.

According to the sixteenth configuration, the accommodation space of the housing can be effectively utilized; and reduction in the size of the battery pack can be achieved.

(Seventeenth Configuration)

The twelfth configuration can be further implemented, for example, as the seventeenth configuration. According to the seventeenth configuration, the battery monitoring system further comprises a monitoring-side antenna (201) that is accommodated in the accommodation space and transmits/receives data to/from the monitoring unit, a through-hole (441) is formed in the housing, and the relay device is provided in the through-hole to relay radio waves from one of the control-side antenna and the monitoring-side antenna to the other of the control-side antenna and the monitoring-side antenna.

In the seventeenth configuration, the relay device absorbs radio waves and re-radiates the absorbed radio waves. Consequently, the relay device can relay radio waves between the monitoring-side antenna arranged in the accommodation space of the housing and the control-side antenna arranged outside the housing. In addition, the relay device may be implemented by, for example, a dielectric antenna.

(Eighteenth Configuration)

According to the eighteenth configuration, in the seventeenth configuration, the through-hole is formed in the cover.

(Nineteenth Configuration)

According the nineteenth configuration, in any one of the fourteenth to the sixteenth and the eighteenth configurations, on an upper surface of the cover, there is formed a protrusion (441, 442) that protrudes upward and extends in a specific direction along the upper surface of the cover, a plurality of relay devices are provided, in a region of the cover other than the region where the protrusion is formed, in alignment with each other in the specific direction, and upper end portions of the relay devices are located on the upper surface side of the cover.

According to the nineteenth configuration, both the extending direction of the protrusion and the alignment direction of the relay devices coincide with the specific direction of the housing. Consequently, it becomes possible to secure a wireless communication path in the specific direction.

(Twentieth Configuration)

According to the twentieth configuration, the control unit and the control-side antenna are arranged closer to an end than to a center of the housing in the specific direction.

(Twenty-first Configuration)

According to the twenty-first configuration, in any one of the twelfth to the twentieth configurations, the battery monitoring system is installed in a mobile object, the mobile object has a body (500) formed of a metal material, the housing is arranged in an accommodation space (SS) formed within the body, and in the accommodation space within the body, there are accommodated the control unit and the control-side antenna as well as the housing.

According to the twenty-first configuration, it becomes possible to suppress external leakage of radio waves from the accommodation space within the body and intrusion of external radio waves into the accommodation space within the body.

(Twenty-second Configuration)

According to the twenty-second configuration, in any one of the twelfth to the twenty-first configurations, a battery diagnosis system comprises:

the battery monitoring system; and a battery diagnosis device provided outside the housing, wherein the battery diagnosis device has an antenna that performs wireless communication with the monitoring unit via the relay device, and the battery diagnosis device acquires the battery information from the monitoring unit through the wireless communication.

According to the twenty-second configuration, the battery diagnosis device can acquire the battery information from the monitoring unit without taking out the battery from the housing. Consequently, it becomes possible for the battery diagnosis device to diagnose the state of the battery based on the acquired battery information.

Embodiment A

Hereinafter, an embodiment A embodying a battery pack according to the present disclosure will be described with reference to FIGS. 12 to 19. In the present embodiment, the battery pack 100 is installed in a vehicle such as a hybrid vehicle, an electric vehicle or a fuel cell vehicle. In addition, vehicles in which the battery pack 100 may be employed include, for example, passenger cars, buses, construction vehicles and agricultural vehicles.

The battery pack 100 includes battery blocks 110, battery monitoring devices, a battery control device and a housing 400. In the present embodiment, the housing 400 corresponds to the housing 50 described in the first embodiment; the battery monitoring devices correspond to the battery monitoring devices 30 described in the first embodiment; and the battery control device corresponds to the battery control device 40 described in the first embodiment.

The housing 400 includes a bottom plate portion 410 and wall portions formed along a peripheral edge of the bottom plate portion 410. The bottom plate portion 410 has a rectangular shape. The wall portions include a pair of first wall portions 420 extending in a lateral direction of the bottom plate portion 410 and a pair of second wall portions 430 extending in a longitudinal direction of the bottom plate portion 410.

Moreover, the housing 400 also includes a cover 440. The cover 440 covers the first wall portions 420 and the second wall portions 430 from above. The cover 440 is removable from a base part of the housing 400 which is constituted of the bottom plate portion 410 and the wall portions. An internal space formed by the bottom plate portion 410, the first wall portions 420, the second wall portions 430 and the cover 440 constitutes an accommodation space SP that accommodates the battery blocks 110, the battery monitoring devices and the battery control device.

In addition, the cover 440 may be configured to have an electromagnetic shielding effect of blocking or absorbing radio waves, or be configured to have no electromagnetic shielding effect. Specifically, the cover 440 may be formed of, for example, a metal material (such as aluminum) so as to have an electromagnetic shielding effect. Otherwise, the cover 440 may be formed of, for example, a synthetic resin so as not to have electromagnetic shielding effect.

Similar to the cover 440, the base part constituted of the bottom plate portion 410 and the wall portions may be configured to have an electromagnetic shielding effect, or be configured to have no electromagnetic shielding effect. Moreover, one of the cover 440 and the base part may be configured to have an electromagnetic shielding effect, whereas the other of the cover 440 and the base part may be configured to have no electromagnetic shielding effect.

In addition, a seal member may be provided between the first and second wall portions 420 and 430 and the cover 440. The seal member may be implemented by, for example, a gasket seal formed of a non-conductive elastic material.

Figure 12:
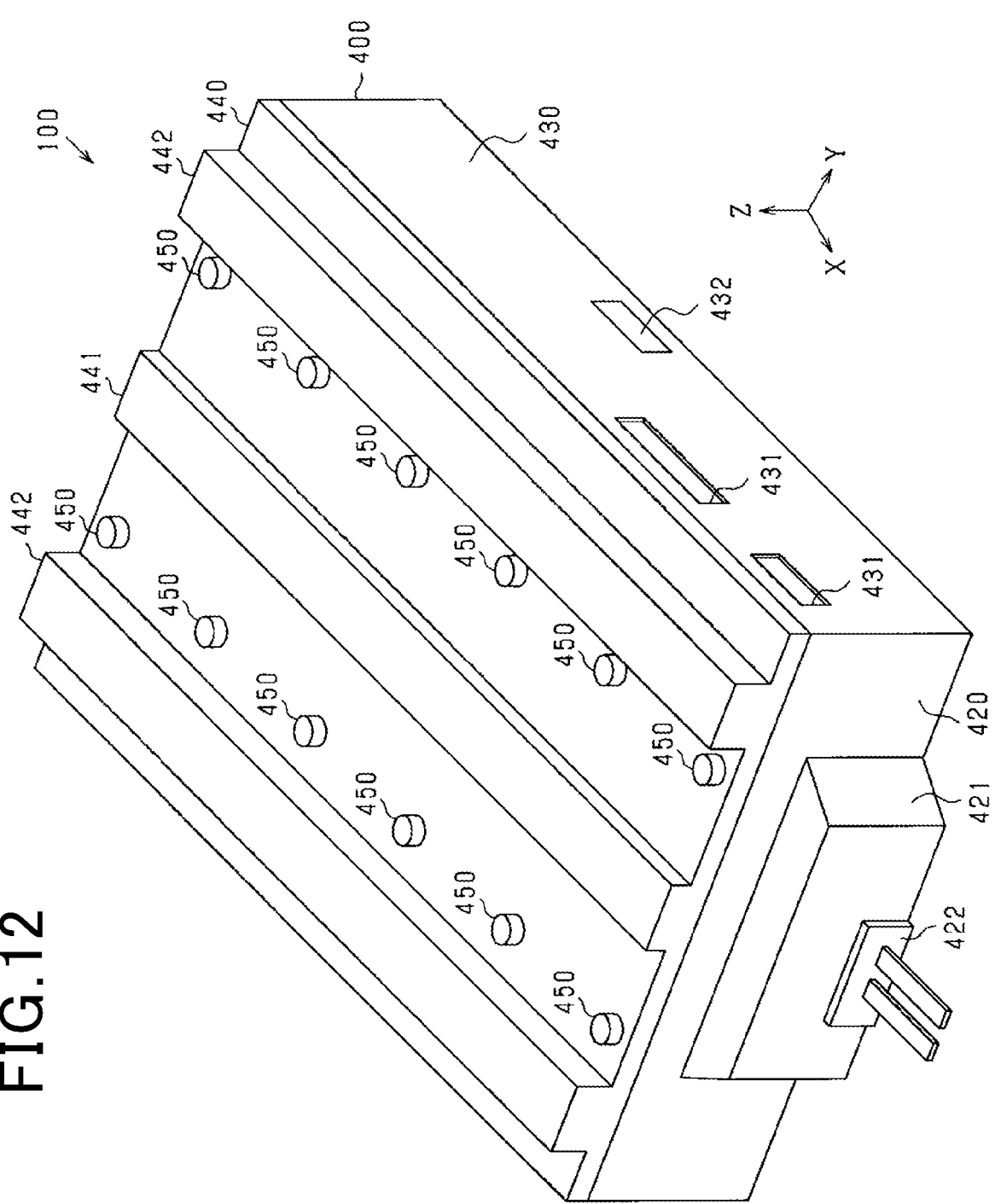
FIG. 12 is a perspective view illustrating the overall configuration of a battery pack according to an embodiment A.

In the present embodiment, the housing 400 is formed in a rectangular parallelepiped shape and installed in the vehicle such that a longitudinal direction of the housing 400 coincides with a longitudinal direction of the vehicle. In FIG. 12 and the like, an X direction represents the longitudinal direction of the housing 400 (i.e., the longitudinal direction of the vehicle); a Y direction represents a lateral direction of the housing 400 (i.e., lateral direction of the vehicle); and a Z direction represents a height direction of the housing 400 (i.e., height direction of the vehicle). For example, a lower surface of the bottom plate portion 410 may serve as an installation surface to the vehicle body.

Figure 16A:
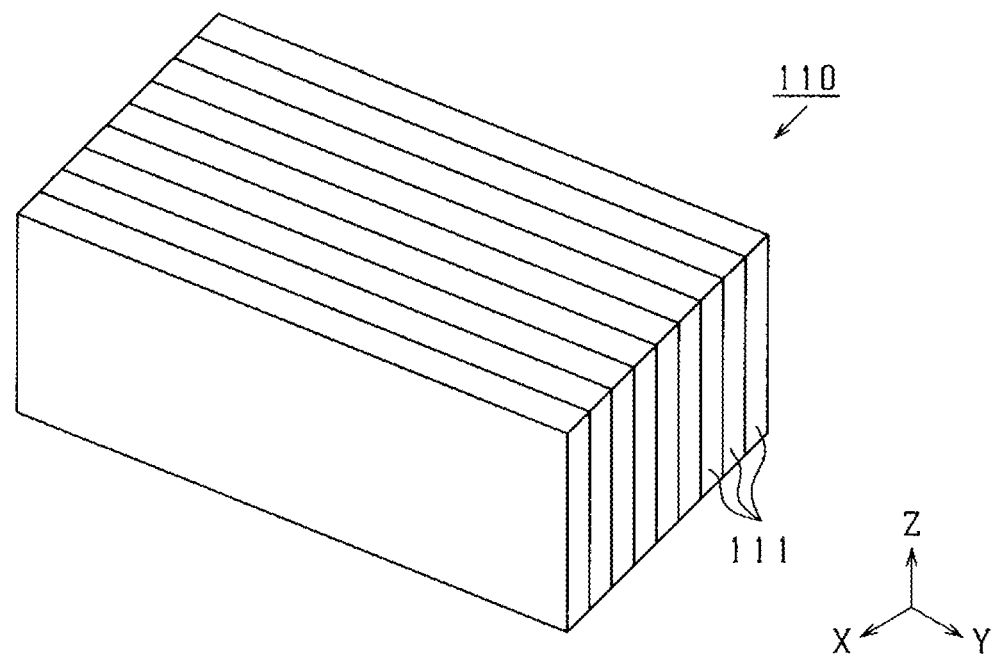
FIGS. 16A and 16B are schematic perspective views each illustrating a stack of battery cells constituting a battery block.

The battery pack 100 includes a plurality of battery blocks 110. The battery blocks 110 are connected in series with each other to form an assembled battery. Each of the battery blocks 110 is formed in a rectangular parallelepiped shape and constituted of a plurality of battery cells (or electric cells) 111 that are connected in series with each other. The battery cells 111 correspond to the battery cells 22 in the first embodiment. In the present embodiment, each of the battery cells 111 has a flat rectangular parallelepiped shape. Moreover, as shown in FIG. 16A, the battery cells 111 are stacked side by side in the longitudinal direction of the housing 400. Each of the battery cells 111 may be implemented by, for example, a lithium-ion secondary battery, a nickel-metal hydride secondary battery or the like. In addition, lithium-ion secondary batteries are secondary batteries which use lithium ions as charge carriers. It should be noted that each of the battery cells 111 may be implemented by a general lithium-ion secondary battery whose electrolyte is a liquid, or by a so-called solid-state battery that uses a solid electrolyte.

Figure 16B:
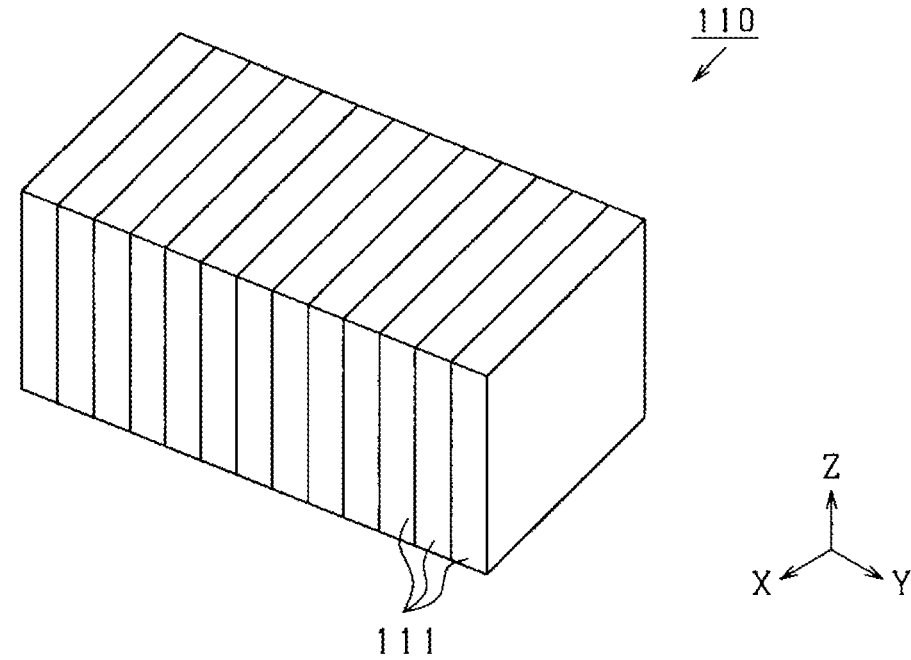

Alternatively, as shown in FIG. 16B, in each of the battery blocks 110, the battery cells 111 may be stacked side by side in the lateral direction of the housing 400. Moreover, in each of the battery blocks 110, the battery cells 111 may be connected in parallel with each other. In addition, the battery blocks may also be referred to as the battery stacks or the battery modules.

Figure 14:
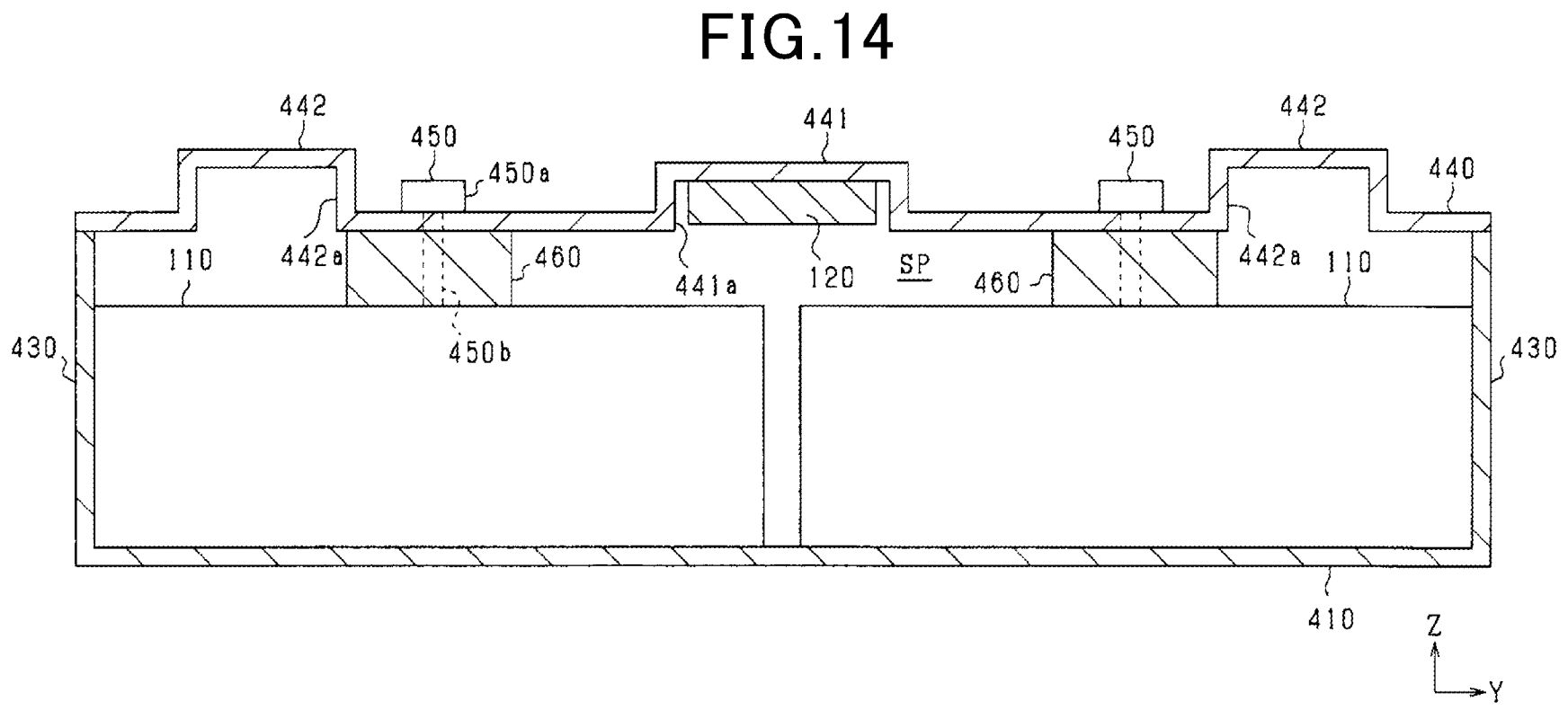
Figure 15:
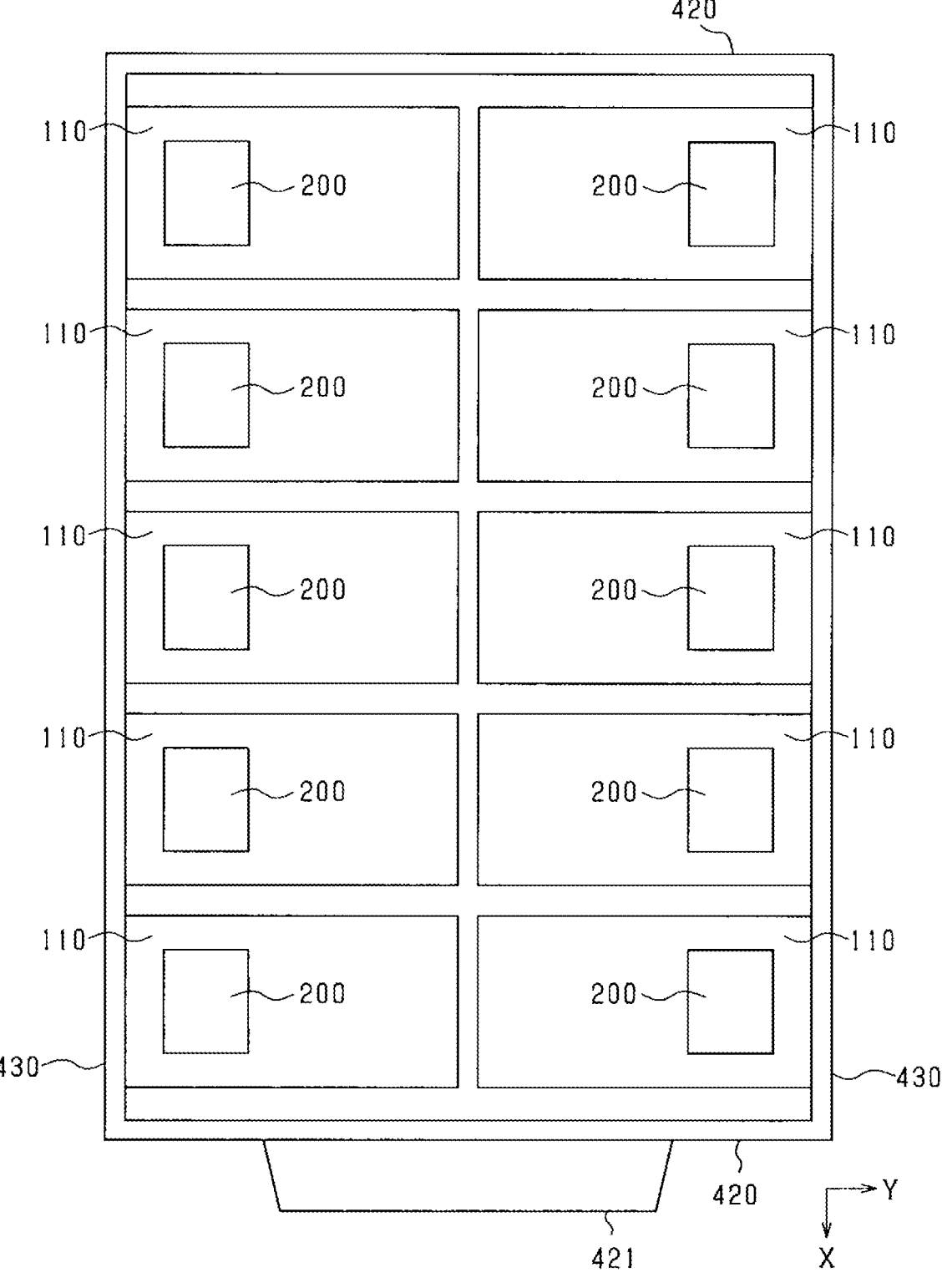
FIG. 15 is a plan view of the battery pack in a state where a cover has been removed therefrom.
Figure 18:
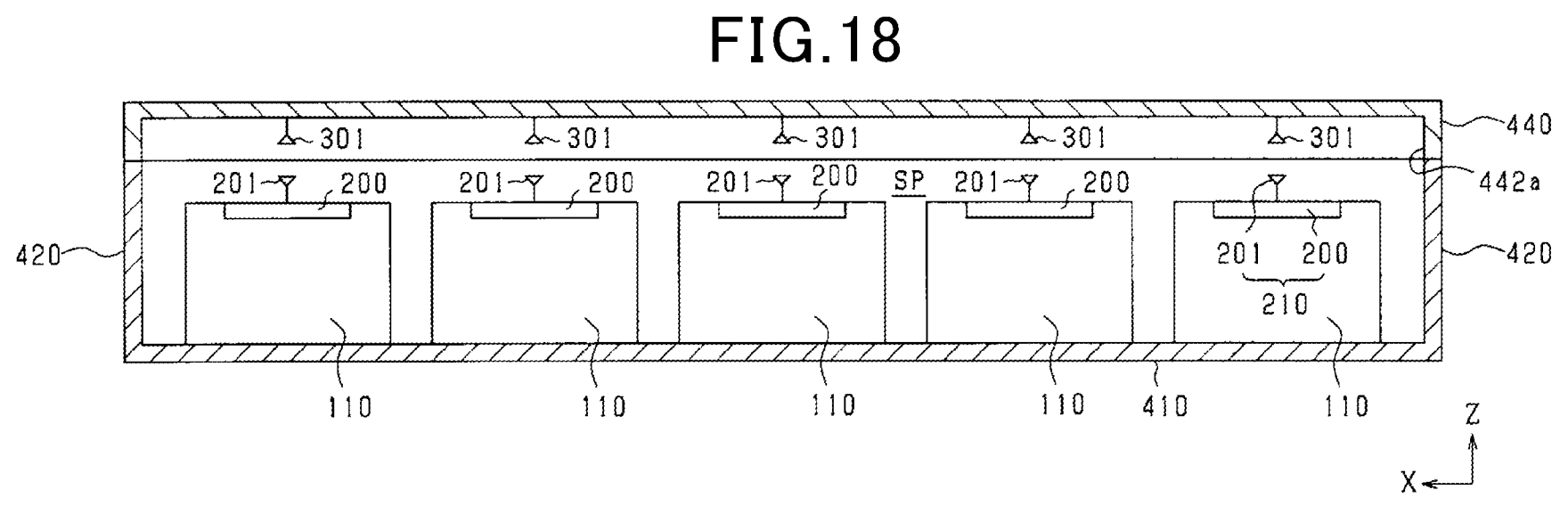

As shown in FIGS. 14, 15 and 18, the battery blocks 110 are accommodated in the accommodation space SP of the housing 400. In the present embodiment, the battery blocks 110 are arranged on the bottom plate portion 410 of the housing 400 such that: every five battery blocks 110 are aligned with each other in the longitudinal direction of the housing 400; and every two battery blocks 110 are aligned with each other in the lateral direction of the housing 400.

Figure 17:
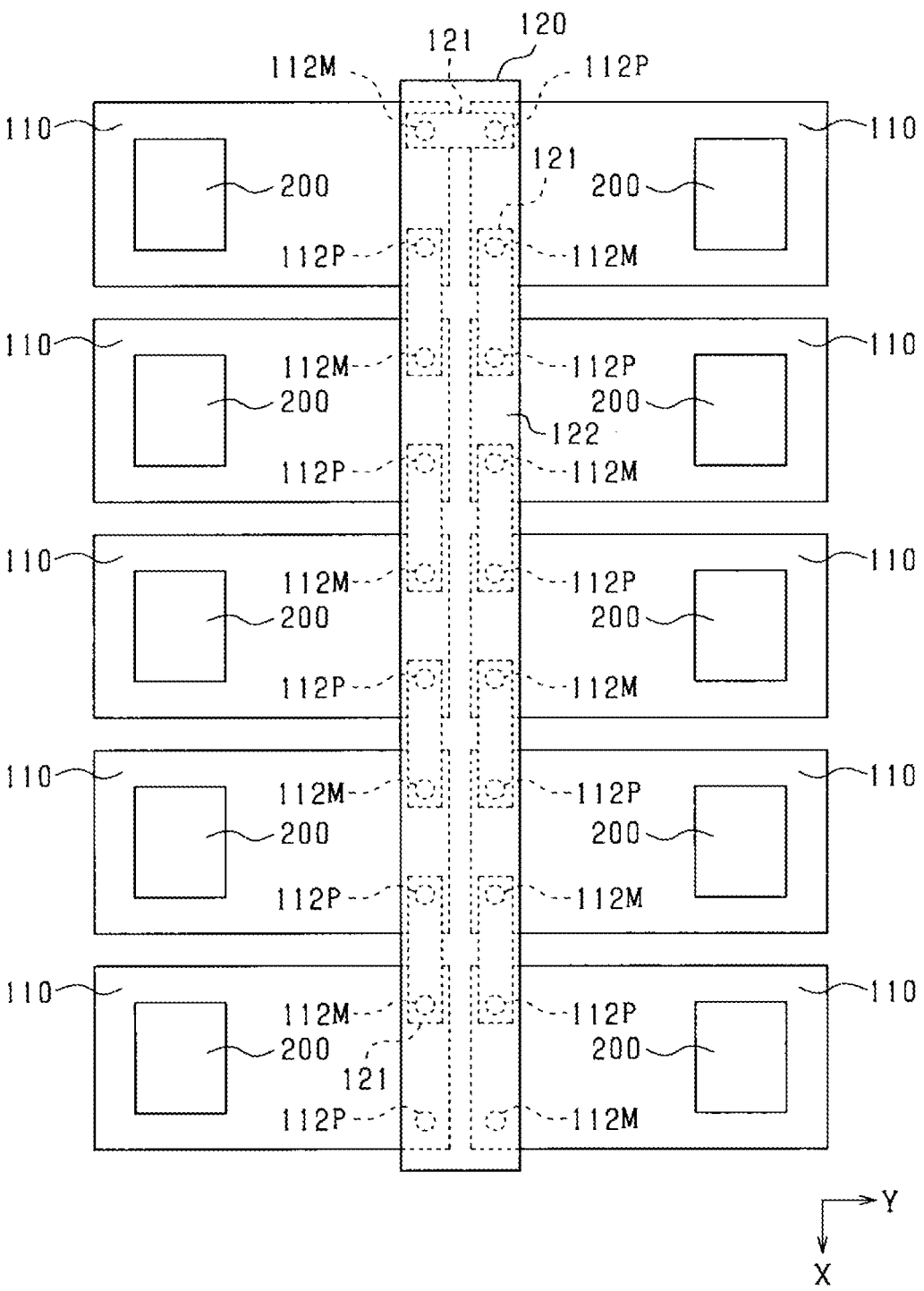
FIG. 17 is a diagram illustrating an example of a method of serially connecting battery blocks.

FIG. 17 illustrates an example of a configuration in which the battery blocks 110 are connected in series with each other. Each of the battery blocks 110 has both a positive-electrode terminal 112P and a negative-electrode terminal 112M protruding from an upper surface thereof. Specifically, the positive-electrode terminal 112P and the negative-electrode terminal 112M are arranged on an end portion of the upper surface of the battery block 110 in a longitudinal direction of the upper surface and in alignment with each other in a lateral direction of the upper surface. Moreover, each of the battery blocks 110 is arranged such that its longitudinal direction coincides with the lateral direction of the housing 400. Furthermore, for each pair of the battery blocks 110 facing each other in the lateral direction of the housing 400, the positive-electrode terminal 112P of one of the pair of the battery blocks 110 and the negative-electrode terminal 112M of the other of the pair of the battery blocks 110 are arranged to face each other in the lateral direction of the housing 400.

The battery pack 100 includes a busbar unit 120. The busbar unit 120 includes a plurality of electroconductive connecting members 121 each of which electrically connects an adjacent pair of the positive-electrode terminals 112P and negative-electrode terminals 112M of the battery blocks 110. Moreover, the busbar unit 120 also includes an encapsulating member 122 that is formed of an electrically-insulative material (e.g., a synthetic resin) and encapsulates the connecting members 121 therein. The busbar unit 120 has an elongated overall shape. Moreover, as shown in FIG. 14, the busbar unit 120 has a rectangular cross section. The battery blocks 110 are connected in series with each other by the busbar unit 120. The assembled battery constituted of the battery blocks 110 serves as an electrical power source for driving a rotating electric machine that serves as a traveling power source of the vehicle. In addition, of the serially-connected battery blocks 110, the highest-potential battery block 110 has its positive-electrode terminal 112P electrically connected with, for example, a higher-potential-side terminal of an inverter via a positive-electrode wiring, whereas the lowest-potential battery block 110 has its negative-electrode terminal 112M electrically connected with, for example, a lower-potential-side terminal of the inverter via a negative-electrode wiring.

In the wall portions of the housing 400, there are formed a plurality of openings. Specifically, as shown in FIG. 12, in the second wall portions 430, there are formed a plurality of openings 431. The openings 431 may serve, for example, as smoke discharge vents for discharging smoke generated inside the housing 400 and as ventilation holes for introducing outside air to cool the assembled battery. The ventilation holes may be formed, for example, above a center position of the second wall portions 430 in the height direction.

In the second wall portions 430, there is also provided an explosion prevention valve 432. The explosion prevention valve 432 is a member for releasing gas inside the housing 400 when the pressure difference between the inside and outside of the housing 400 exceeds a predetermined value. The explosion prevention valve 432 is formed by closing a through-hole formed in the second wall portions 430 with a lid member and welding the lid member to the second wall portions 430. When the pressure difference between the inside and outside of the housing 400 exceeds the predetermined value, the lid member is detached from the housing 400 and thus the gas inside the housing 400 is discharged through the through-hole formed in the second wall portions 430.

On an upper surface of the cover 440, there are formed a plurality of protrusions that protrude upward and extend in the longitudinal direction of the cover 440 (or a specific direction) and along the upper surface of the cover 440. More particularly, in the present embodiment, there are formed three protrusions, i.e., a central protrusion 441 formed at a center position of the cover 440 in the lateral direction and two end protrusions 442 formed respectively in opposite end portions of the cover 440 in the lateral direction. Moreover, the two end protrusions 442 are arranged symmetrically with respect to the center position of the cover 440 in the lateral direction. Each of the protrusions 441 and 442 is formed continuously from one end to the other end of the cover 440 in the longitudinal direction. The height of the central protrusion 441 is greater than the height of the end protrusions 442.

As shown in FIG. 14, on a lower surface side of the cover 440 at the central protrusion 441, there is formed a central recess 441a that is recessed toward the upper surface side of the cover 440. The central recess 441a is formed along the direction in which the central protrusion 441 extends. In the present embodiment, the busbar unit 120 is arranged in the central recess 441a. Specifically, the busbar unit 120 is arranged such that a lateral direction of the cross section of the busbar unit 120 coincides with the height direction of the housing 400. Moreover, the busbar unit 120 is arranged so as not to protrude downward from the recessed space of the central recess 441a.

On the lower surface side of the cover 440 at the end protrusions 442, there are respectively formed end recesses 442a that are recessed toward the upper surface side of the cover 440. The end recesses 442a are formed along the direction in which the end protrusions 442 extend. The depth of the end recesses 442a in the height direction of the cover 440 is greater than the depth of the central recess 441a in the height direction.

Figure 13:
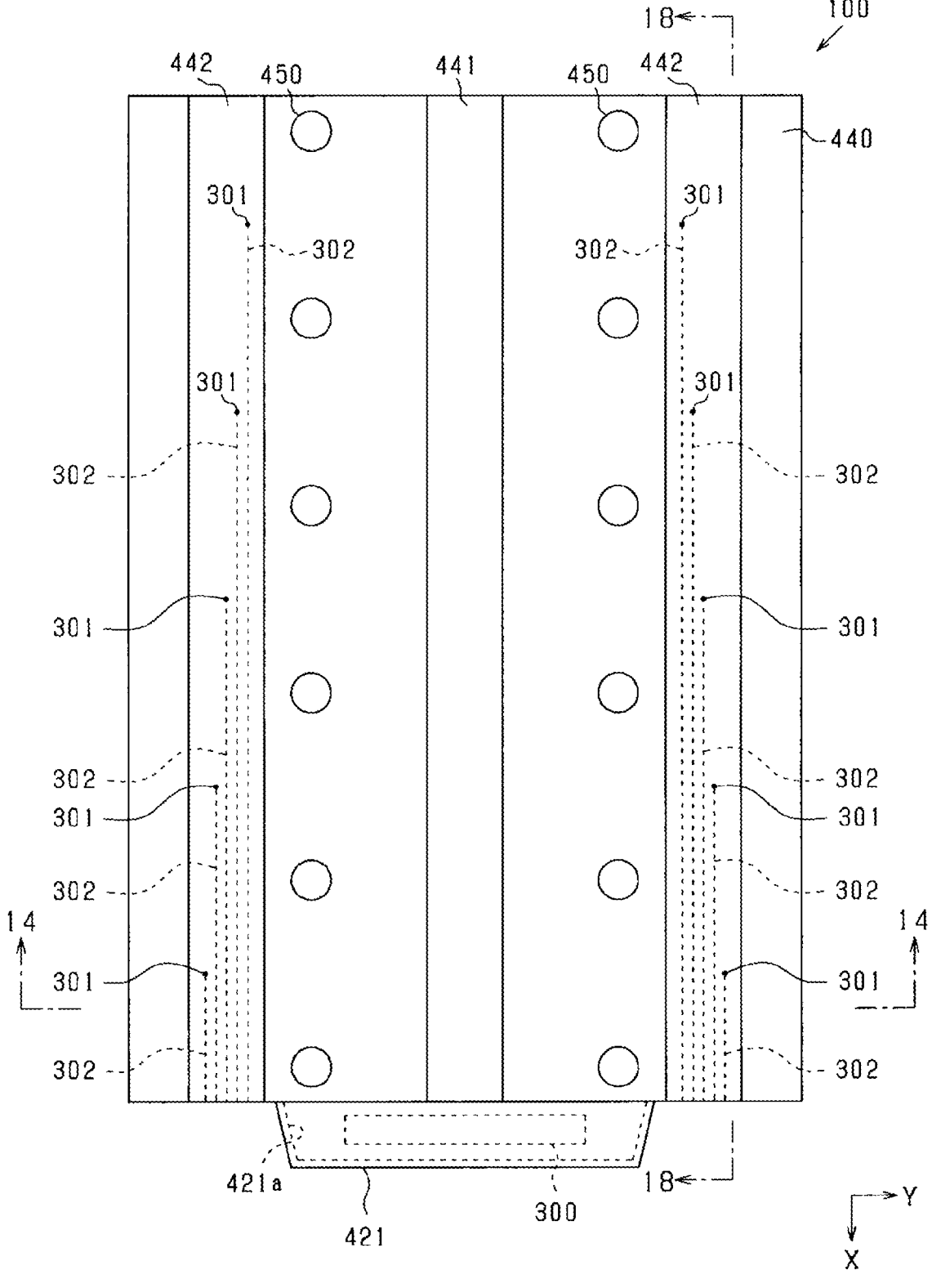
FIG. 13 is a plan view of the battery pack.

As shown in FIGS. 12 to 14, in the cover 440, there are provided a plurality (e.g., six in the figures) of fastening parts 450 for fixing predetermined members to the cover 440. The fastening parts 450 are arranged, in those regions of the cover 440 which are located between the center protrusion 441 and the end protrusions 442, in alignment with each other in the longitudinal direction of the cover 440. Each of the fastening parts 450 includes a larger-diameter portion 450*a* that abuts the upper surface of the cover 440, and a smaller-diameter shaft portion 450*b* that extends downward from the large-diameter portion 450*a* and has a smaller outer diameter than the larger-diameter portion 450*a*. A predetermined member is mounted to the smaller-diameter shaft portion 450*b*, with the larger-diameter portion 450*a* abutting the upper surface of the cover 440 and with the smaller-diameter shaft portion 450*b* inserted in a through-hole formed in the cover 440. The predetermined member may be, for example, a buffer member 460 formed of an elastic material. Moreover, the buffer member 460 may be sandwiched between the cover 440 and one of the battery blocks 110.

In addition, the fastening parts 450 may be provided for fixing the cover 440 to the base part of the housing 400 which is constituted of the bottom plate portion 410 and the wall portions. Moreover, the predetermined member is not limited to the buffer member 460. For example, the predetermined member may alternatively be a busbar extending in the longitudinal direction of the housing 400, a safety plug or a partition wall that partitions adjacent ones of the battery blocks 110. Furthermore, instead of the fastening parts 450, portions may be formed which protrude from the lower surface of the cover 440 to the lower side of the housing 400.

As shown in FIGS. 12 and 13, in a central part of one of the first wall portions 420 in the lateral direction, there is formed a protruding portion 421 that protrudes in the longitudinal direction. In an inner surface of the protruding portion 421, there is formed a recess 421*a* that is recessed outward in the longitudinal direction. In the recess 421*a*, there is arranged a control unit 300. In the present embodiment, the control unit 300 has a flat rectangular parallelepiped shape. The control unit 300 is arranged such that a longitudinal direction of the control unit 300 coincides with the lateral direction of the housing 400.

As shown in FIG. 12, a connector part 422 for electrically connecting the inside and outside of the housing 400 is provided in a central part of the protruding portion 421 in the lateral direction and on the lower side in the height direction. For example, the connector part 422 may electrically connect the assembled battery and the inverter that is arranged outside the housing 400.

Each of the battery monitoring devices 210 includes a monitoring unit 200 and a monitoring-side antenna 201. In the present embodiment, the monitoring unit 200 has a flat rectangular parallelepiped shape. The monitoring unit 200 corresponds to both the monitoring IC 31 and the wireless IC 32 described in the first embodiment. The monitoring-side antenna 201 corresponds to the wireless antenna 33 described in the first embodiment. As shown in FIGS. 15 and 18, for each of the battery blocks 110 that are "monitoring target batteries", there are provided the monitoring unit 200 and monitoring-side antenna 201 of a corresponding one of the battery monitoring devices 210. Moreover, in the present embodiment, the monitoring unit 200 is arranged on an upper surface of the battery block 110 to be monitored by it; and the monitoring-side antenna 201 is arranged on an upper surface of the monitoring unit 200. Therefore, the monitoring units 200 of the battery monitoring devices 210 are arranged in alignment with each other in the longitudinal direction of the housing 400; and the monitoring-side antennas 201 of the battery monitoring devices 210 are also arranged in alignment with each other in the longitudinal direction of the housing 400.

The distance between each adjacent pair of the monitoring units 200 in the longitudinal direction of the housing 400 is shorter than the distance between each adjacent pair of the monitoring units 200 in the lateral direction of the housing 400. Each of the buffer members 460 is arranged between an adjacent pair of the monitoring units 200 in the lateral direction of the housing 400.

Figure 19:
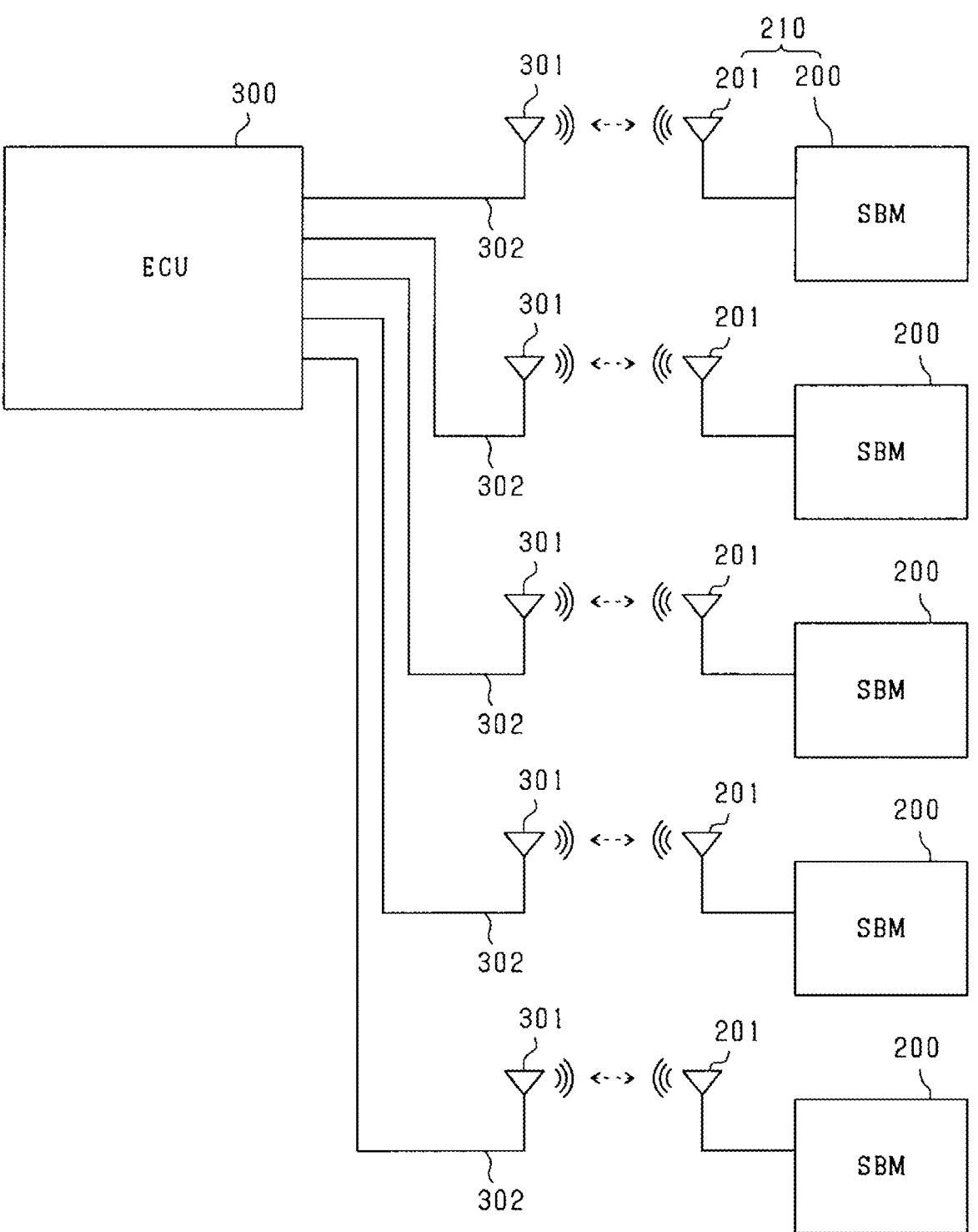
FIG. 19 is a diagram illustrating the configurations of a battery control device and battery monitoring devices.

The battery control device includes a control unit 300, control-side antennas 301 and communication wiring 302. The control unit 300 corresponds to both the battery control MCU 41 and the wireless IC 42 described in the first embodiment. The control-side antennas 301 correspond to the wireless antenna 43 described in the first embodiment. Each of the control-side antennas 301 is provided individually for a corresponding one of the battery blocks 110. Moreover, as shown in FIG. 19, each of the control-side antennas 301 is electrically connected with the control unit 300 by the communication wiring 302. Furthermore, as shown in FIGS. 13 and 18, the control-side antennas 301 are arranged, in the end recesses 442*a*, in alignment with each other in the longitudinal direction of the housing 400. The communication wiring 302 is also provided in the end recesses 442*a*. In addition, the control-side antennas 301 are arranged so as not to protrude downward from the recessed spaces of the end recesses 442*a*. Further, the control-side antennas 301 are arranged so as to be successively offset in the lateral direction of the housing 400.

The monitoring units 200 are arranged such that when the housing 400 is viewed in the thickness direction of the cover 440 (i.e., the Z direction), the monitoring units 200 overlap the corresponding end recesses 442*a*. Moreover, the antennas 201 and 301 are arranged such that when the housing 400 is viewed in the thickness direction of the cover 440 (i.e., the Z direction), the control-side antennas 301 respectively overlap the monitoring-side antennas 201. Consequently, for each of the battery blocks 110, the control-side antenna 301 and the monitoring-side antenna 201 corresponding to the battery block 110 are arranged close to each other. As a result, radio waves can be easily transmitted/received between the control-side antennas 301 and the monitoring-side antennas 201; thus, it becomes possible to improve the quality of wireless communication between the control unit 300 and the monitoring units 200.

According to the present embodiment, it is possible to achieve the following advantageous effects.

The control-side antennas 301 and the communication wiring 302 are arranged in the end recesses 442*a* formed on the lower surface side of the end protrusions 442. Consequently, it becomes possible to effectively utilize the end recesses 442*a*, which are formed integrally in the cover 440 of the housing 400, as the arrangement space of the configuration for performing wireless communication between each monitoring unit 200 and the control unit 300.

The end recesses 442*a* extend in the longitudinal direction of the housing 400. Consequently, it becomes possible to secure sufficient lengths of the communication paths between the monitoring units 200 and the control unit 300.

When radio waves are exchanged between the control-side antennas 301 and the monitoring-side antennas 201, due to reflection of the radio waves in the housing 400, resonance of the radio waves tends to occur, thereby causing noise. In this regard, there are formed the plurality of end recesses 442*a* in the cover 440. Consequently, it becomes possible to realize a structure in which it is difficult for resonance of the radio waves to occur; thus, it becomes possible to improve the quality of wireless communication between the control unit 300 and the monitoring units 200. Moreover, in the present embodiment, the end protrusions 442 are formed on the cover 440; thus, it becomes possible to form the end recesses 442a on the lower surface side of the end protrusions 442.

When the battery packs 100 are viewed in the thickness direction of the cover 440, the monitoring-side antennas 201 are located closer to the corresponding control-side antennas 301 than to the fastening parts 450. Consequently, it becomes difficult for the fastening parts 450 to interfere with radio waves exchanged between the control-side antennas 301 and the monitoring-side antennas 201. As a result, it becomes possible to improve the quality of wireless communication between the control unit 300 and the monitoring units 200.

Modifications of Embodiment A

The present disclosure is not limited to the configuration in which the monitoring units 200 and the monitoring-side antennas 201 are arranged under the corresponding end recesses 442a. For example, the monitoring units 200 and the monitoring-side antennas 201 may alternatively be arranged at positions apart from the positions under the corresponding end recesses 442a by several times the width of the end recesses 442a in a direction perpendicular to both the longitudinal direction of the housing 400 (i.e., the specific direction) and the vertical direction. It should be noted that the vertical direction is perpendicular to, for example, directions in which the plate surfaces of the cover 440 extend. It also should be noted that the width of the end recesses 442a is the dimension of the end recesses 442a in the lateral direction of the housing 400.

Figure 20:
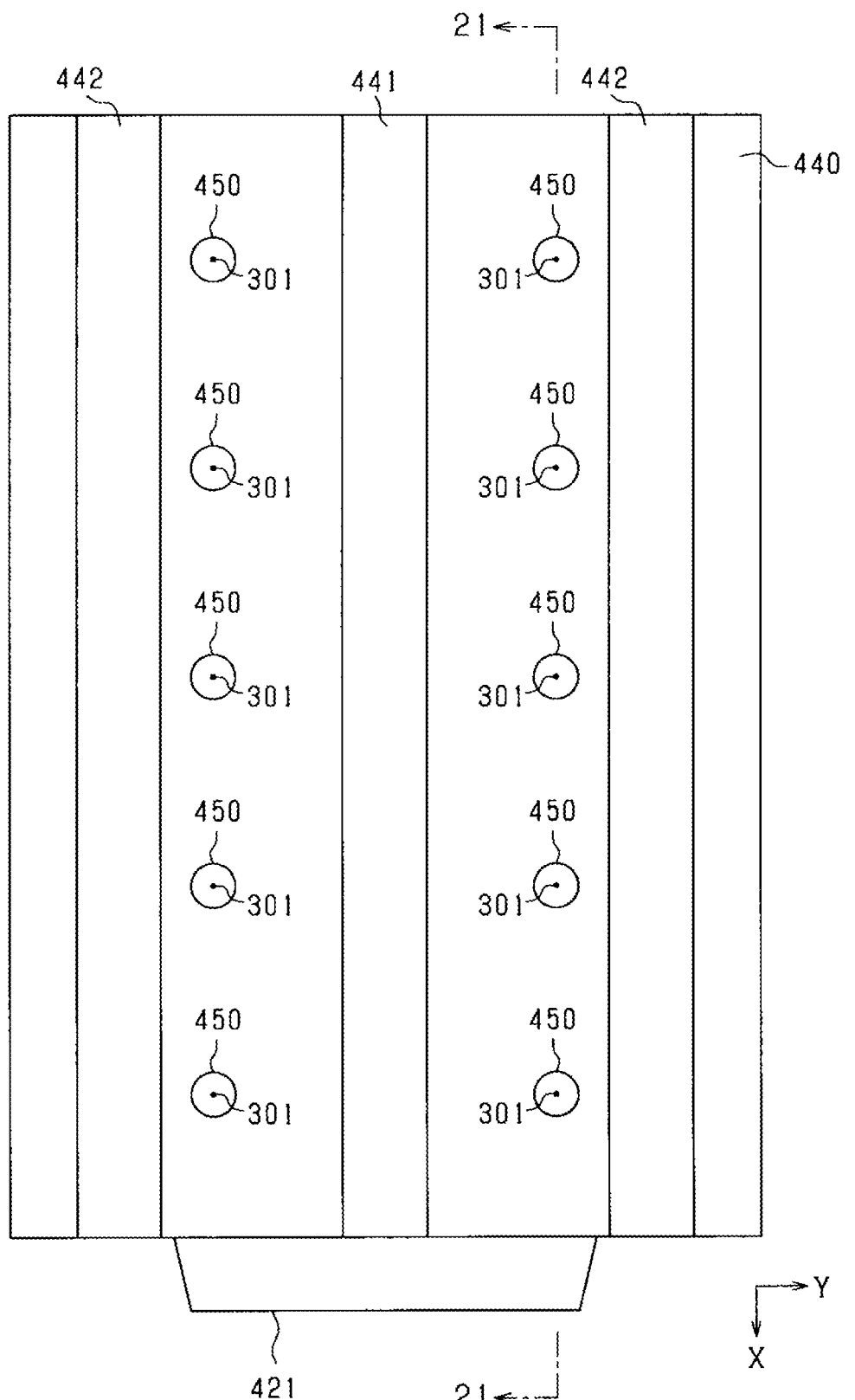
FIG. 20 is a plan view of a battery pack according to a modification of the embodiment A.
Figure 21:
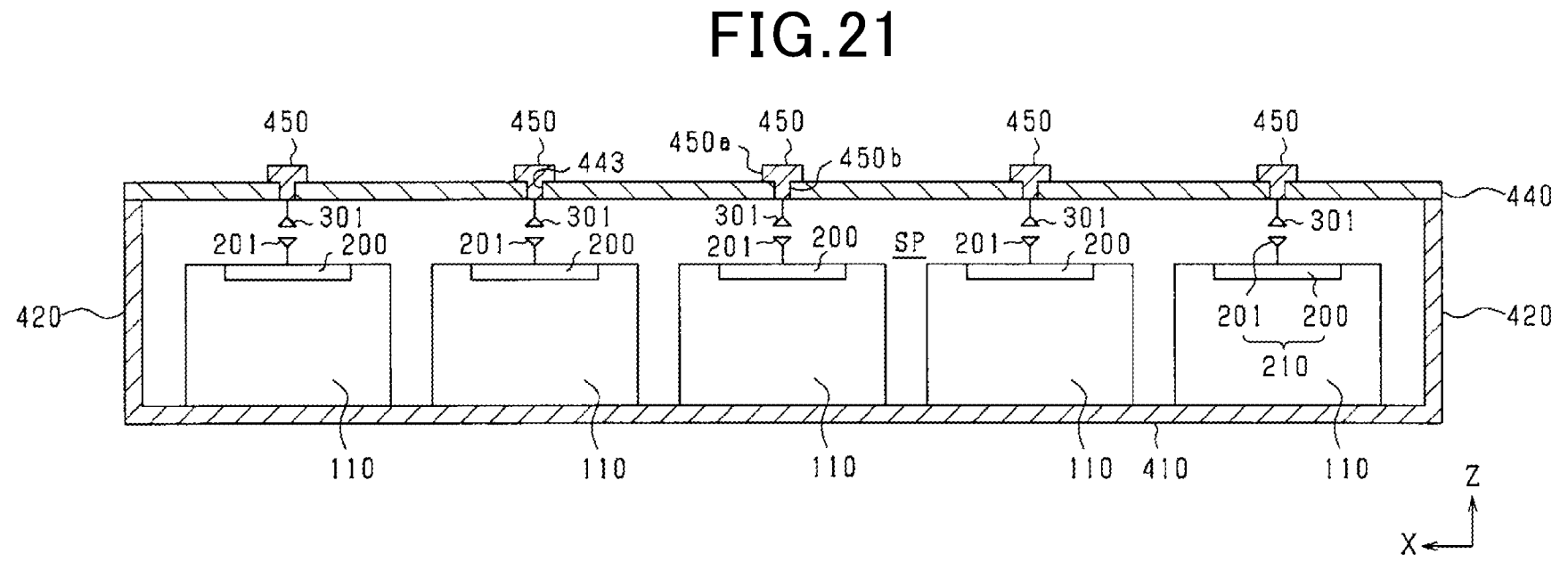

The control-side antennas 301 may alternatively be arranged at positions as shown in FIGS. 20 and 21. Specifically, the control-side antennas 301 may be mounted, by the fastening parts 450 inserted in the through-holes 443 of the cover 440, on the lower surface side of the cover 440. In this case, the monitoring-side antennas 201 may be arranged at positions which, when the battery packs 100 are viewed in the thickness direction of the cover 440, respectively overlap the control-side antennas 301.

Moreover, in this case, the control unit 300 may be arranged outside the housing 400 (e.g., on the upper surface of the cover 440); and the communication wiring 302 connected with the control unit 300 may be connected to the control-side antennas 301 through the inside of the fastening parts 450.

The housing 400 may alternatively be installed in the vehicle such that the lateral direction of the housing 400 having the rectangular parallelepiped shape coincides with the longitudinal direction of the vehicle. In this case, each of the protrusions 441 and 442 would extend in the lateral direction of the housing 400.

The monitoring units 200 may alternatively be arranged such that when the battery packs 100 are viewed in the thickness direction of the cover 440, the monitoring units 200 do not overlap the end recesses 442a.

The communication method between the control unit 300 and the monitoring units 200 is not limited to wireless communication, but may alternatively be wired communication. In this case, the control unit 300 and the monitoring units 200 may be connected by the communication wiring 302; intermediate portions of the communication wiring 302 may be arranged in the end recesses 442a.

The control unit 300 and the control-side antennas 301 may alternatively be arranged in the accommodation space SP such that when the battery packs 100 are viewed in the thickness direction of the cover 440, the control unit 300 and the control-side antennas 301 overlap the corresponding end recesses 442a.

Embodiment B

Figure 22:
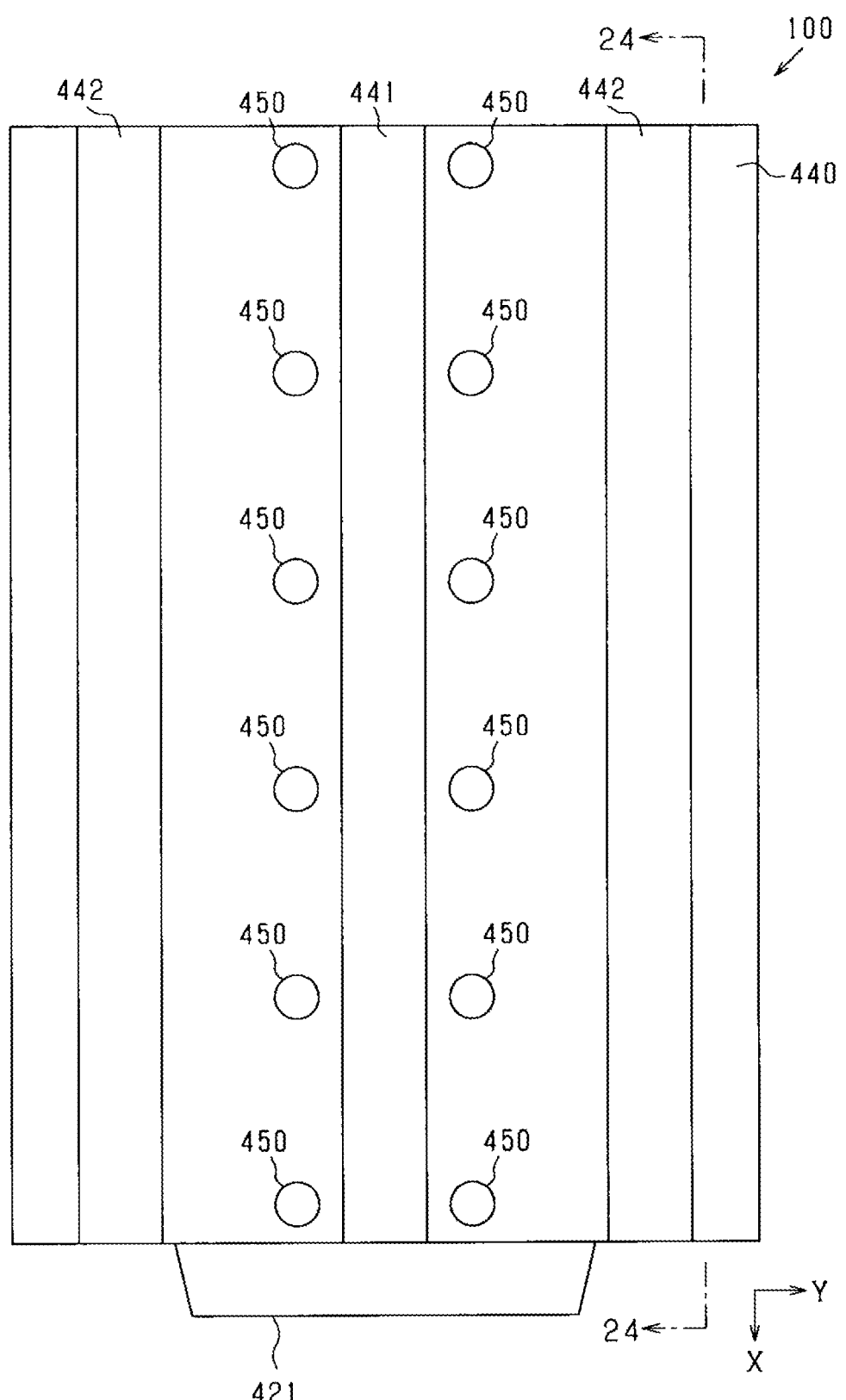
FIG. 22 is a plan view of a battery pack according to an embodiment B.

Hereinafter, an embodiment B will be described with reference to FIGS. 22 to 24, focusing on the differences thereof from the embodiment A. It should be noted that for the sake of convenience, in FIGS. 22 to 24, components identical or corresponding to those described in the embodiment A are designated by the same reference numerals as those described in the embodiment A.

In the present embodiment, the first wall portions 420, second wall portions 430 and bottom plate portion 410 of the housing 400 are formed of a synthetic resin. On the other hand, the cover 440 of the housing 400 is formed of a metal material. Therefore, among the first wall portions 420, the second wall portions 430, the bottom plate portion 410 and the cover 440, only the cover 440 has an electromagnetic shielding effect. The specific gravity of the metal material forming the cover 440 is greater than the specific gravity of the synthetic resin forming the first wall portions 420, the second wall portions 430 and the bottom plate portion 410.

Each of the battery monitoring devices 210 has a flat rectangular parallelepiped shape. As described above, each of the battery monitoring devices 210 may be constituted of, for example, an IC. Moreover, each of the battery monitoring devices 210 is arranged on an upper surface of a corresponding one of the battery blocks 110.

Figure 23:
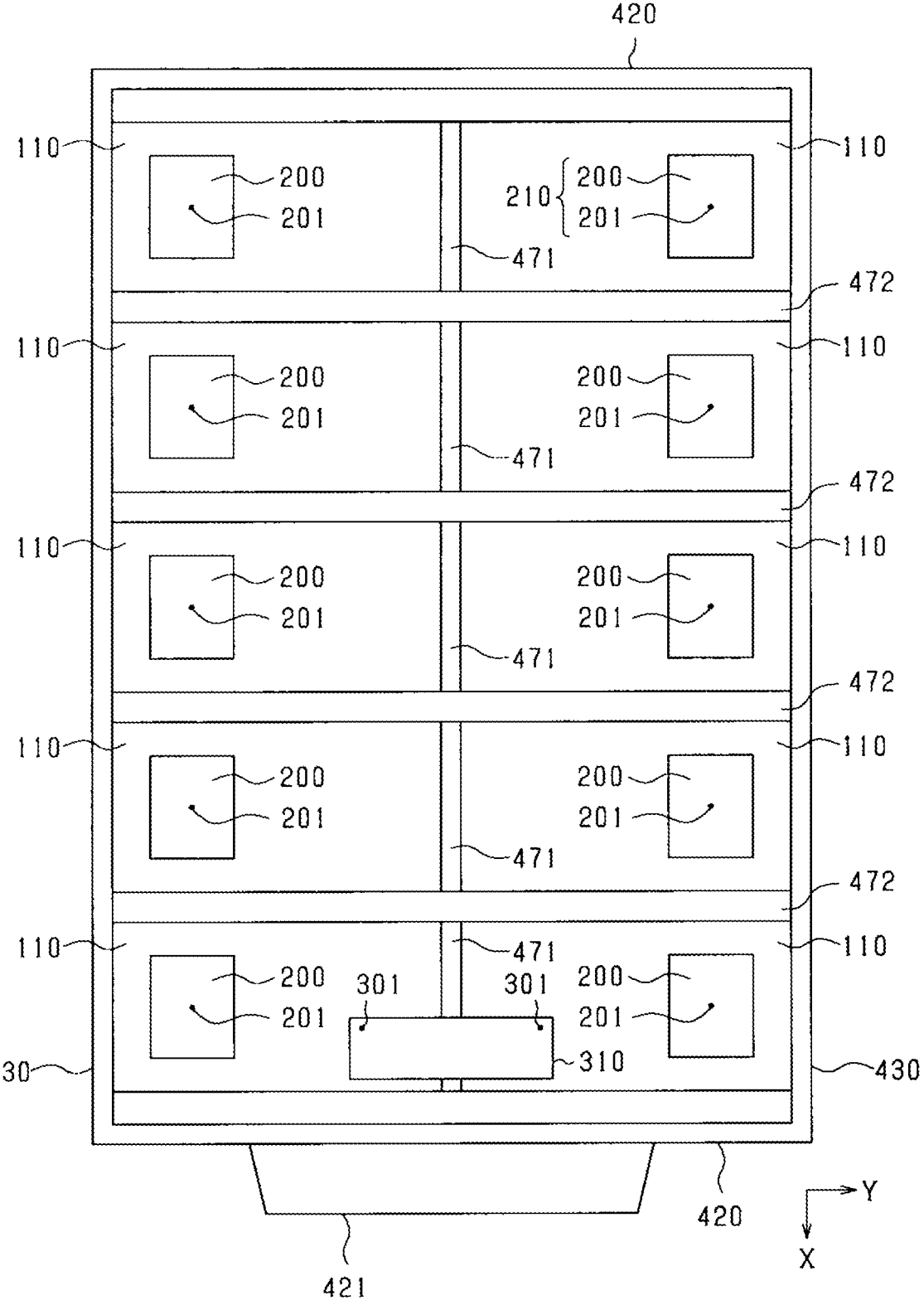
FIG. 23 is a plan view of the battery pack in a state where a cover has been removed therefrom.
Figure 24:
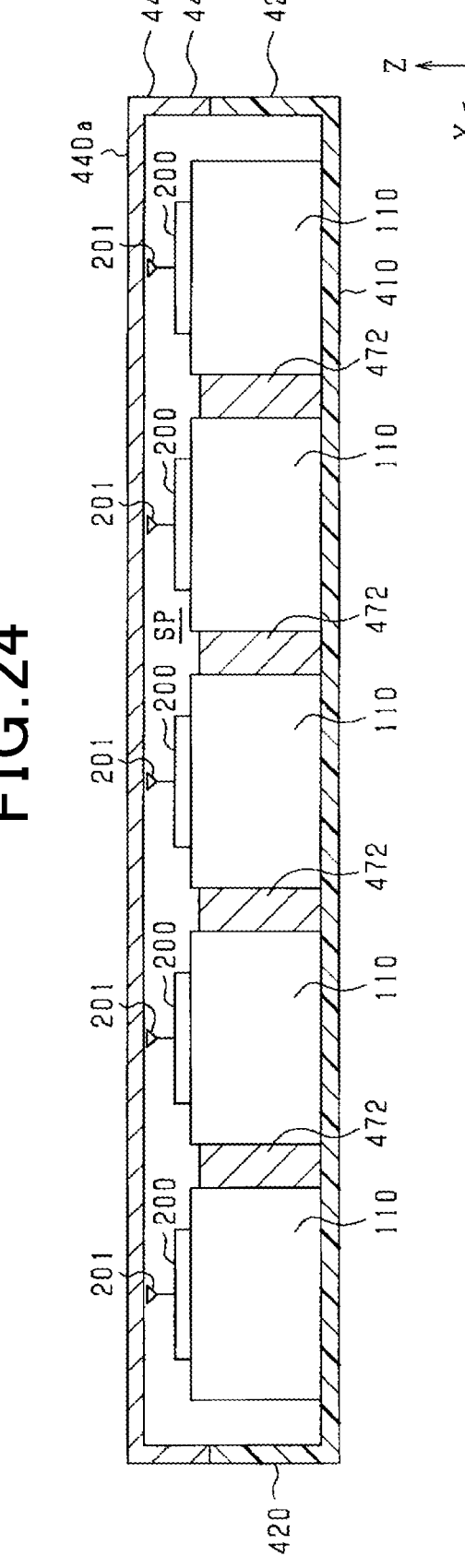
FIG. 24 is a cross-sectional view taken along the line 24-24 in FIG. 22.

As shown in FIGS. 23 and 24, the battery monitoring devices 210 are arranged in the accommodation space SP which consists of a first accommodation space on one side of the lateral center position of the housing 400 and a second accommodation space on the other side of the lateral center position of the housing 400. Specifically, in each of the first accommodation space and the second accommodation space, there are arranged a plurality (e.g., five in the figures) of battery monitoring devices 210 on the second wall portion 430 side in the lateral direction of the housing 400 and in alignment with each other in the longitudinal direction of the housing 400. Moreover, each of the battery monitoring devices 210 is arranged such that its longitudinal direction coincides with the longitudinal direction of the housing 400.

The battery control device 310 has a flat rectangular parallelepiped shape. The battery control device 310 includes a control unit 300 and control-side antennas 301. The battery control device 310 may be constituted of, for example, an IC. Moreover, the battery control device 310 is arranged such that its longitudinal direction coincides with the lateral direction of the housing 400. Specifically, the battery control device 310 is arranged on the upper surfaces of a pair of battery blocks 110 so as to straddle the upper surfaces of the pair of battery blocks 110; the pair of battery blocks 110 are located closest to one of the first wall portions 420 of the housing 400 in the longitudinal direction of the housing 400 among all the battery blocks 110 that are arranged in two rows.

The battery control device 310 includes a plurality (e.g., two in the figures) of control-side antennas 301. The first control-side antenna 301 is arranged on the first accommodation space side in the longitudinal direction of the battery control device 310, whereas the second control-side antenna 301 is arranged on the second accommodation space side in the longitudinal direction of the battery control device 310.

In the accommodation space SP of the housing 400, there are formed first partition wall portions 471 between the battery blocks 110 adjacent to each other in the lateral direction of the housing 400. In the present embodiment, the first partition wall portions 471 extend upward from the bottom plate portion 410 and have a height less than that of the battery blocks 110. Therefore, the upper surfaces of the battery blocks 110 are located higher than the upper ends of the first partition wall portions 471.

Moreover, in the accommodation space SP of the housing 400, there are also formed second partition wall portions 472 between the battery blocks 110 adjacent to each other in the longitudinal direction of the housing 400. In the present embodiment, the second partition wall portions 472 extend upward from the bottom plate portion 410 and have a height less than that of the battery blocks 110. Therefore, the upper surfaces of the battery blocks 110 are located higher than the upper ends of the second partition wall portions 472. In addition, the first partition wall portions 471 and the second partition wall portions 472 may be formed of a synthetic resin, or formed of a metal material.

According to the present embodiment, it is possible to achieve the following advantageous effects.

The end recesses 442a formed on the lower surface side of the end protrusions 442 of the cover 440 can be used as paths for transmitting radio waves. Consequently, even if gaps between the cover 440 and the battery blocks 110 are small, wide spaces for transmitting radio waves can be secured. As a result, transmission of radio waves between the control-side antennas 301 and the monitoring-side antennas 201 can be facilitated.

The end recesses 442a used as the radio wave transmission paths extend, from that one of the pair of first wall portions 420 which is on the opposite side to the protruding portion 421, to the battery control device 310 side in the longitudinal direction of the housing 400. Consequently, communication between the control unit 300 and the monitoring units 200 can be performed more reliably.

The plurality of end recesses 442a are formed in the cover 440. Consequently, it becomes possible to realize a structure in which it is difficult for resonance of radio waves to occur; thus, it becomes possible to improve the quality of wireless communication between the control unit 300 and the monitoring units 200.

The battery control device 310 is arranged near the center position in the lateral direction of the housing 400 in the accommodation space SP of the housing 400. Of the two control-side antennas 301, the first control-side antenna 301 is arranged on the first accommodation space side, whereas the second control-side antenna 301 is arranged on the second accommodation space side. Consequently, it becomes possible to locate the first control-side antenna 301 close to those the monitoring-side antennas 201 which are arranged in the gaps between the cover 440 and the battery blocks 110 in the first accommodation space. Moreover, it also becomes possible to locate the second control-side antenna 301 close to those the monitoring-side antennas 201 which are arranged in the gaps between the cover 440 and the battery blocks 110 in the second accommodation space. As a result, it becomes possible to facilitate transmission of radio waves between the control-side antennas 301 and the monitoring-side antennas 201; thus, it becomes possible to improve the quality of wireless communication between the control unit 300 and the monitoring units 200.

The battery control device 310 includes the plurality of control-side antennas 301. Consequently, even if one (or some) of the plurality of control-side antennas 301 fails, wireless communication can be continued by the remainder of the plurality of control-side antennas 301.

When the battery packs 100 are viewed in the thickness direction of the cover 440, the buffer members 460 extending in the longitudinal direction of the housing 400 and the fastening parts 450 are located in a central part of the housing 400 in the lateral direction or in a region near the central part. With this arrangement, in the accommodation space SP, the spaces between the buffer members 460 and the fastening parts 450 and the second wall portions 430 can be used as wireless communication spaces between the control-side antennas 301 and the monitoring-side antennas 201. Consequently, it becomes difficult for the buffer members 460 and the fastening parts 450 to interfere with radio waves exchanged between the control-side antennas 301 and the monitoring-side antennas 201; thus, it becomes possible to improve the quality of wireless communication between the control unit 300 and the monitoring units 200.

As shown in FIG. 24, the cover 440 has a top plate portion 440a and cover end portions 440b extending downward from a peripheral edge of the top plate portion 440a. The upper surfaces of the battery blocks 110 are located above boundaries between the cover end portions 440b and the wall portions 420 and 430 in the height direction of the housing 400. Consequently, it becomes possible to have the battery monitoring devices 210 interposed between the battery blocks 110 and the cover 440; the battery blocks 110 and the cover 440 have an electromagnetic shielding effect. As a result, even if external radio waves intrude into the housing 400, the external radio waves can be suppressed from reaching the wireless communication spaces. Moreover, since the first wall portions 420, the second wall portions 430 and the bottom plate portion 410 are formed of a synthetic resin, it becomes possible to achieve reduction in the weight of the housing 400.

The upper surfaces of the battery blocks 110, on which the battery monitoring devices 210 are respectively arranged, are located above the upper ends of the second partition wall portions 472. Consequently, it becomes difficult for the second partition walls 472 to interfere with radio waves exchanged between the control-side antennas 301 and the monitoring-side antennas 201; thus, it becomes possible to improve the quality of wireless communication between the control unit 300 and the monitoring units 200.

The buffer members 460 that may interfere with radio waves are arranged in a central part of the accommodation space SP of the housing 400 in the lateral direction. On the other hands, in the accommodation space SP, spaces on both sides of the buffer members 460 in the lateral direction can be used as wireless communication spaces between the control-side antennas 301 and the monitoring-side antennas 201. Consequently, it becomes difficult for the buffer members 460 to interfere with radio waves exchanged between the control-side antennas 301 and the monitoring-side antennas 201; thus, it becomes possible to improve the quality of wireless communication between the control unit 300 and the monitoring units 200.

Modifications of Embodiment B

The control unit 300 may be arranged near the center position in the longitudinal direction of the housing 400.

A seal member for sealing the housing 400 may be provided at the boundaries between the cover end portions 440*b* and the wall portions 420 and 430. Moreover, a shield material (e.g., a metal material) capable of blocking or absorbing radio waves may be provided so as to cover the seal member.

Embodiment C

Figure 25:
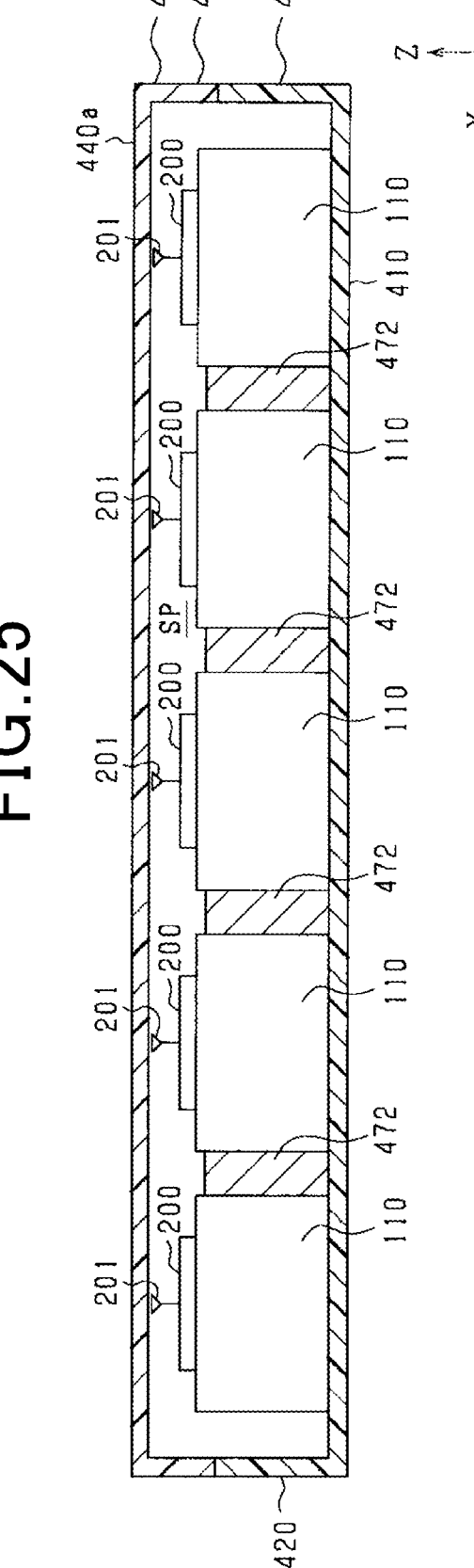
FIG. 25 is a cross-sectional view of a battery pack according to an embodiment C.
Figure 26:
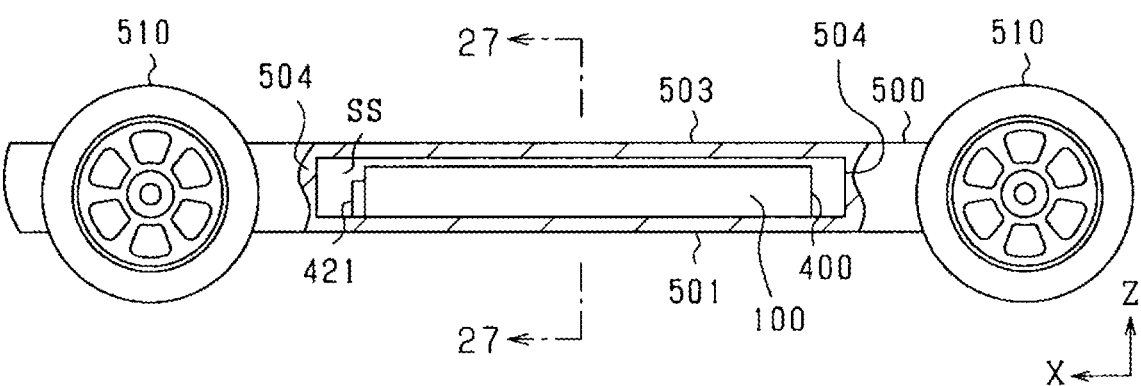
FIG. 26 is a diagram illustrating a manner of arranging the battery pack in an accommodation space within a chassis of a vehicle.
Figure 27:
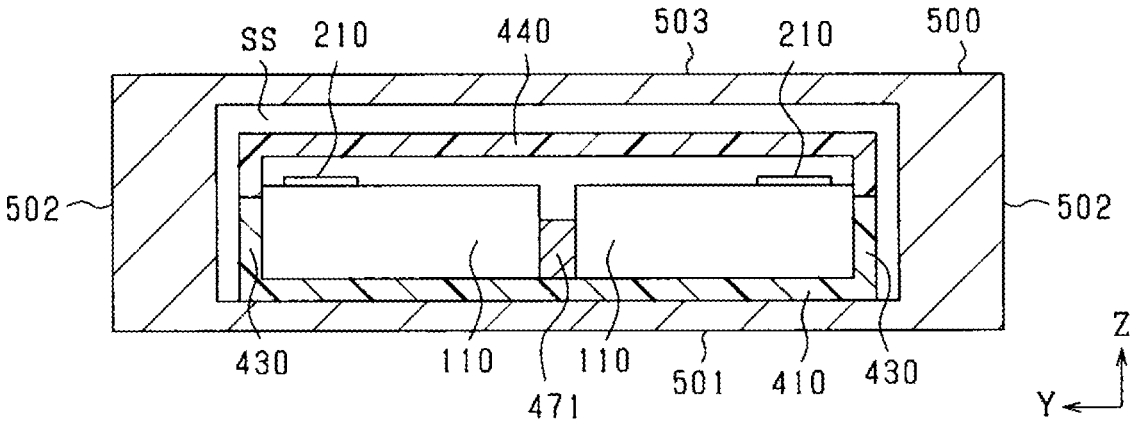
FIG. 27 is a cross-sectional view taken along the line 27-27 in FIG. 26.

Hereinafter, an embodiment C will be described with reference to FIGS. 25 to 27, focusing on the differences thereof from the embodiment B. It should be noted that for the sake of convenience, in FIGS. 25 to 27, components identical or corresponding to those described in the embodiment B are designated by the same reference numerals as those described in the embodiment B. In addition, FIG. 25 is a diagram corresponding to a cross-sectional view taken along the line 24-24 in FIG. 22.

In the present embodiment, in addition to the first wall portions 420, the second wall portions 430 and the bottom plate portion 410, the cover 440 is also formed of a synthetic resin.

The installation position of the battery pack 100 in the vehicle will be described with reference to FIGS. 26 and 27.

The vehicle includes a chassis 500 formed of a metal material as a body of the vehicle, and wheels 510. The chassis 500 includes a chassis bottom plate portion 501 extending in the longitudinal direction of the vehicle, side plate portions 502, a chassis top plate portion 503, and end plate portions 504. The side plate portions 502 extend upward respectively from opposite end portions of the chassis bottom plate portion 501 in the lateral direction of the vehicle. The chassis top plate portion 503 covers the side plate portions 502 from above. The end plate portions 504 respectively cover opposite end portions of the chassis bottom plate portion 501 in the longitudinal direction of the vehicle, opposite end portions of each of the side plate portions 502 in the longitudinal direction of the vehicle, and opposite end portions of the chassis top plate portion 503 in the longitudinal direction of the vehicle. Consequently, an accommodation space SS is formed within the chassis 500.

The battery pack 100 is arranged in the accommodation space SS within the chassis 500. Specifically, the bottom plate portion 410 of the housing 400 is arranged on the chassis bottom plate portion 501. On the other hand, a gap is formed between the chassis top plate portion 503 and the cover 440 of the housing 400.

The cover 440 is formed of a synthetic resin that has no electromagnetic shielding effect. Therefore, radio waves transmitted from the monitoring-side antennas 201 or the control-side antennas 301 pass through the cover 440. However, the radio waves can be suppressed from leaking externally by the chassis 500 formed of a metal material. Moreover, intrusion of external radio waves into the housing 400 can also be suppressed by the chassis 500. As above, according to the present embodiment, it becomes possible to suppress external leakage of radio waves and intrusion of external radio waves into the housing 400 while effectively utilizing the gap formed between the chassis top plate portion 503 and the cover 440 of the housing 400 as a wireless communication space.

The chassis bottom plate 501 of the chassis 500 is formed thicker than the bottom plate 410 of the housing 400. The side plate portions 502 of the chassis 500 are formed thicker than the first wall portions 420 and second wall portions 430 of the housing 400. The chassis top plate portion 503 of the chassis 500 is formed thicker than the cover 440 of the housing 400. Consequently, it becomes possible to more effectively suppress external leakage of radio waves and intrusion of external radio waves into the housing 400 as compared with the case of suppressing the same by the housing 400.

Modifications of Embodiment C

The mobile object in which the battery pack is installed is not limited to a vehicle, but may alternatively be, for example, an aircraft or a ship.

Of the cover 440, the first wall portions 420, the second wall portions 430 and the bottom plate portion 410, only one, only two or only three components may be formed of a synthetic resin.

Embodiment D

Figure 28:
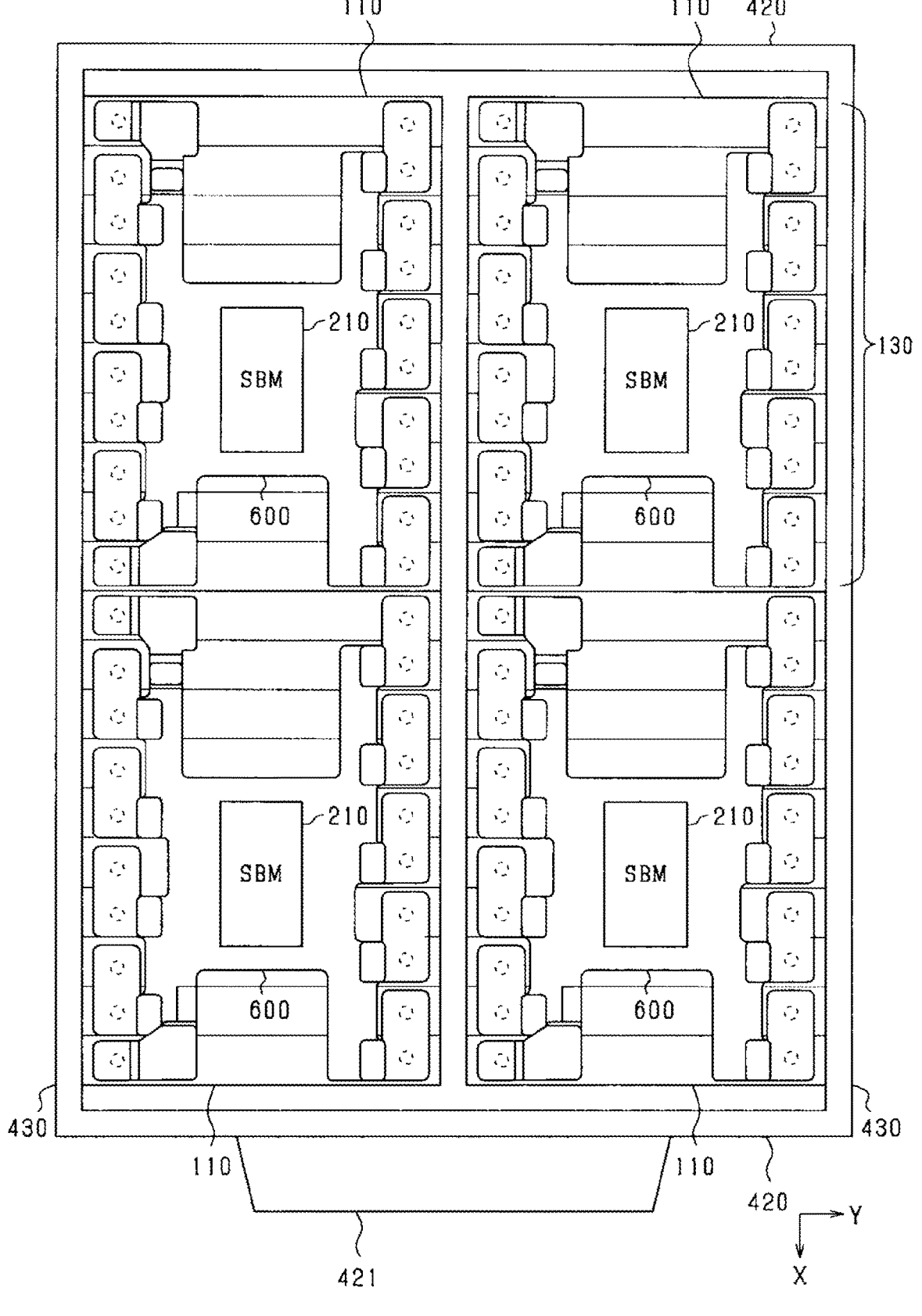
FIG. 28 is a plan view of a battery pack according to an embodiment D in a state where a cover has been removed therefrom.
Figure 29:
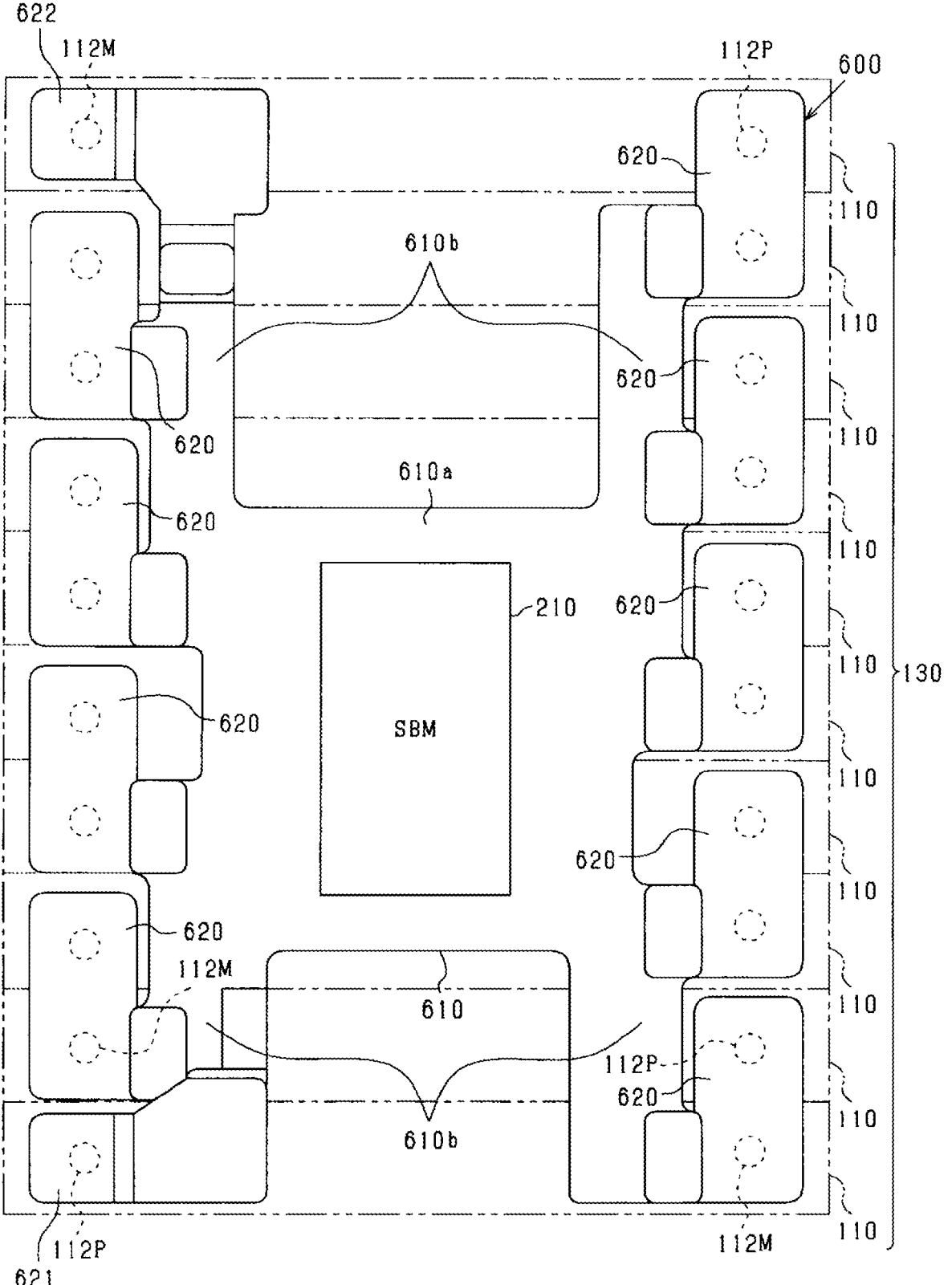
FIG. 29 is a plan view of a connection module.

Hereinafter, an embodiment D will be described with reference to FIGS. 28 and 29, focusing on the differences thereof from the embodiment B. It should be noted that for the sake of convenience, in FIGS. 28 and 29, components identical or corresponding to those described in the embodiment B are designated by the same reference numerals as those described in the embodiment B.

In the present embodiment, each of the battery blocks 110 is arranged such that its longitudinal direction coincides with the lateral direction of the housing 400. The battery blocks 110 are arranged in two rows in the lateral direction of the housing 400. In the example shown in FIG. 28, in each row, twenty battery blocks 110 are arrange side by side in the lateral direction of the housing 400.

Each of the battery blocks 110 has a positive-electrode terminal 112P provided on a first end portion of its upper surface in its longitudinal direction and a negative-electrode terminal 112M provided on a second end portion of its upper surface in its longitudinal direction. Moreover, for each pair of the battery blocks 110 adjacent to each other in the longitudinal direction of the housing 400, the positive-electrode terminal 112P of one of the pair of the battery blocks 110 and the negative-electrode terminal 112M of the other of the pair of the battery blocks 110 are arranged to face each other in the longitudinal direction of the housing 400.

In the present embodiment, the plurality of battery blocks 110 accommodated in the housing 400 are divided into four groups. The ten battery blocks 110 of the same group together constitute a monitoring target battery 130. The battery pack 100 includes connection modules 600 each corresponding to one of the monitoring target batteries 130. Each of the connection modules 600 includes electroconductive members 620 to 622 that connect the battery blocks 110 constituting the corresponding monitoring target battery 130 in series with each other, and a battery monitoring device 210 that monitors the states of the battery blocks 110 constituting the corresponding monitoring target battery 130.

Next, the configuration of the connection modules 600 will be described in detail with reference to FIG. 29.

Each of the connection modules 600 includes a substrate part 610. The substrate part 610 is arranged above the corresponding monitoring target battery 130. The substrate part 610 is formed of, for example, a synthetic resin. The substrate part 610 includes a center plate portion 610*a* and mounting plate portions 610*b* extending from both ends of the center plate portion 610*a* in the longitudinal direction of the housing 400. The battery monitoring device 210 is arranged on an upper surface of the center plate portion 610*a*. On the mounting plate portions 610*b*, there are provided intermediate electroconductive members 620 each of which connects a pair of the positive-electrode and negative-electrode terminals 112P and 112M of the battery blocks 110 adjacent to each other in the longitudinal direction of the housing 400. Moreover, to the positive-electrode terminal 112P of the highest-potential battery block 110 in the battery blocks 110 constituting the corresponding monitoring target battery 130, there is connected a first end electroconductive member 621 that is provided on one of the mounting plate portions 610*b*. On the other hand, to the negative-electrode terminal 112M of the lowest-potential battery block 110 in the battery blocks 110 constituting the corresponding monitoring target battery 130, there is connected a second end electroconductive member 622 that is provided on another of the mounting plate portions 610*b*. Furthermore, for each adjacent pair of the monitoring target batteries 130, the first end electroconductive member 621 corresponding to one of the pair of the monitoring target batteries 130 and the second end electroconductive member 622 corresponding to the other of the pair of the monitoring target batteries 130 are electrically connected with each other; consequently, all of the four monitoring target batteries 130 are connected in series with each other.

According to the present embodiment described above, the electroconductive members 620 to 622 are arranged in a row in each of two lateral end parts of the accommodation space SP of the housing 400, and arranged in two rows in a lateral central part of the accommodation space SP. Moreover, in those parts of the accommodation space SP which are located between the rows of the electroconductive members 620 to 622 aligned in the longitudinal direction of the housing 400, the battery monitoring devices 210 are arranged in alignment with each other in the longitudinal direction of the housing 400. In addition, the electroconductive members 620 to 622 connected to the two monitoring target batteries 130 arranged in that half of the accommodation space SP which is located on one side of the lateral center of the housing 400 correspond to "first electroconductive members". In contrast, the electroconductive members 620 to 622 connected to the two monitoring target batteries 130 arranged in that half of the accommodation space SP which is located on the other side of the lateral center of the housing 400 correspond to "second electroconductive members".

In the above arrangement, as shown in FIGS. 13 and 18 of the embodiment A, the control-side antennas 301 are arranged, in the end recesses 442*a*, in alignment with each other in the longitudinal direction of the housing 400. Moreover, the battery monitoring devices 210 are arranged such that when the housing 400 is viewed in the thickness direction of the cover 440, the battery monitoring devices 210 overlap the corresponding end recesses 442*a*. Consequently, it becomes possible to facilitate transmission of radio waves between the control-side antennas 3001 and the monitoring-side antennas 201; thus, it becomes possible to improve the quality of wireless communication between the control unit 300 and the monitoring units 200.

Figure 30:
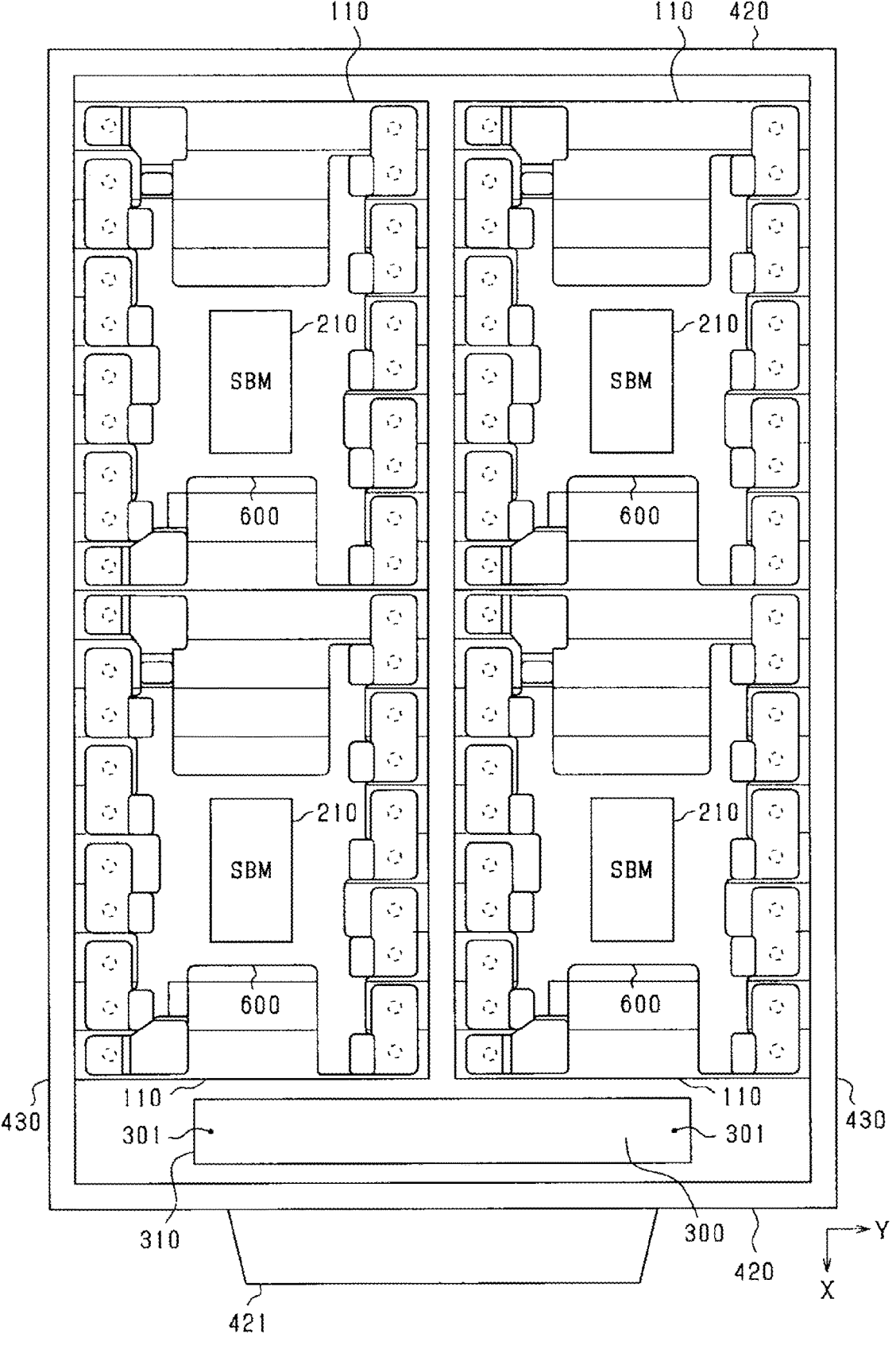
FIG. 30 is a plan view of a battery pack according to a modification of the embodiment D in a state where a cover has been removed therefrom.

In addition, instead of the configuration shown in FIGS. 13 and 18 of the embodiment A, a configuration may be employed in which the battery control device 310 is arranged, as shown in FIG. 30, at the center position in the lateral direction of the housing 400 in the accommodation space SP of the housing 400. In this case, those parts of the accommodation space SP which are located between the rows of the electroconductive members 620 to 622 aligned in the longitudinal direction of the housing 400 can be used as wireless communication spaces between the control-side antennas 301 and the monitoring-side antennas 201. When the electroconductive members 620 to 622 are arranged such that they at least partially overlap the battery monitoring devices 210 in the height direction of the housing 400, the electroconductive members 620 to 622 may become obstacles to radio waves. For such an arrangement of the electroconductive members 620 to 622, the above configuration is particularly useful in which: those parts of the accommodation space SP which are located between the rows of the electroconductive members 620 to 622 aligned in the longitudinal direction of the housing 400 are used as wireless communication spaces; and the battery control device 310 is arranged at the center position in the lateral direction of the housing 400 in the accommodation space SP of the housing 400.

Embodiment E

Figure 31:
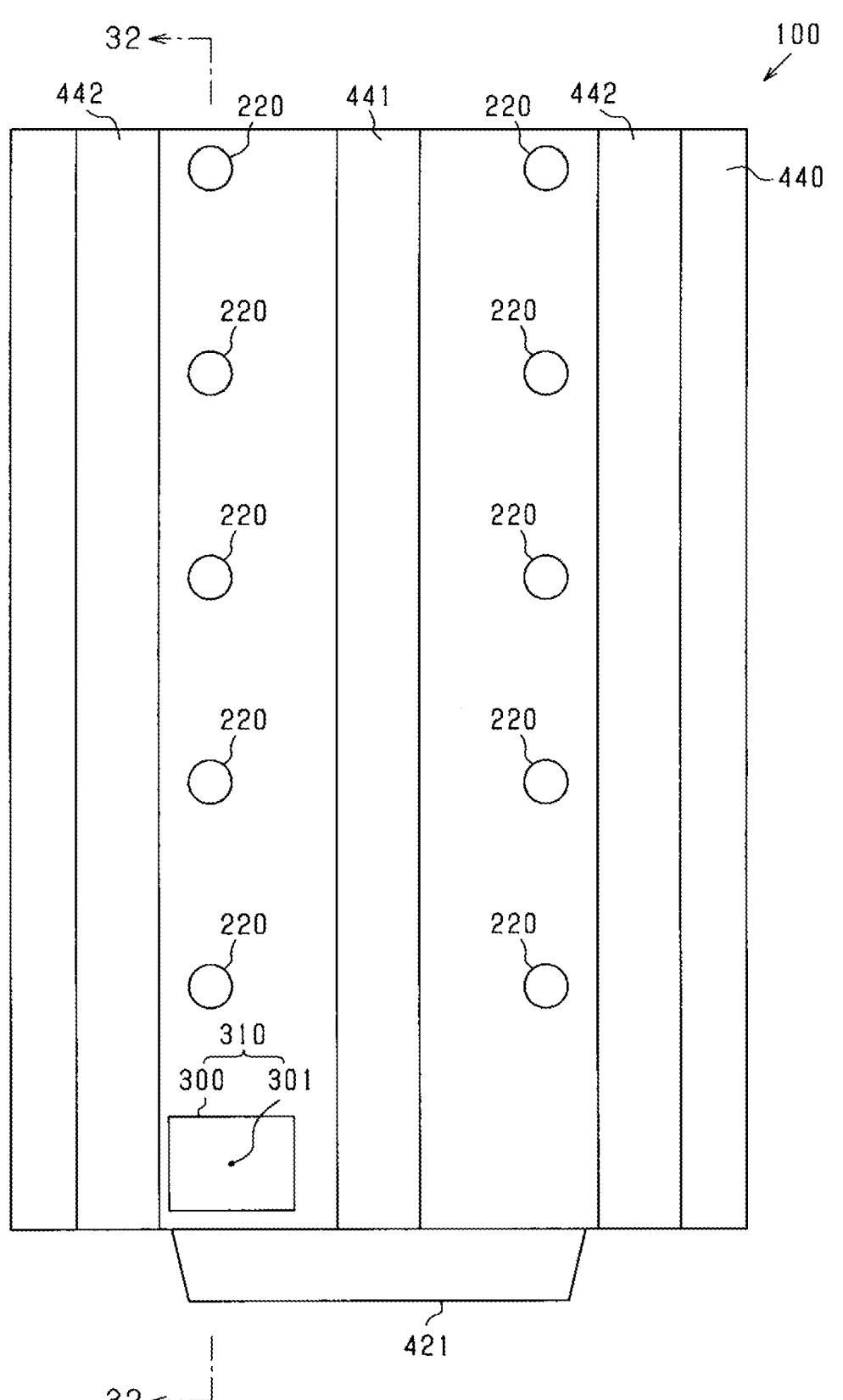
FIG. 31 is a plan view of a battery pack according to an embodiment E.

Hereinafter, an embodiment E will be described with reference to FIGS. 31 and 32, focusing on the differences thereof from the embodiment C. It should be noted that for the sake of convenience, in FIGS. 31 and 32, components identical or corresponding to those described in the embodiment C are designated by the same reference numerals as those described in the embodiment C.

In the present embodiment, the battery control device 310 is arranged on the upper surface of the cover 440. Specifically, the battery control device 310 is arranged on an area of the upper surface of the cover 440 between the central protrusion 441 and one of the end protrusions 442. Moreover, the battery control device 310 is arranged closer to an end than to the center of the upper surface of the cover 440 in the longitudinal direction of the housing 400 (i.e., the specific direction). More particularly, in the example shown in FIG. 31, the battery control device 310 is arranged on an end portion of the upper surface of the cover 440 in the longitudinal direction of the housing 400.

The configuration in which the battery control device 310 is arranged on the upper surface of the cover 440 is a configuration for achieving reduction in the size of the housing 400. That is, the size of the housing 400 can be reduced by arranging the battery control device 310 outside the housing 400, not inside the housing 400. For example, portions of the housing 400, such as the protruding portion 421 shown in FIG. 12, can be eliminated or reduced in size. As a result, the installability of the housing 400 to the vehicle can be further improved. Moreover, since the battery control device 310 is arranged outside the housing 400, it becomes possible to secure the degree of freedom in the installation of the battery control device 310, such as becoming possible to arrange the battery control device 310 in a limited space in the vehicle.

In the present embodiment, the cover 440, the first wall portions 420, the second wall portions 430 and the bottom plate portion 410 are formed of a metal material. In this case, for performing communication between the monitoring units 200 accommodated in the accommodation space SP of the housing 400 and the control unit 300 arranged outside the housing 400, it is necessary to communicably connect the inside and outside of the housing 400.

The battery pack 100 according to the present embodiment includes relay devices 220 for communicably connecting the inside and outside of the housing 400. Each of the relay devices 220 includes an antenna 220*a* located on the upper surface side of the cover 440, and a shaft portion 220*b* extending downward from the antenna 220*a* and having a smaller outer diameter than the antenna 220*a*. In the cover 440, there are formed through-holes 441 through which the shaft portions 220*b* of the relay devices 220 are respectively inserted into the housing 440. Specifically, in the present embodiment, the through-holes 441 are formed, in those regions of the cover 440 which are located between the center protrusion 441 and the end protrusions 442, in alignment with each other in the longitudinal direction of the cover 440. Each of the relay devices 220 is arranged such that the antenna 220*a* is located on the upper surface side of the cover 440 and the shaft portion 220*b* is inserted in a corresponding one of the through-holes 441 formed in the cover 440. Moreover, each of the relay devices 220 is provided individually for a corresponding one of the monitoring units 200. In addition, each of the antennas 220*a* of the relay devices 220 may be covered with a cover that can transmit radio waves.

The through-holes 441 are closed by the corresponding antennas 220*a* of the relay devices 220. In addition, seal members may be interposed between the antennas 220*a* of the relay devices 220 and the upper surface of the cover 440.

Figure 32:
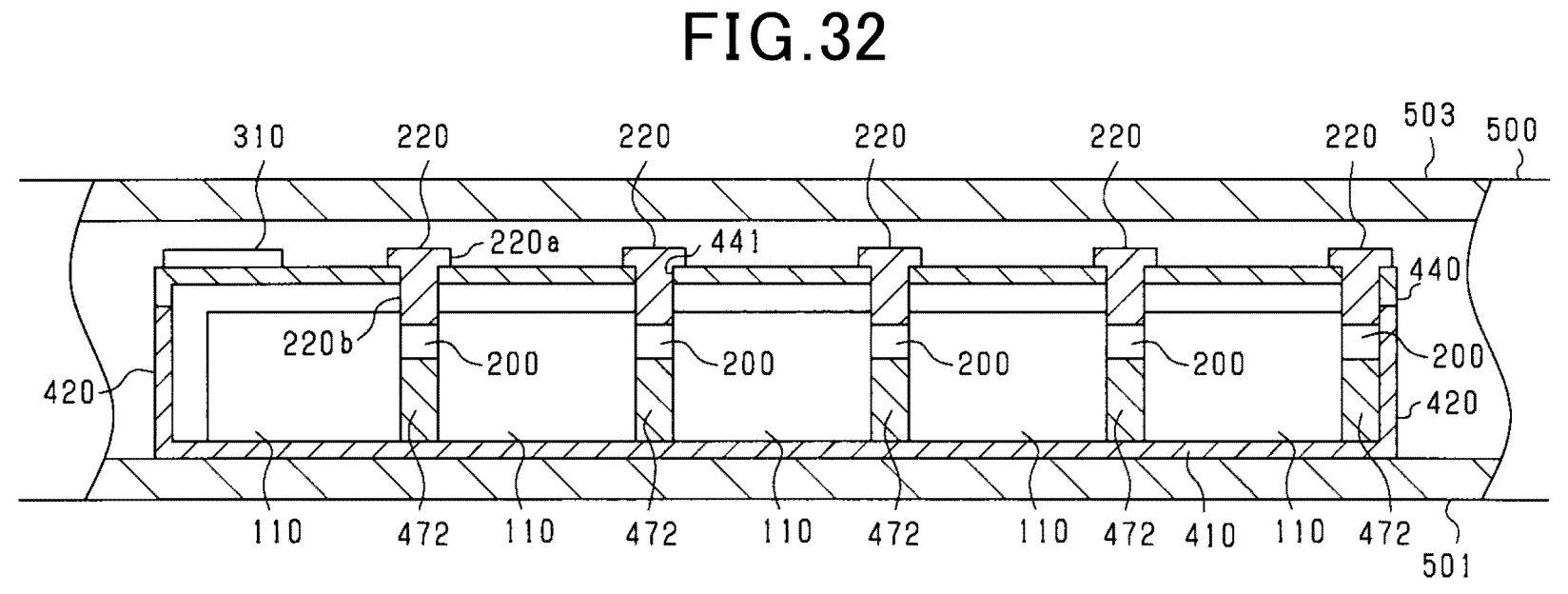

As shown in FIG. 32, each of the monitoring units 200 is arranged in a gap between a pair of the battery blocks 110 adjacent to each other in the longitudinal direction of the housing 400. Moreover, each of the monitoring units 200 is arranged on the upper end of a corresponding one of the second partition wall portions 472. With the above arrangement of the monitoring units 200, it becomes possible to effectively use the internal space of the housing 400.

When the housing 400 is viewed in the thickness direction of the cover 440, the shaft portion 220*b* of each of the relay devices 220 is located at a position overlapping a corresponding one of the second partition wall portions 472. Moreover, the shaft portion 220*b* extends into a gap between a pair of the battery blocks 110 adjacent to each other in the longitudinal direction of the housing 400. Furthermore, the shaft portion 220*b* abuts the adjacent pair of the battery blocks 110, thereby making it possible to properly support the relay device 220. It should be noted that the shaft portion 220*b* may alternatively be arranged so as not to abut the adjacent pair of the battery blocks 110.

In the present embodiment, all of the extending direction of the central protrusion 441 in which the central recess 441*a* is formed, the extending directions of the end protrusions 442 and the alignment direction of the relay devices 220 coincide with the longitudinal direction of the housing 400. Consequently, it becomes possible to secure the central recess 441*a* as an arrangement space of the busbar unit 120 while securing wireless communication paths in the longitudinal direction of the housing 400.

The monitoring units 200 are electrically connected with the corresponding antennas 220*a* by communication wirings provided in the corresponding shaft portions 220*b*. Consequently, it becomes possible to perform wireless communication between the monitoring units 200 and the control unit 300 via the antennas 220*a* and the control-side antenna 301.

Moreover, in the present embodiment, it is possible to suppress external leakage of radio waves and intrusion of external radio waves into the housing 400 while effectively utilizing the gap formed between the chassis top plate portion 503 and the cover 440 of the housing 400 as a wireless communication space, as in the third embodiment.

In the present embodiment, the lower ends of the shaft portions 220*b* of the relay devices 220 are located respectively in the gaps between the battery blocks 110 adjacent to each other in the longitudinal direction of the housing 400.

Consequently, it becomes easy to connect the monitoring units 200 to the communication wirings of the corresponding relay devices 220.

Modifications of Embodiment E

The battery control device 310 may be arranged outside the housing 400, but not on the surface of the housing 400. For example, the battery control device 310 may be arranged in the accommodation space SS within the chassis 500 so as to be on an extension line of the central protrusion 441.

Figure 33:
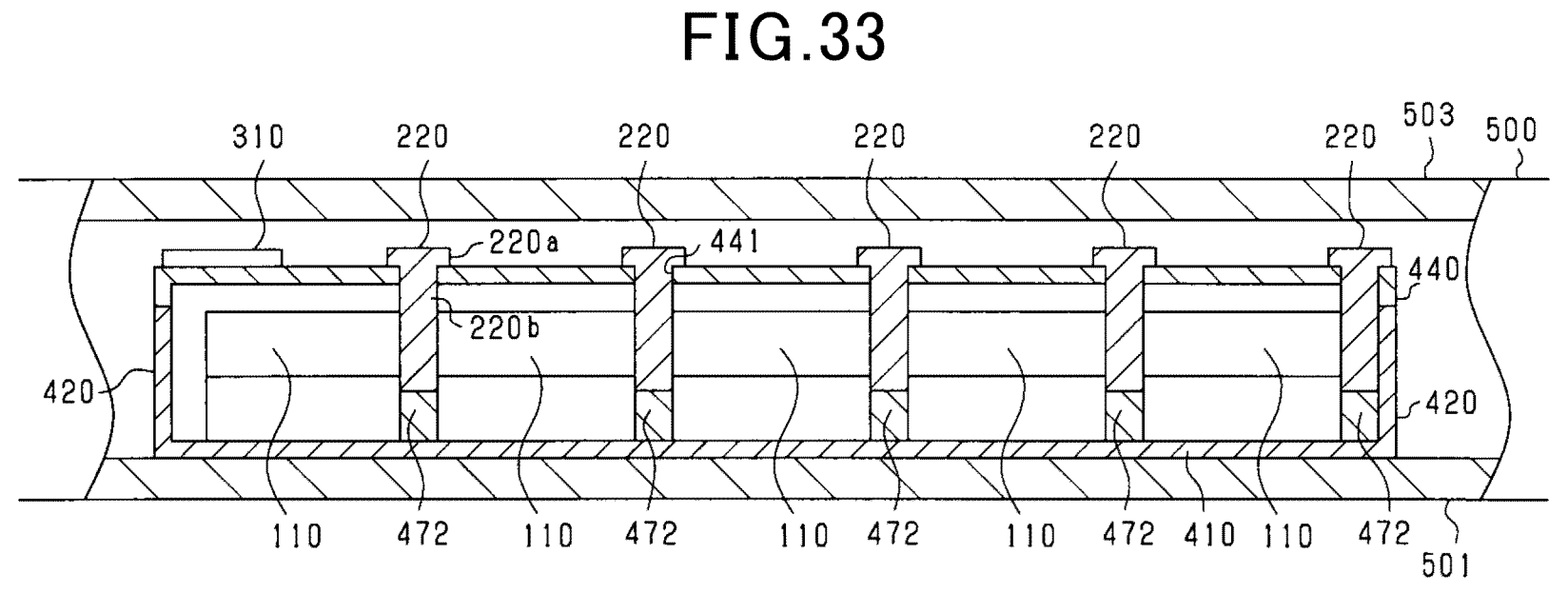

As shown in FIG. 33, the battery blocks 110 may be stacked in the height direction of the housing 400. In the example shown in FIG. 33, every two battery blocks 110 are stacked in the height direction of the housing 400. In this case, the monitoring units 200 may be arranged respectively in the gaps between the battery blocks 110 adjacent to each other in the longitudinal direction of the housing 400; and every two battery blocks 110 stacked in the height direction of the housing 400 are monitored respectively by corresponding two of the monitoring units 200. Moreover, the two monitoring units 200 respectively corresponding to two battery blocks 110 stacked in the height direction of the housing 400 may perform wireless communication with the control-side antenna 301 via a common relay device 220, or via two relay devices 220 provided respectively for the two monitoring units 200.

Moreover, the arrangement location of the monitoring units 200 is not limited to the gaps described above. Alternatively, each of the monitoring units 200 may be built in one of the battery blocks 110 which is to be monitored by the monitoring unit 200. In this case, as shown in FIG. 33, the lower ends of the shaft portions 220*b* of the relay devices 220 may be located respectively in the gaps between those battery blocks 110 which are located at the lowest layer in all the battery blocks 110 stacked in groups in the height direction of the housing 400. Consequently, it would become possible to properly connect the monitoring units 220 that monitor the battery blocks 110 located at the lowest layer with the corresponding antennas 220*a* by the communication wirings provided in the corresponding shaft portions 220*b*.

The through-holes through which the relay devices 220 are respectively inserted into the housing 400 may be formed in any of the wall portions 420 and 430 instead of in the cover 440. In other words, the relay devices 220 may be provided in any of the wall portions 420 and 430 of the housing 400.

Embodiment F

Figure 34:
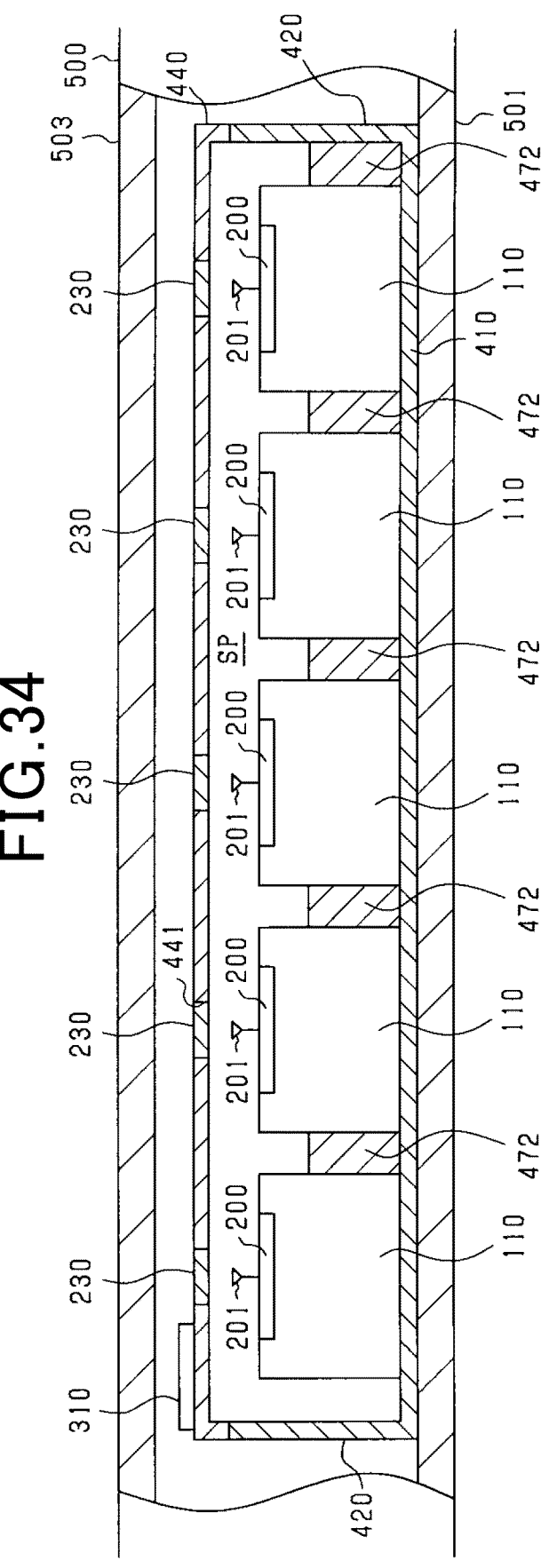
FIG. 34 is a cross-sectional view of a battery pack according to an embodiment F.

Hereinafter, an embodiment F will be described with reference to FIG. 34, focusing on the differences thereof from the embodiment E. It should be noted that for the sake of convenience, FIG. 34, components identical or corresponding to those described in the embodiment E are designated by the same reference numerals as those described in the embodiment E.

In the present embodiment, each of the battery monitoring devices 210 is arranged on the upper surface of a corresponding one of the battery blocks 110, as in the embodiment A. In addition, the battery monitoring devices 210 may be arranged such that when the housing 400 is viewed in the thickness direction of the cover 440, each of the battery monitoring devices 210 overlaps a corresponding one of through-holes 441 formed in the cover 440.

In each of the through-holes 441, there is provided a corresponding one of relay devices 230 so as to close the through-hole 441. In the present embodiment, each of the relay devices 230 is implemented by a dielectric antenna.

In the present embodiment, radio waves transmitted from the monitoring-side antennas 201 are absorbed by the relay devices 230. Then, the relay devices 230 re-radiate the absorbed radio waves. Thereafter, the re-radiated radio waves are received by the control-side antenna 301. Consequently, it becomes possible to perform wireless communication between the monitoring units 200 and the control unit 300 via the control-side antenna 301, the relay devices 230 and the monitoring-side antennas 201.

The above-described embodiments may be modified and implemented as follows.

Each of the battery packs 100 described in the embodiments E and F may constitute, together with a battery diagnosis device provided outside the housing 400, a battery diagnosis system. The battery diagnosis device may be, for example, a mobile terminal used by an operator in a vehicle repair shop. The battery diagnosis device may include an antenna for performing wireless communication with the monitoring units 200 via the relay devices 220 or 230. Specifically, taking the battery pack 100 according to the embodiment F as an example, the battery diagnosis device may acquire the battery information from the monitoring units 200 via its own antenna and the monitoring-side antennas 201. The battery information may include, for example, the amount of charge (e.g., the SOC), the degree of deterioration (e.g., the SOH) and the usage history of the monitoring target batteries. The battery diagnosis device may diagnose the monitoring target batteries based on the acquired battery information.

With the above-described configuration, after the battery pack 100 is unloaded from the chassis 500, the battery information can be acquired from the monitoring units 200 without taking out the battery blocks 110 from the housing 400. Consequently, it becomes possible to easily perform a failure diagnosis for the battery blocks 110 and easily determine whether the battery blocks 110 can be reused.

The battery packs according to the above-described embodiments are applicable not only to vehicles, but also to other mobile objects such as aircrafts and ships. Moreover, the battery packs according to the above-described embodiments are applicable not only to mobile objects such as vehicles, aircrafts and ships, but also to stationary systems.

The control units and the control methods described in the present disclosure may be realized by a dedicated computer that includes a processor, which is programmed to perform one or more functions embodied by a computer program, and a memory. As an alternative, the control units and the control methods described in the present disclosure may be realized by a dedicated computer that includes a processor configured with one or more dedicated hardware logic circuits. As another alternative, the control units and the control methods described in the present disclosure may be realized by one or more dedicated computers configured with a combination of a processor programmed to perform one or more functions, a memory and a processor configured with one or more dedicated hardware logic circuits. In addition, the computer program may be stored as computer-executable instructions in a computer-readable non-transitory tangible recording medium.

While the present disclosure has been described pursuant to the above-described embodiments, it should be appreciated that the present disclosure is not limited to these embodiments and the structures. Instead, the present disclosure encompasses various modifications and changes within equivalent ranges. In addition, various combinations and modes are also included in the category and the scope of technical idea of the present disclosure.

What is claimed is:

1. A battery monitoring system comprising:
a battery;
a battery monitoring device that monitors a state of the battery; and
a battery control device that performs wireless communication with the battery monitoring device to acquire battery information representing results of the monitoring by the battery monitoring device and execute various controls,
wherein
the battery monitoring device is configured to execute, while executing a first process between it and the battery control device via the wireless communication, a second process that is different from the first process.

2. The battery monitoring system as set forth in claim 1, wherein
the first process is an authentication process for performing mutual authentication between the battery monitoring device and the battery control device when the wireless communication is started, and
the second process is a process related to an initial operation of the battery monitoring device.

3. The battery monitoring system as set forth in claim 2, wherein
the battery monitoring device comprises:
a monitoring unit that monitors the state of the battery; and
a slave-unit-side wireless control unit that transmits/receives data to/from the monitoring unit and performs the wireless communication,
the battery control device comprises:
a battery control unit that executes the various controls; and
a master-unit-side wireless control unit that transmits/receives data to/from the battery control unit and performs the wireless communication,
wherein
while the authentication process is executed between the master-unit-side wireless control unit and the slave-unit-side wireless control unit, the process related to the initial operation is executed by the monitoring unit under an operation instruction from the slave-unit-side wireless control unit to the monitoring unit.

4. The battery monitoring system as set forth in claim 3, wherein
when the wireless communication is started, the battery control device discovers, based on detection of a connection request signal outputted from the battery monitoring device, the battery monitoring device and performs the authentication process with the discovered battery monitoring device, and
the slave-unit-side wireless control unit of the battery monitoring device executes, in response to the input of a slave unit discovery signal from the master-unit-side wireless control unit to the slave-unit-side wireless control unit, the operation instruction for the initial operation.

5. The battery monitoring system as set forth in claim 4, wherein
the slave-unit-side wireless control unit executes the operation instruction for the initial operation by sequentially transmitting commands related to the initial operation to the monitoring unit, the commands related to the initial operation being stored in a storage device of the slave-unit-side wireless control unit.

6. The battery monitoring system as set forth in claim 5, wherein
    when the wireless communication is terminated, the battery control device transmits commands related to the next initial operation to the slave-unit-side wireless control unit, thereby having the commands stored in the storage device of the slave-unit-side wireless control unit.

7. The battery monitoring system as set forth in claim 5, wherein
    the commands related to the initial operation are changed depending on the situation when the wireless communication is started.

8. The battery monitoring system as set forth in claim 1, further comprising a housing, wherein
    the battery monitoring device comprises a monitoring unit that monitors the state of the battery and transmits the battery information,
    the battery control device comprises a control unit that performs communication with the monitoring unit to acquire the battery information and execute the various controls,
    the housing has a bottom plate portion, wall portions formed along a peripheral edge of the bottom plate portion, and a cover that covers the wall portions from above, and
    the battery, the monitoring unit and the control unit are accommodated in an accommodation space formed by the bottom plate portion, the wall portions and the cover,
    wherein
    on an upper surface of the cover, there is formed a protrusion that protrudes upward and extends in a specific direction along the upper surface of the cover,
    on a lower surface side of the cover at the protrusion, there is formed, along the protrusion, a recess that is recessed toward the upper surface side of the cover, and
    when the housing is viewed in a thickness direction of the cover, at least one of the monitoring unit and the control unit is located near the recess.

9. The battery monitoring system as set forth in claim 1, further comprising a housing, wherein
    the battery monitoring device comprises a monitoring unit that monitors the state of the battery and transmits the battery information,
    the battery control device comprises a control unit that performs communication with the monitoring unit to acquire the battery information and execute the various controls,
    the housing has a bottom plate portion, wall portions formed along a peripheral edge of the bottom plate portion, and a cover that covers the wall portions from above, and
    the battery, the monitoring unit and the control unit are accommodated in an accommodation space formed by the bottom plate portion, the wall portions and the cover,
    wherein
    the battery comprises a plurality of batteries grouped into a plurality of monitoring target batteries, and
    the monitoring unit comprises a plurality of monitoring units each of which is provided individually for a corresponding one of the monitoring target batteries, wherein
    the battery monitoring device further comprises a plurality of monitoring-side antennas each of which is provided individually for a corresponding one of the monitoring units and transmits/receives data to/from the corresponding monitoring unit, and
    the battery control device further comprises a control-side antenna that transmits/receives data to/from the control unit and performs wireless communication with the monitoring-side antennas,
    wherein
    the monitoring units, the monitoring-side antennas and the control-side antenna are arranged in gaps between the cover and the batteries in the accommodation space,
    the monitoring units and the monitoring-side antennas are arranged in the accommodation space which consists of a first accommodation space on one side of a lateral center of the housing and a second accommodation space on the other side of the lateral center of the housing,
    the control-side antenna comprises a plurality of control-side antennas, and
    some of the plurality of control-side antennas are arranged in the first accommodation space and the remainder of the plurality of control-side antennas are arranged in the second accommodation space.

10. The battery monitoring system as set forth in claim 9, wherein
    the plurality of monitoring target batteries are arranged in alignment with each other in a longitudinal direction of the housing in both the first accommodation space and the second accommodation space,
    in the first accommodation space, those monitoring units and monitoring-side antennas which correspond to the monitoring target batteries arranged in the first accommodation space are arranged in alignment with each other in the longitudinal direction of the housing, and
    in the second accommodation space, those monitoring units and monitoring-side antennas which correspond to the monitoring target batteries arranged in the second accommodation space are arranged in alignment with each other in the longitudinal direction of the housing,
    wherein
    the battery monitoring system further comprises:
    first electroconductive members that are arranged, in the first accommodation space, on both sides of the monitoring units and the monitoring-side antennas in a lateral direction of the housing and electrically connect the monitoring target batteries arranged in the first accommodation space; and
    second electroconductive members that are arranged, in the second accommodation space, on both sides of the monitoring units and the monitoring-side antennas in the lateral direction of the housing and electrically connect the monitoring target batteries arranged in the second accommodation space,
    wherein
    the first electroconductive members are arranged in alignment with each other in the longitudinal direction of the housing in the first accommodation space, and the second electroconductive members are arranged in alignment with each other in the longitudinal direction of the housing in the second accommodation space.

11. The battery monitoring system as set forth in claim 1, further comprising a housing, wherein
    the battery monitoring device comprises a monitoring unit that monitors the state of the battery and transmits the battery information, the battery control device comprises a control unit that performs communication with the monitoring unit to acquire the battery information and execute the various controls, the housing has a bottom plate portion, wall portions formed along a peripheral edge of the bottom plate portion, and a cover that covers the wall portions from above, the battery control device further comprises a control-side antenna that transmits/receives data to/from the control unit, the battery and the monitoring unit are accommodated in an accommodation space formed by the bottom plate portion, the wall portions and the cover, the control unit and the control-side antenna are arranged on a surface or outside of the housing, the battery monitoring system further comprises a relay device that is provided to the housing to relay communication between the control-side antenna and the monitoring unit, and the control unit receives, via the relay device and the control-side antenna, the battery information transmitted from the monitoring unit.

12. A battery monitoring system comprising:

batteries;

a plurality of battery monitoring devices each of which monitors a state of a corresponding one of the batteries; and a battery control device that performs wireless communication with the battery monitoring devices to acquire battery information representing results of the monitoring by the battery monitoring devices and execute various controls, wherein the plurality of battery monitoring devices comprise a first battery monitoring device and a second battery monitoring device, and during a process executed by the first battery monitoring device, the battery control device instructs a content of a process to the second battery monitoring device and causes the second battery monitoring device to execute the process whose content is instructed by the battery control device.

13. A battery monitoring system comprising:

a battery;

a battery monitoring device that monitors a state of the battery; and a battery control device that performs wireless communication with the battery monitoring device to acquire battery information representing results of the monitoring by the battery monitoring device and execute various controls, wherein the battery monitoring device comprises:

a monitoring unit that monitors the state of the battery; and a slave-unit-side wireless control unit that transmits/receives data to/from the monitoring unit and performs the wireless communication, the battery control device comprises:

a battery control unit that executes the various controls; and a master-unit-side wireless control unit that transmits/receives data to/from the battery control unit and performs the wireless communication, wherein the battery control unit transmits a plurality of commands to the battery monitoring device, thereby having the plurality of commands stored in the battery monitoring device, and the slave-unit-side wireless control unit sequentially transmits the plurality of commands to the monitoring unit, causes the monitoring unit to sequentially execute processes based on the plurality of commands, and returns results of the processes collectively to the battery control device.

* * * * *